United States Patent [19]

Aldridge et al.

[11] Patent Number: 4,636,140
[45] Date of Patent: Jan. 13, 1987

[54] METHOD OF LOADING AND UNLOADING A FURNACE

[75] Inventors: Robert E. Aldridge, Anaheim; Russell Elloway, Riverside; William O. Fritz, Anaheim; Ralph D. Goff; Michael J. Herrera, both of Placentia, all of Calif.

[73] Assignee: Thermco Systems, Inc., Orange, Calif.

[21] Appl. No.: 719,409

[22] Filed: Apr. 3, 1985

[51] Int. Cl.[4] .............................. B65G 25/00
[52] U.S. Cl. ............................. 414/786; 414/182; 414/183
[58] Field of Search ............ 414/180, 786, 182, 183, 414/184; 901/3, 4, 5

[56] References Cited

U.S. PATENT DOCUMENTS

| | | | |
|---|---|---|---|
| 3,958,740 | 5/1976 | Dixon | 901/5 X |
| 4,008,815 | 2/1977 | Fisk | 414/180 X |
| 4,362,977 | 12/1982 | Evans et al. | 901/3 X |
| 4,420,812 | 12/1983 | Ito et al. | 901/5 X |
| 4,440,538 | 4/1984 | Bowers | 414/180 X |
| 4,468,195 | 8/1984 | Sasaki et al. | 414/180 X |

OTHER PUBLICATIONS

"Industrial Robots: Getting Smarter All the Time" by Rich Merritt; Instruments & Control Systems, Jul. 1982.

Primary Examiner—Robert J. Spar
Assistant Examiner—Stuart J. Millman
Attorney, Agent, or Firm—John K. Williamson; James C. Valentine

[57] ABSTRACT

A soft landing cantilever boat loader for loading semiconductor wafer carrying boats into a furnace process tube includes a loading station having one or more loading assemblies, an automatically controlled door associated with each loading assembly for selectively closing an end of the process tube and a microcomputer based control system for controlling and coordinating process operations. The loading assemblies are of a low profile configuration and each include a boat supporting, cantilevered paddle that is mounted by a quick release mechanism on a carriage which is driven along ways by a motor. A motor speed control circuit provides closed loop motor speed using a pulse width modulated motor drive. A door operating mechanism provides movement of the door along two transverse axes to assure tight sealing of the door against the tube. The control system employs a self-teaching technique that permits rapid reprogramming of the carriage travel limits which may be required when the paddle is replaced by a paddle of a different type or length.

8 Claims, 68 Drawing Figures

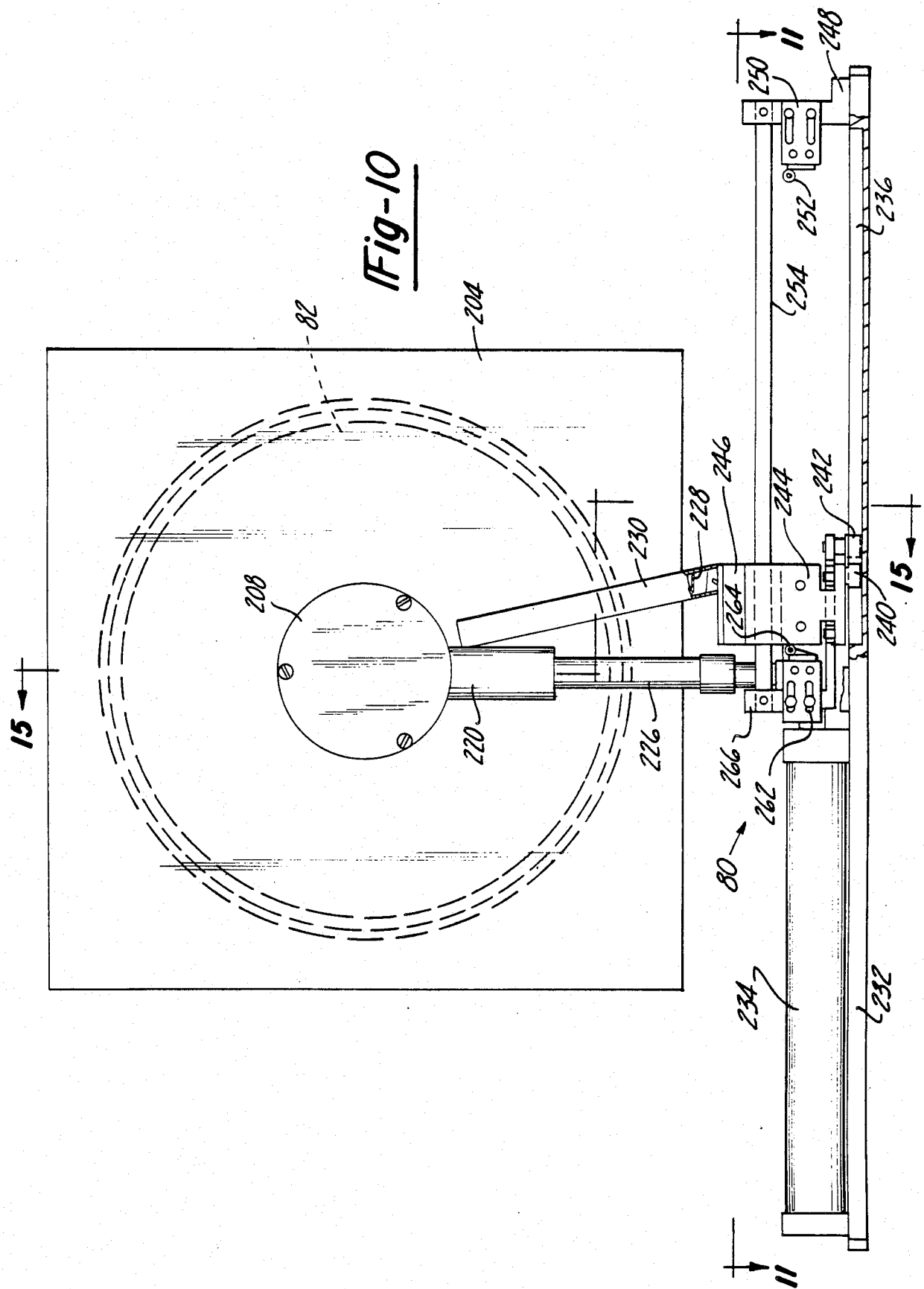

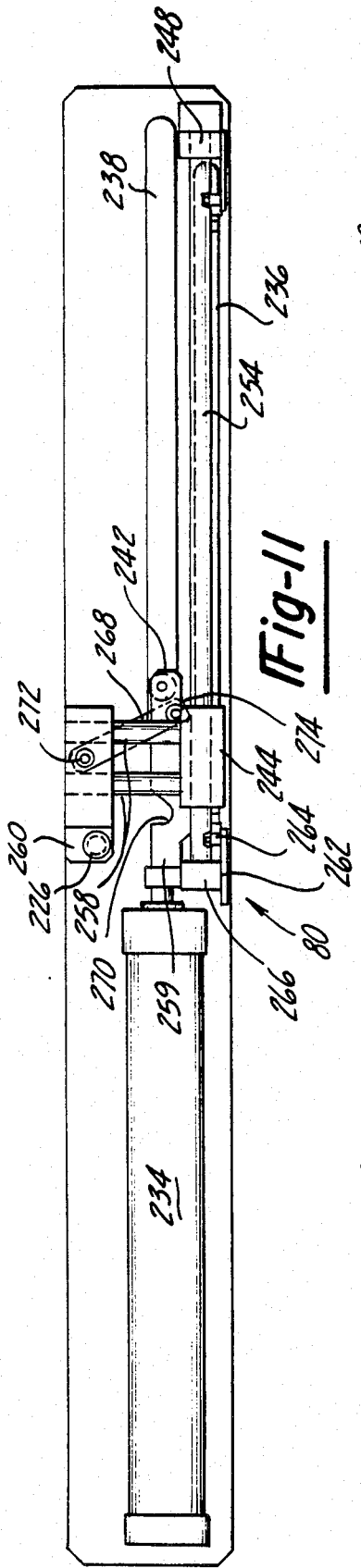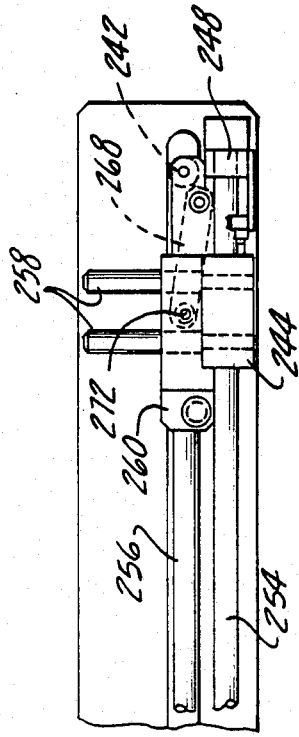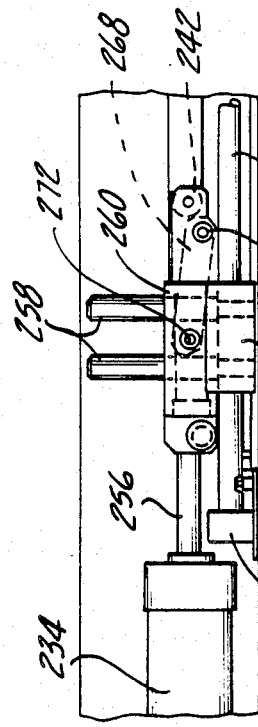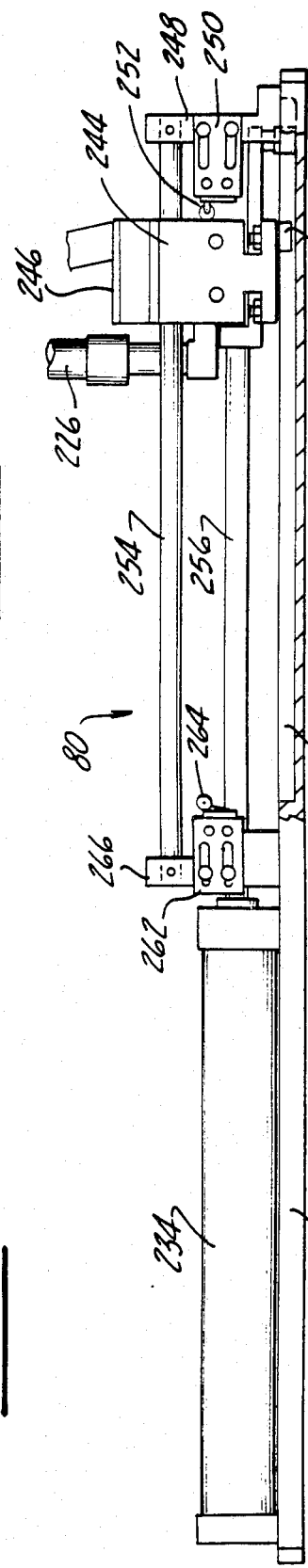

IFig-22

FURNACE BOAT INITIALIZATION

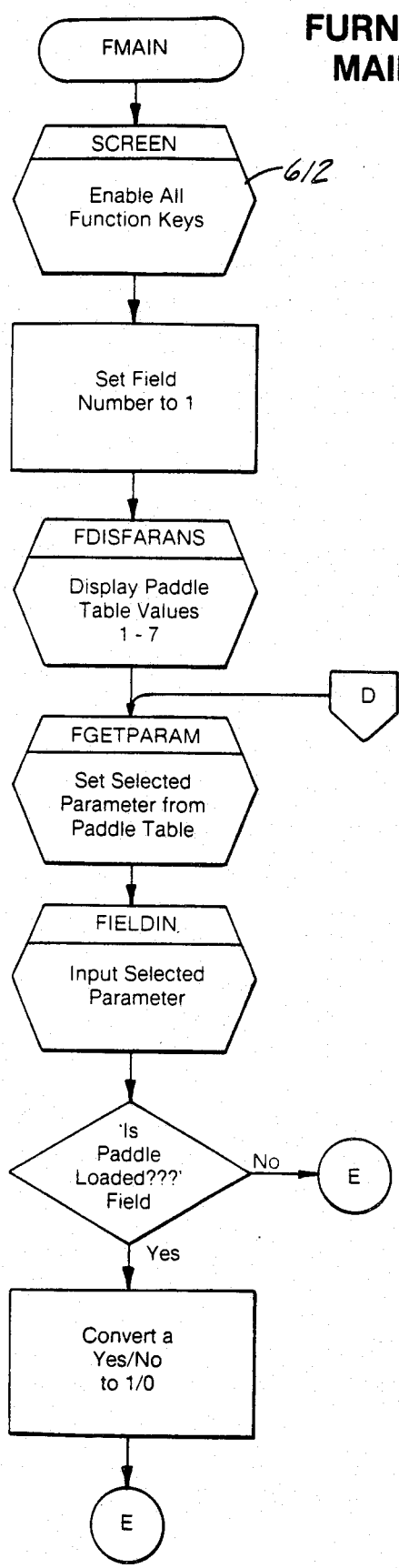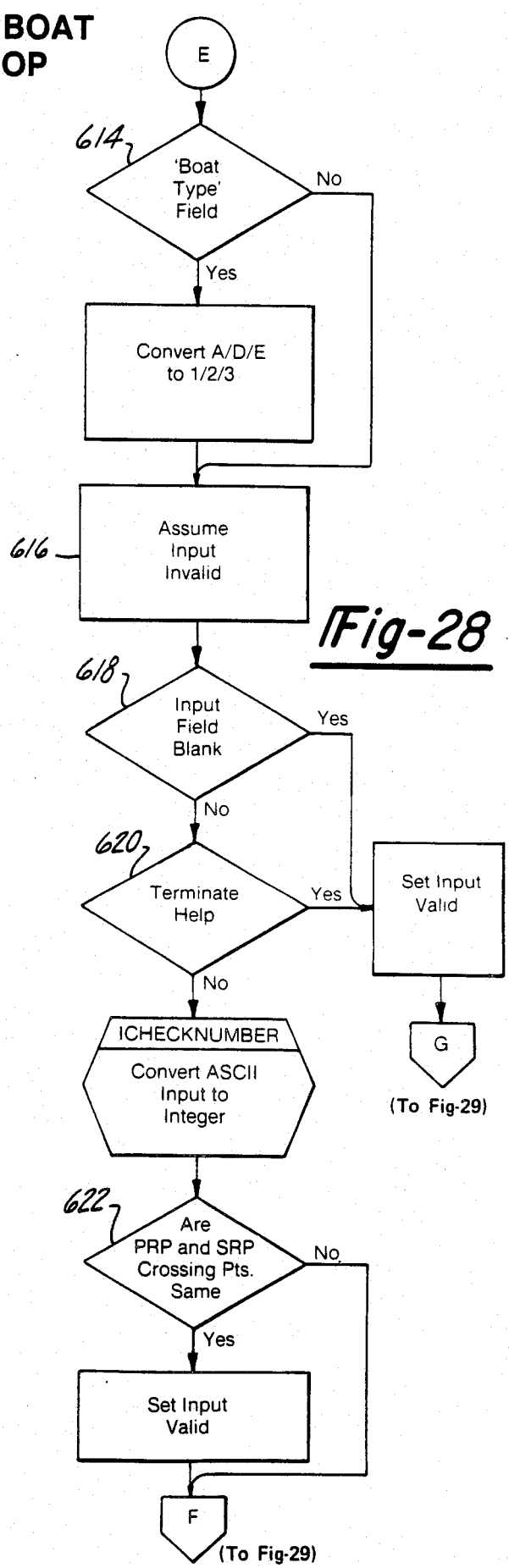
*Fig-27*
*Fig-28*

FURNACE BOAT MAIN LOOP (continued)
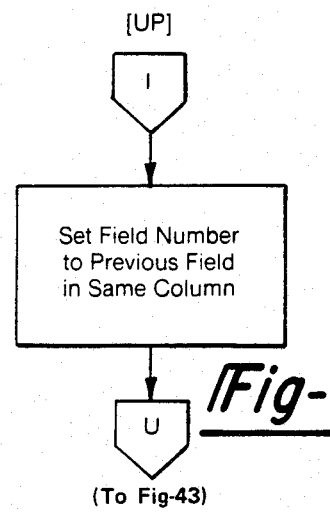
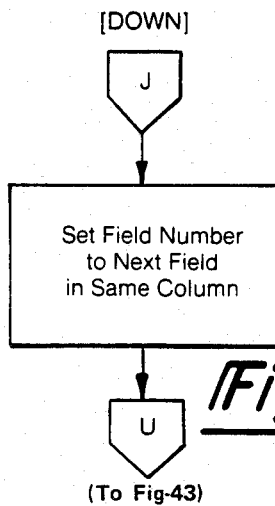
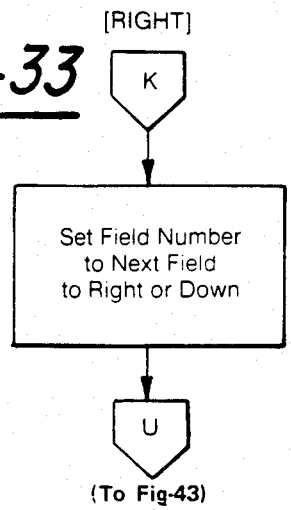
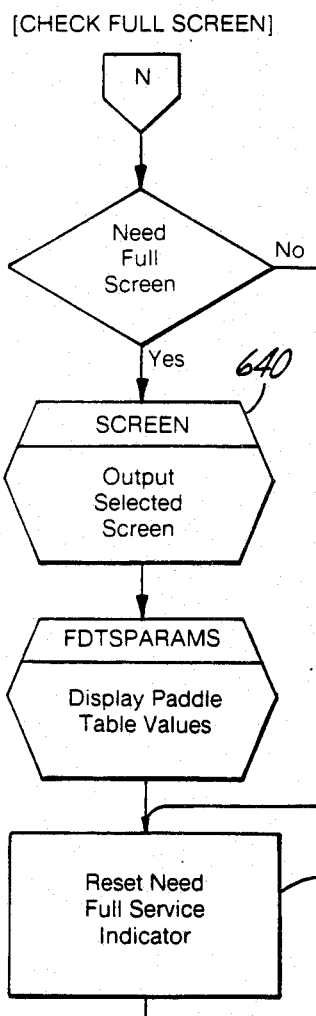
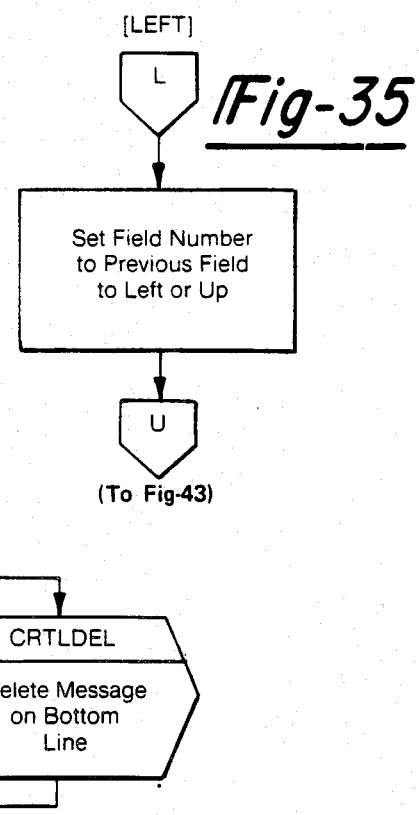
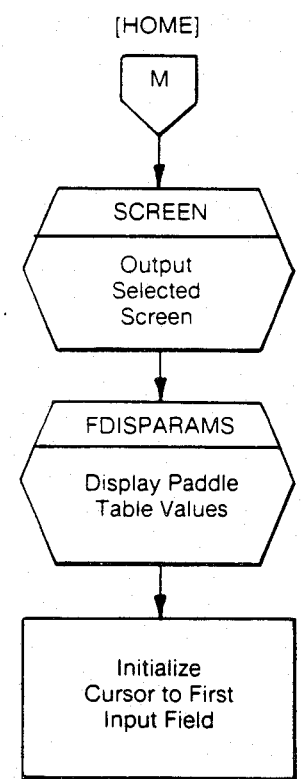

FURNACE BOAT MAIN LOOP (continued)

FURNACE BOAT MAIN LOOP (continued)

DISPLAY PARAMETERS

CHECK TUBE NAME

PROCESS FUNCTION

PROCESS FUNCTION

PROCESS FUNCTION (continued)

GET DOOR/CAM INFORMATION

TEACH FIELD

OPEN TUBE DOOR

ISSUE TUBE COMMAND — WAIT FOR COMPLETION (continued)

ISSUE TUBE COMMAND — WAIT FOR COMPLETION (continued)

SEND MESSAGE TO TUBE

DISPLAY ERROR

METHOD OF LOADING AND UNLOADING A FURNACE

TECHNICAL FIELD

The present invention broadly relates to equipment for handling semiconductor wafers, and deals more particularly with apparatus employed for loading and unloading furnaces used for thermally treating the wafers.

BACKGROUND OF THE INVENTION

Semiconductor circuit components are normally produced by slicing an ingot of semiconductor material into thin wafers each of which are then processed to produce many individual integrated circuits. One of these processing steps involves introducing the wafers into a high temperature furnace to effect thermal oxidation, diffusion, CVD (chemical vapor deposition), annealing, etc.

In the case of diffusion treatment, a plurality of the wafers are placed on an intermediate quartz carrier which is commonly referred to as a "boat", and the boat is transported by loading apparatus from a loading station into one end of an adjacent diffusion furnace process tube. The wafers are subjected to a high temperature gaseous reactant within the furnace tube which precipitates out from the reaction in the form of dust-like particulates that accumulate along the sides and bottom of the tube.

In the event that the accumulated particulates within and around the tube become airborne and are deposited on the surface of the wafers, the deposited particulates result in defects such as pin-holes and other surface anomalies which render the integrated circuits defective. In order to reduce surface contamination due to these particulates, others in the past have devised a cantilever mounted paddle for loading and unloading the boats from the process tubes. One end of the paddle is mounted on a slidable carriage disposed outside of the process tube; one or more boats are loaded onto the opposite, free outer end of the paddle and the paddle is tipped in order to deposit or pick up the boat within the tube. Consequently, the outer end of the paddle does not contact the tube and thereby stir up particulates. Moreover, since only the outer free end of the paddle is inserted into the process tube, the amount of thermal mass introduced into the tube is minimized. A boat loader of the type described immediately above is disclosed in U.S. Pat. No. 4,468,195 issued Aug. 28, 1984 to Sasaki, et al.

Prior art boat loaders are less than completely satisfactory in a number of respects. For example, prior loaders, such as that disclosed in U.S. Pat. No. 4,468,195 discussed above, are normally mounted in stacked relationship within an enclosure at a loading station which is positioned adjacent the diffusion furnace. At least one wall of the enclosure is perforated to permit air flow over the wafers before and after they are processed in the furnace, thus providing a "scrubbing" action which prevents contaminating, airborne particles from coming to rest on the wafer surfaces. However, the airflow intended to produce the scrubbing action is substantially reduced because the relatively high profile of these loaders tends to block off the air flow.

Accurate positioning of the boats within the furnace tubes is particularly important, and the procedures required for calibrating prior loaders to effect proper boat displacement is not only time consuming but is also less accurate than is desired. Calibration is important because it is necessary to position the boat within a so-called "flat zone" within the furnace tube. The flat zone refers to the central portion of the tube which remains at a relatively constant temperature, unlike the ends of the tube which experience temperature variation due to the fact that the tube is essentially open at each end thereof.

Paddles of various configurations and different lengths are often employed to accommodate different types of boats; consequently, when the paddle on a loader is changed, it becomes necessary to recalibrate the control system for the loader in order to assure that the boat is delivered to the proper position within the tube. Prior control systems have relied on memory stored binary data constants representing limits on velocity, acceleration and displacement of the boat by the loader, however, these systems were of an open loop type in which the data did not accurately represent the actual velocity, acceleration or displacement of the boat. Consequently it was necessary for the operator to determine the recalibration data by a trial and error, iterative procedure.

Finally, in connection with prior art boat loaders, only the extreme limits of linear boat travel could be controlled, whereas, in contrast, it would be advantageous to provide control of linear boat travel to a number of individually selectable, arbitrary points between the extreme travel limits.

Each of the above mentioned problems are overcome by the soft landing boat loader of the present invention.

SUMMARY OF THE INVENTION

In accordance with the present invention, a soft landing, cantilever boat loader is adapted to load and unload semiconductor wafer carriers or "boats" within a furnace process tube. The loader includes a loading station having one or more loading assemblies, an automatically operated door associated with each loading assembly for selectively closing off the corresponding process tube, and a microcomputer based control system for controlling process operations.

According to one aspect of the invention, each of the loading assemblies is of a low profile configuration in order to maximize laminar air flow across wafers being held at the loading station. Each loading assembly includes a paddle assembly which is removably mounted on a carriage supported by guide ways for linear travel along the axis of the tube. The paddle assembly includes a cantilever mounted, elongate paddle arm for supporting one more boats, and a quick-release, tripod support arrangement which allows the paddle assembly to be quickly replaced by an operator. The mounting arrangement includes spherical mounts which precisely locate the paddle, and means for manually leveling the axis of the paddle relative to the carriage.

The paddle assembly is supported on the carriage by a pivotal plate which may be vertically pivoted by an eccentric cam shaft driven by a worm gear assembly and a DC motor. The camming mechanism effects slight, precise tilting of the paddle in order to pick up or deposit the boats within the process tube without contacting or wiping the sides of the tube.

According to another feature of the invention, the carriage is driven along the guide ways by a DC servo motor which is operated by a control system that permits precise displacement of the carriage to any of a number of arbitrarily selectable points between the extreme limits of the carriage's travel. The control system includes a motor speed control circuit which provides closed loop speed control using a pulse width modulated motor drive. A tachometer connected to the carriage movement motor produces a feedback error signal which is summed with a velocity setpoint signal supplied by the microcomputer. A triangular waveform oscillator source is DC modulated in accordance with the summed error signal, and the modulated triangular waveform is then processed by comparators which function as zero crossing detectors. The zero crossing detectors output positive and negative pulse which control an amplifier output stage that drives the carriage driving motor. A potentiometer is connected by the paddle camming mechanism produces a signal which is processed by a plurality of window comparators, the output of which is delivered to the microcomputer and indicates whether the paddle is in a lower, intermediate or upper limit of vertical travel. The limits of vertical travel by the paddle may be selected by adjusting potentiometers connected with the window comparators.

Another feature of the invention resides in the door assembly and the operating mechanism for controlling the path of travel of the door. The door includes a preload assembly which biases the door into tight sealing contact with the end of the process tube. The operating mechanism provides for two-axis movement the door, using a single motor.

A further aspect of the invention relates to the method employed for "teaching" the control system to carry out various control commands based on operator generated control limits.

These, and further features of the invention will be made clear or will become apparent in the detailed description of the preferred embodiment set out hereinbelow.

BRIEF DESCRIPTION OF THE DRAWINGS

In the drawings, which form an integral part of the specification and are to be read in conjunction therewith, and in which like references numerals are employed to designate identical components in various views:

FIG. 9 is a sectional view taken on an enlarged scale along the line 9—9 in FIG. 3;

FIG. 10 is an end view of the door and associated operating mechanism with a cover having been removed portions of the base plate being broken away in section to reveal a carriage cam slot, the door and operating mechanism being shown in a fully closed position;

FIG. 11 is a top view of the door operating mechanism, taken along the line 11—11 in FIG. 10;

FIG. 12 is a fragmentary, top view of a portion of the door operating mechanism after it is initially actuated and the door is disengaged from the process tube;

FIG. 13 is a top fragmentary view similar to FIG. 12 but showing the condition of mechanism when the door has been displaced to its fully open, standby position;

FIG. 14 is a front view of the door operating mechanism shown in FIGS. 10-13, showing the condition of the mechanism when the door is in its fully open, standby position;

FIGS. 25-68 are flow diagrams of a computer program employed by the soft landing boat loader.

DETAILED DESCRIPTION OF THE PREFERRED EMBODIMENT

Figure 1:
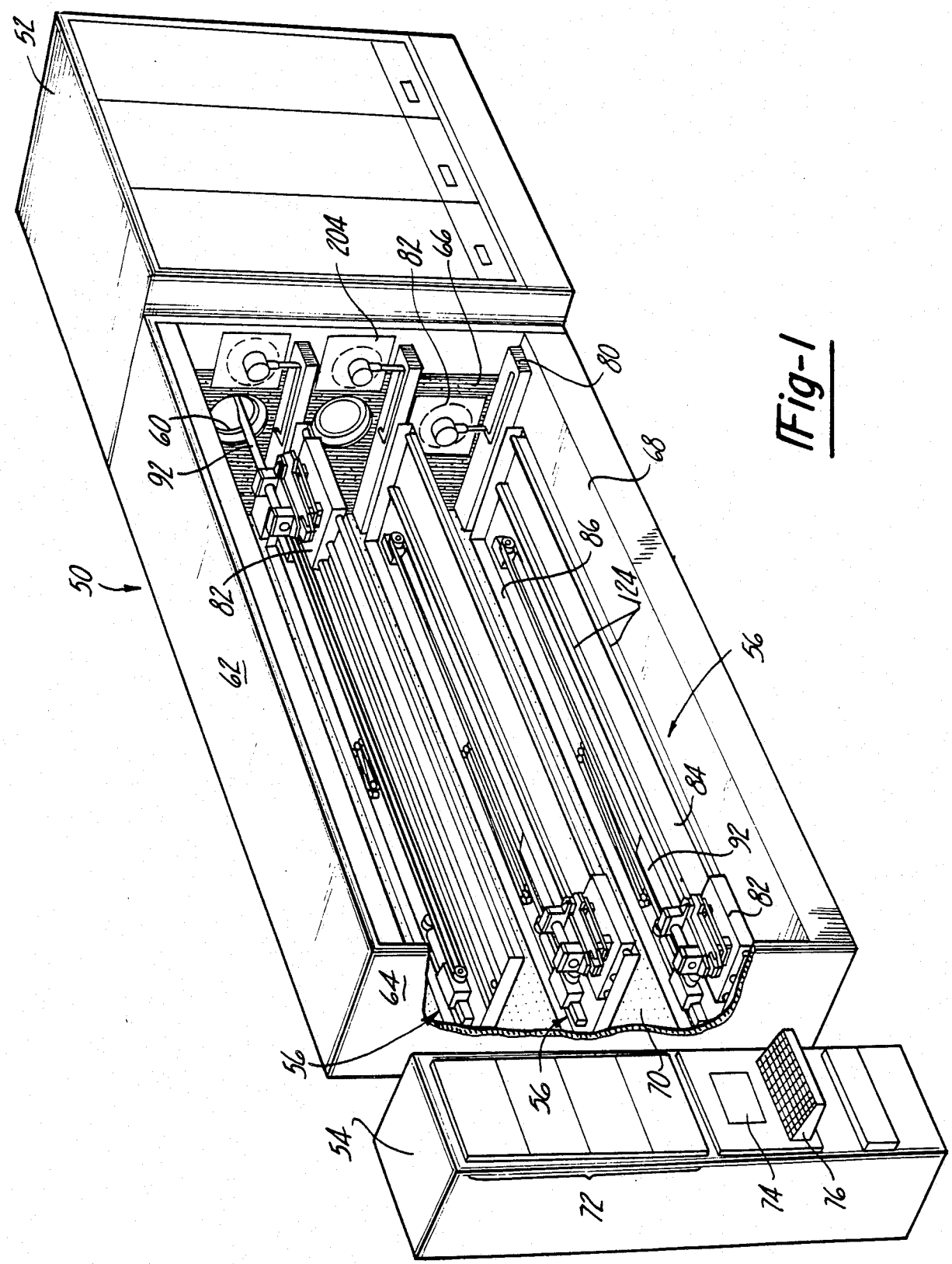
FIG. 1 is a perspective view of the soft landing boat loader which forms the preferred embodiment of the present invention, the boat loader being shown in operative relationship to a diffusion furnace, a portion of the loading station enclosure being broken away in section.
Figure 2:
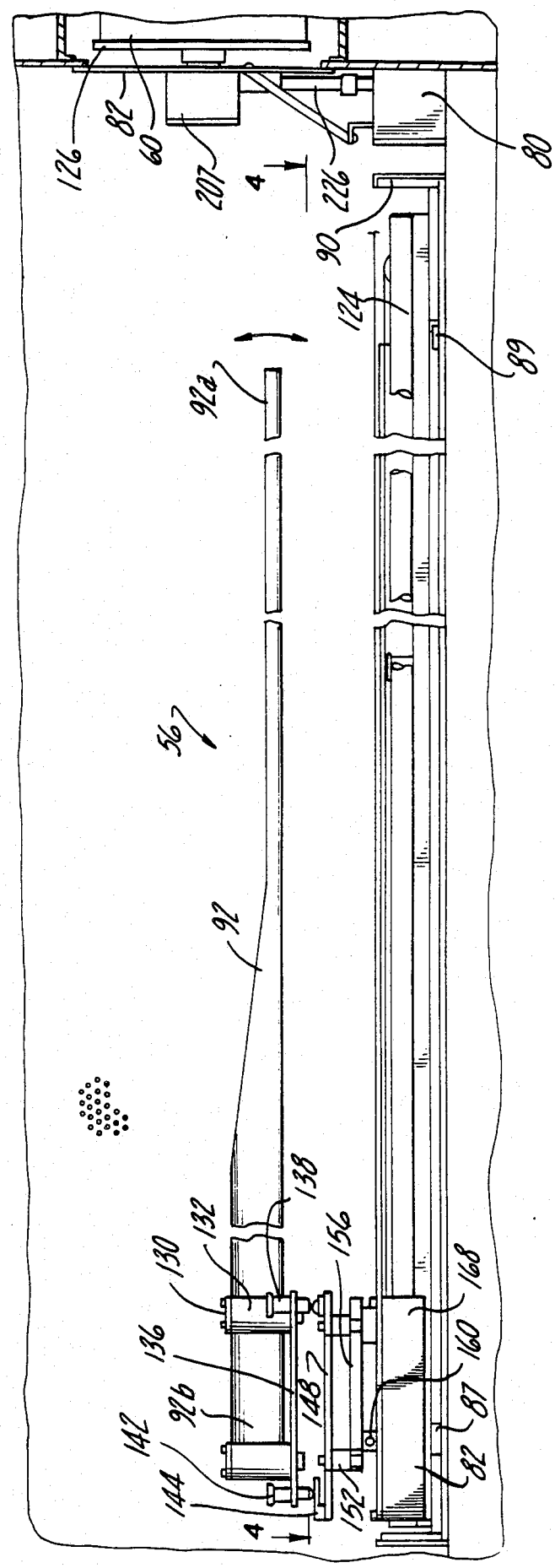
FIG. 2 is a side elevational view of a single loading assembly, with the paddle carriage shown in its retracted, standby position.
Figure 3:
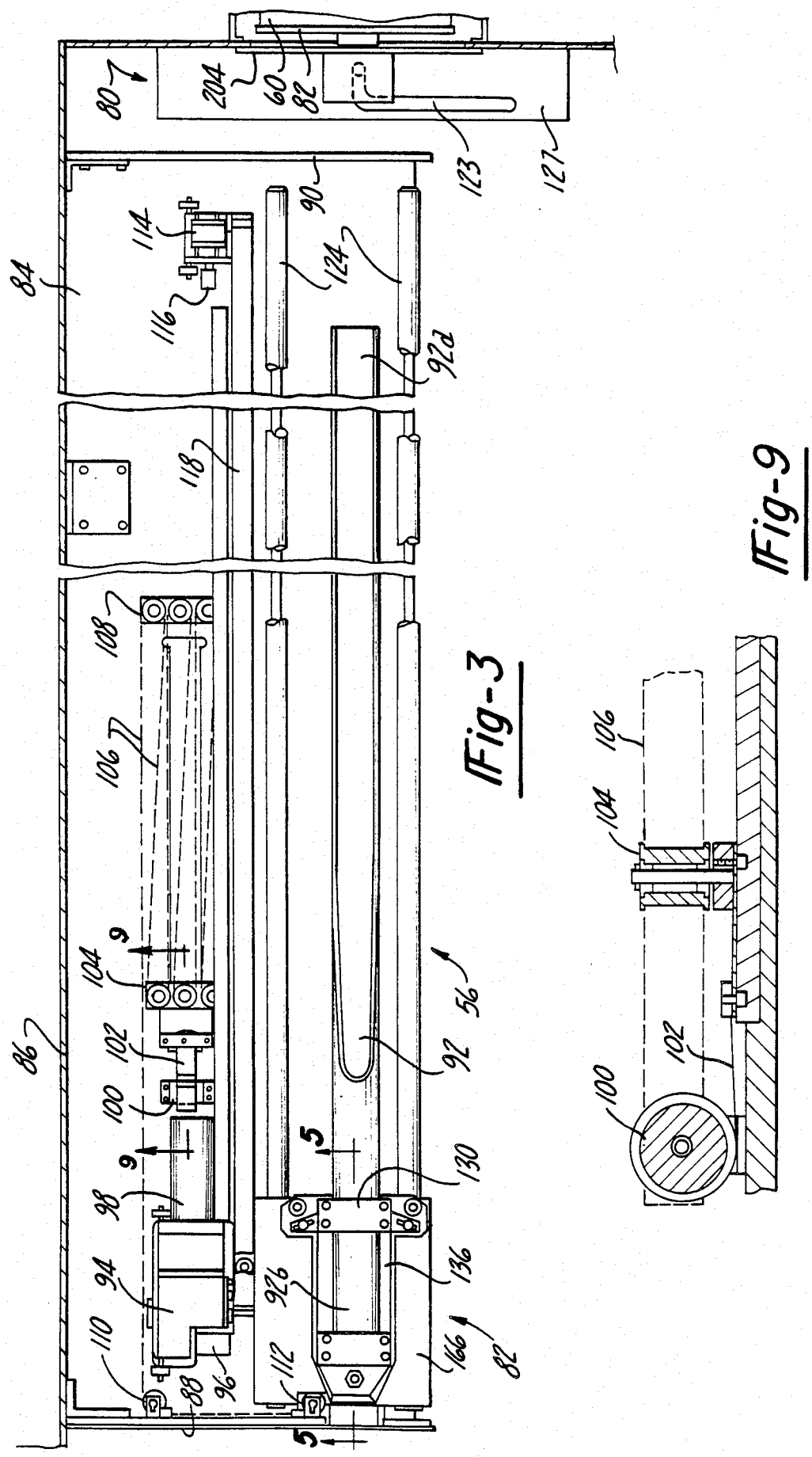
FIG. 3 is a top plan view of the loading assembly shown in FIG. 2.

Referring first to FIG. 1, the present invention relates to a soft landing boat loader which includes a loading station generally indicated at 50 and a controller 54. The loading station 50 is disposed immediately adjacent a conventional diffusion furnace 52 which includes a plurality of vertically aligned, spaced apart quartz process tubes 60 which are open at their opposite ends. The tubes 60 may be filled with a gaseous reactant to effect oxidation or diffusion treatment of semiconductor wafers introduced into the tubes 60 from the loading station 50.

The loading station 50 includes a plurality of soft landing boat loader assemblies, each being generally indicated at 56, which are respectively associated with the process tubes 60. The loader assemblies 56 are disposed in vertically aligned, spaced relationship to each other within a generally rectangular loading station enclosure which comprises top and bottom walls 62, 68 respectively, opposing end walls 64 and 66 and a perforated rear wall 70. The front of the enclosure is essentially open to allow operator access to the loader assemblies 56, each of which includes a base defined by a shelf 84.

Each of the loader assemblies 56 includes a boat loading "arm" or paddle 92 upon which one or more wafer carrying boats (not shown), typically formed of quartz, may be mounted. The paddle 92 is removably mounted on a paddle carriage 82 which in turn is supported on a pair of ways 124 for longitudinal sliding movement along the axis of the corresponding process tube 60. End wall 66 is provided with a circular opening 58 therein registering will one open end of the tube 60 to allow the free outer end of the cantilever mounted paddle 92 to enter the end of the tube 60.

As will discussed later in more detail, each of the carriages 82 includes means for tilting the paddle 92 to facilitate loading and unloading of the boats within the process tube 60 in a manner which avoids direct contact of the paddle 92 with the tube 60. The end of the tube 60, as well as the opening 58 may be selectively closed off by an inner door 82 and an outer cover plate 204 which are controlled by an automatic door operating mechanism 80.

Each shelf 84 is secured to the rear wall 70. The loader assemblies 56 are of a low profile configuration, thus allowing laminar air flow through the rear wall 70 and across the wafers being held in boats supported on the paddles 92, thereby assuring thorough scrubbing action of the wafers both before and after they are treated in the furnace 52.

Each of the loader assemblies 56 as well as the door operating mechanisms 80 is controlled by the controller 54. The controller 54 includes a plurality of control modules, collectively indicated at 72, each module being associated with controlling the functions of one of the loading assemblies 56 and the associated door operating mechanism 80. Inasmuch as three loading assemblies 56 are disclosed in the present embodiment, only three of the control modules 72 would be operative. Each of the control modules 72 includes a microcomputer and an electrical control circuit which will be discussed in detail later herein. A conventional display such as a CRT 74 and a terminal keyboard 76 allow the operator to input data which is employed for altering the control program and for carrying out various control functions which will be later described.

Attention is now particularly directed to FIGS. 2, 3, 4 and 9, wherein the details of a loader assembly 56 are depicted. The paddle 92 includes a substantially flat but slightly cupped free outer end 92A upon which one or more wafer holding boats (not shown) may be placed by an operator or by automatic handling equipment (not shown). The opposite end of the paddle 92B is substantially cylindrical and is removably mounted in cantilever fashion on the paddle carriage 82 by a mounting arrangement which will be discussed below.

The carriage 82 is driven for longitudinal sliding movement on the ways 124 by means of a cogged timing belt 118 which is connected to the carriage 82 and is driven by a DC servo motor 98. The motor 98 drives the belt 118 through a main drive assembly 94 which includes a speed reducing gear drive. A potentiometer 96 controlled by the drive assembly 94 produces a voltage output signal which is used by the control circuit to precisely determine the longitudinal position of the carriage 82. A pair of electrical limit switches 87, 89 are actuated by movement of the carriage 82 to its extreme limits of linear travel. The belt 118 is trained around a pair of longitudinally spaced pulley 120, 122 which are provided with cogged surfaces to prevent belt slippage. Pulley 122 is driven by the output shaft of the drive assembly 94. Pulley 120 is mounted on the shaft of a drive belt tensioner 114 which includes a manually operable tension screw 116 in order to adjust the preloading to the belt 118 by the tensioner 114.

The carriage 82 includes a later discussed DC electrical motor for tilting the paddle 92, which is connected with the controller 54 by means of a flat ribbon cable 106. The cable 106 is trained around a pair of rollers 110, 112 and is threaded through a cable take-up assembly consisting of a stationary, triple cable roller 108 and a moveable triple cable roller 104. The moveable triple roller 104 is constantly biased away from the fixed triple roller 108 by means of a constant force spring 102 which is controlled by a cable tensioner assembly 100.

Figure 5:
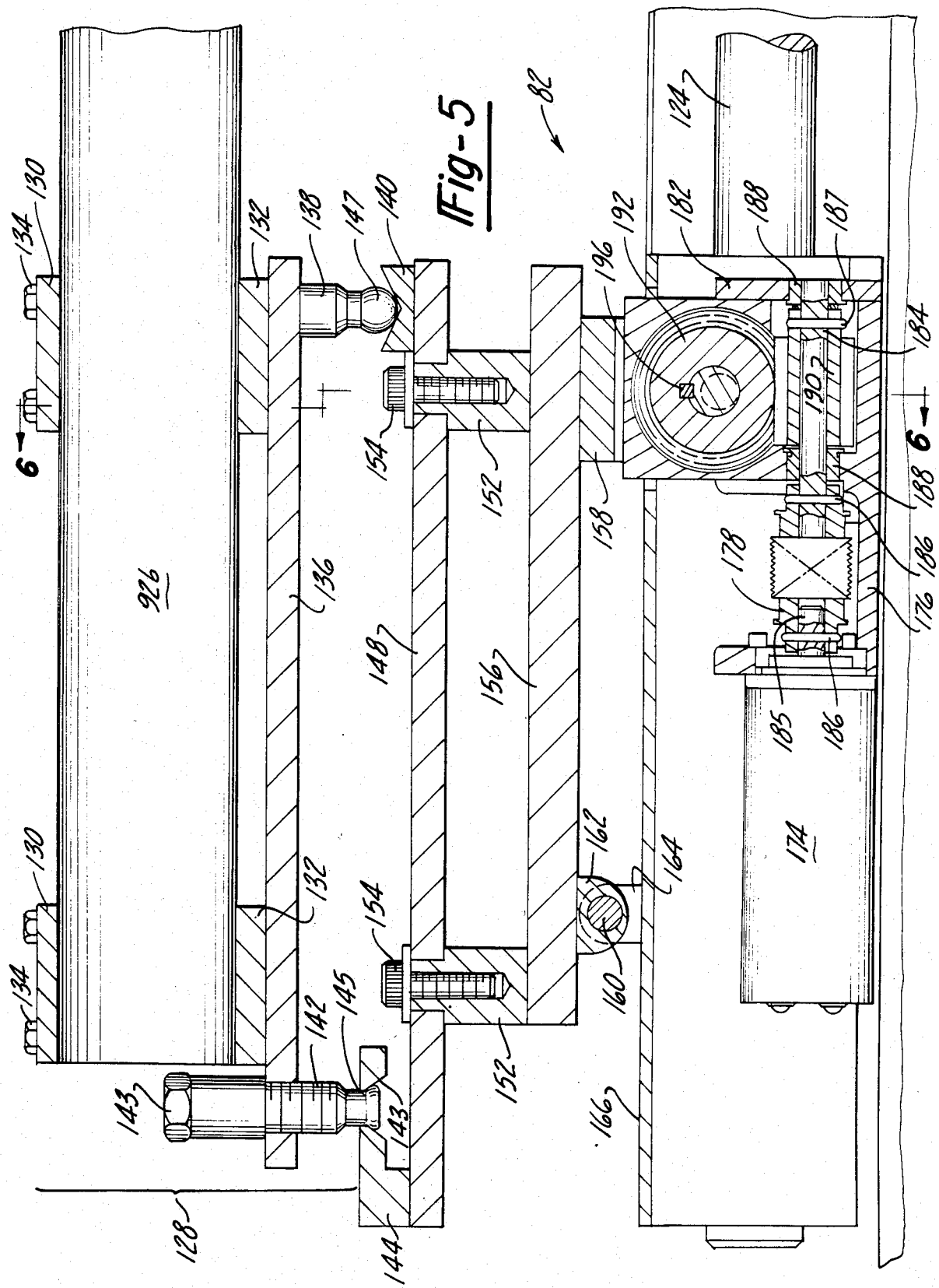
FIG. 5 is a sectional view taken along the line 5—5 in FIG. 3, but on an enlarged scale and showing the paddle assembly in a level condition.
Figure 6:
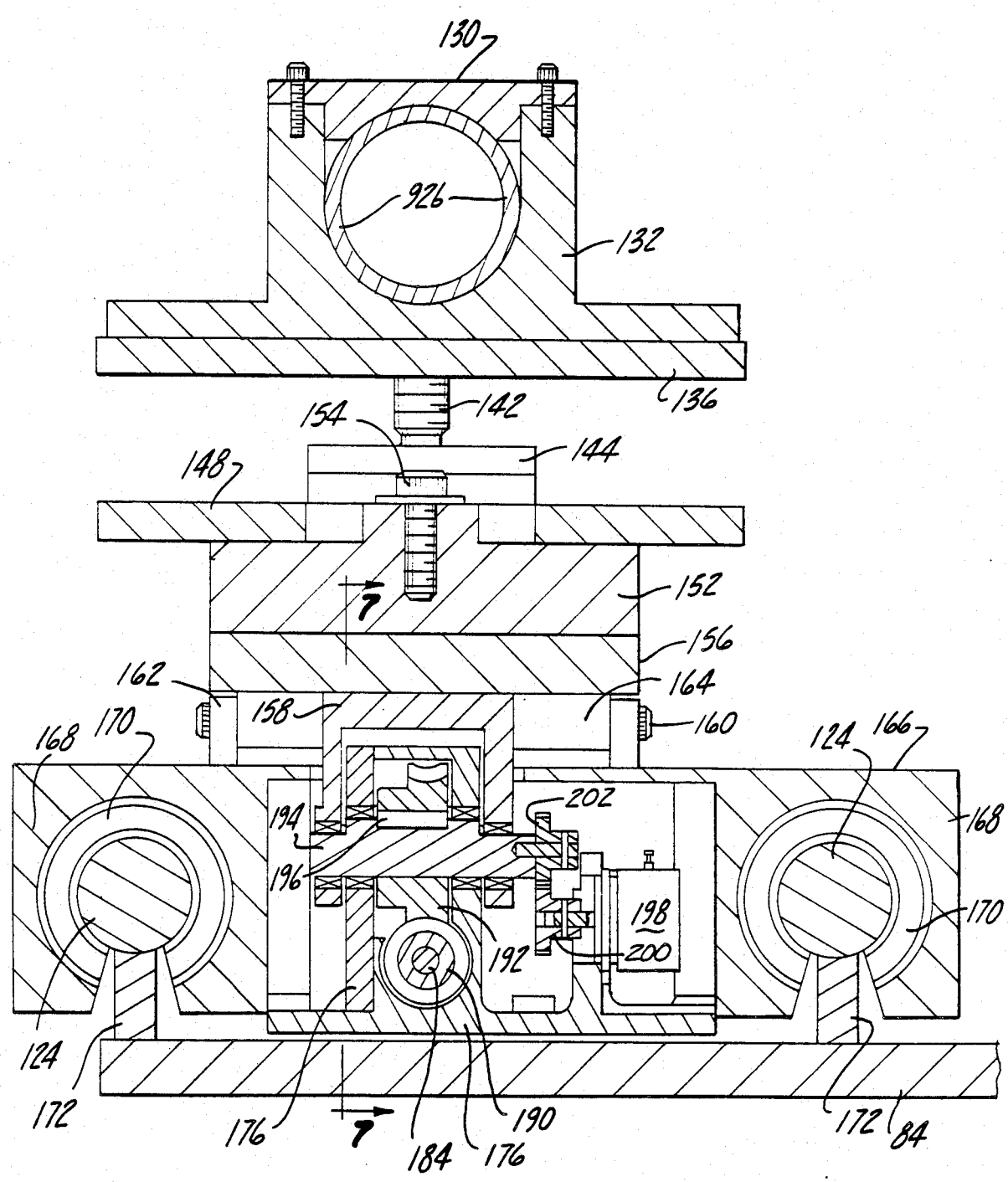
FIG. 6 is a sectional view taken along 6—6 in FIG. 5.

Referring now also to FIGS. 5 and 6, the cylindrical end 92B of the paddle 92 is clamped within a pair of longitudinally spaced mounting saddles by caps 130 and screws 134. The saddles 132 are secured as by welding to the upper surface of a top plate 136 which in turn is removably mounted by a pair of threaded leveling pins 138 and a threaded pin screw 142 on underlying supporting structure which will be discussed below. The position of the pivot pin 142 in the top plate 136 is fixed by a locking nut 143.

The paddle 92, along with the mounting saddles 132, top plate 136 and pin 138, 142 form a paddle assembly 128 which may be easily and quickly removed from the carriage 82 to permit the use of different paddle configurations and paddle lengths.

The pivot pin 142 is trapped within a U-shaped cutout 146 in a saddle or shoe 144 which is secured on one end of a subplate 148. The shoe 144 includes a spherical seating surface 143 which engages and precisely locates a retaining shoulder 145 on pin 142. The leveling pins 138 include spherical heads 147 which are supported and precisely centered by spherically shaped seats 140 that are in turn secured to and supported by the the subplate 148. The pins 138, 142 in combination with the seats 140, 143 provide precise positioning of the paddle 90 within a horizontal plane, without the need for performing adjustments when the paddle assembly 128 is installed on the carriage 82. The leveling pins 138 and their associated seats 140 effectively mount the paddle 92 for pivot movement about a horizontal axis which extends transverse to that of the paddle 92. Since the mass of the paddle end 92A is greater than that of paddle end 92B, a moment is create which biases the paddle 92 to pivot in a clockwise direction as viewed in FIG. 5 thus causing the shoulder 145 of pin 142 to positively engage the seating surface 143.

Screw adjustment of the leveling pins 138 or pivot pin 142 results in pivoting of both the top plate 136 and the paddle 92 about the horizontal pivot axis thus permitting the paddle 92 to be "leveled". The supporting pins 142 and 138 in combination with the shoe 144 and seats 140 form a quick release tripod mounting of the paddle assembly 128 on the carriage 82.

In order to remove the paddle 92 from the carriage 82, the entire paddle assembly 128 is pivoted slightly in a counter clockwise direction as viewed in FIG. 5 until the shoulder 145 clears the seating surface 143. At this point, media portions of the paddle 92 are lifted in order to raise the leveling pins 138 in clearing relationship to the seats 140, whereupon the entire assembly 128 is then moved forwardly to remove the pin 142 from the shoe 144. The paddle assembly 128 may be reinstalled simply by reversing the above described procedure.

The subplate 148 is mounted on, and in spaced relationship above, a base plate 156 by means of a pair of longitudinally spaced guide blocks 152. The upper portions of the guide blocks pass through transversely extending slots 150 (FIG. 4) in subplate 148 so that the subplate 148, and thus the paddle 92 is transversely slidable to permit adjustment of the lateral position of the paddle 92. The subplate 148 is secured in a desired lateral position by screws 154 which are received within the guide blocks 152.

The forward end of the base plate 156 is supported by a vertically moveable yoke 158, while the opposite end thereof is pivotally mounted on a carriage base 166 by means of a pivot shaft 160 that extends through mating flanges 162, 164 which are respectively secured to the carriage base 166 and base plate 156. It may thus be appreciated that the forward end of the base plate 156 as well as the structure mounted thereon including the paddle 92 may be tilted about the axis of shaft 160, thereby effecting elevational displacement of the outer end 92A of the paddle.

Figure 7:
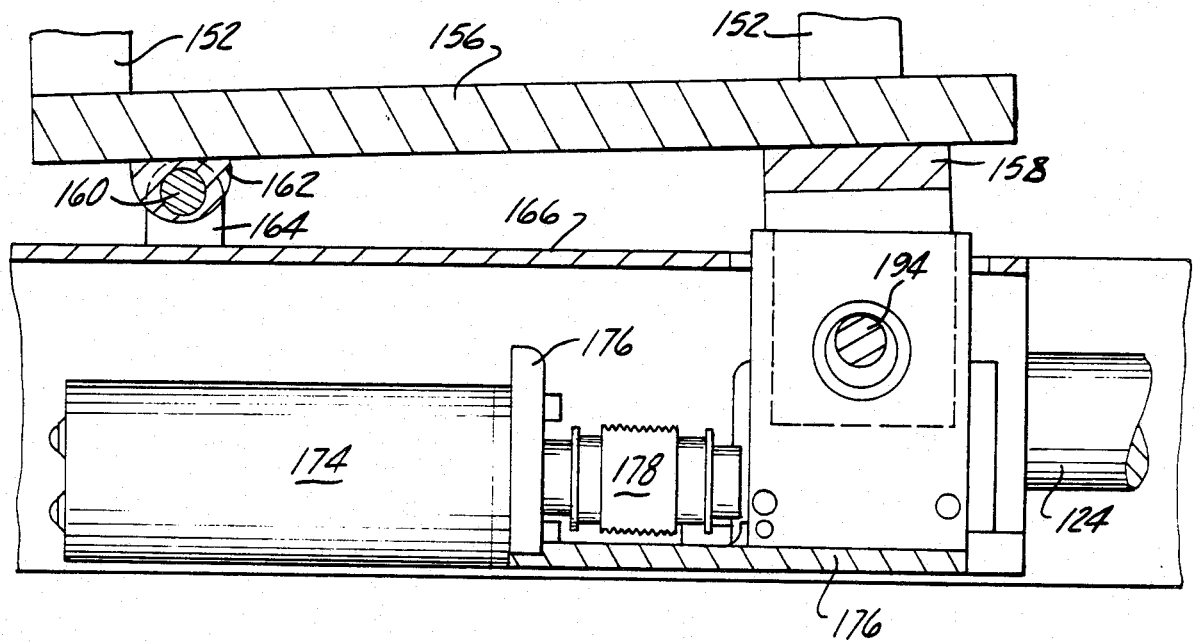
FIG. 7 is a sectional view taken along the line 7—7 in FIG. 6, but showing the paddle assembly lifted to is maximum degree of inclination.
Figure 8:
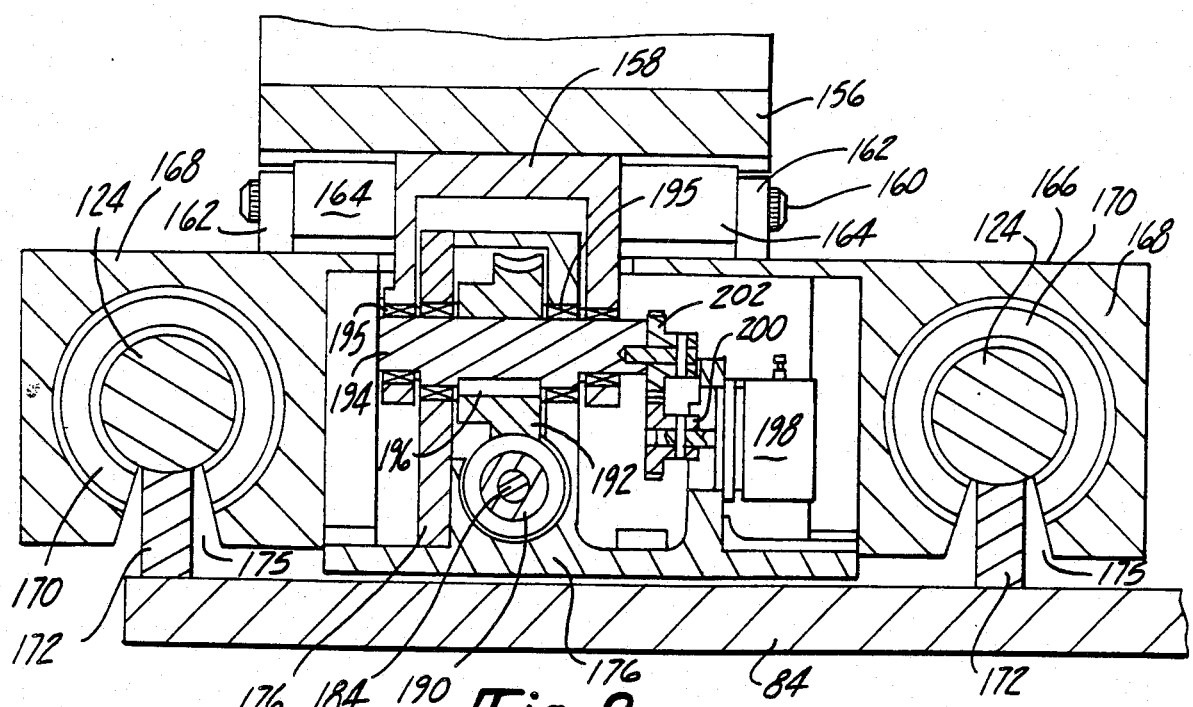
FIG. 8 is a sectional view similar to FIG. 6 but showing the condition of the motor camming mechanism when the paddle assembly is fully lifted as shown in FIG. 7.

Attention is now also directed to the FIGS. 6-8 which depict the details of means for effecting tilting movement of the paddle 92 as well as the structure for mounting the carriage 82 on the ways 124. The carriage base 166 is essentially U-shaped in cross section and includes a pair of legs defining laterally spaced bearing blocks 168 each of which receives a corresponding way 124 therethrough. The bearing blocks 168 are slidably supported on the ways 124 by lineal, recirculating type ball bushings 170. The bearing blocks 168 are provided with cutouts 175 in the bases thereof to provide clearance for longitudinally extending rails 172 which support the ways 125 on the shelf 84.

Means for effecting tilting movement of the paddle 92 comprises a camming mechanism which includes a DC motor 174, a worm gear assembly and an eccentric shaft 194. The DC motor 174 is electrically connected with the ribbon cable 106 and is mounted on a gear housing 176 which is disposed between the blocks 168 and beneath the yoke 158. The motor 174 includes a rotatable output shaft 185 which is drivingly coupled to a worm shaft 184 by means of a bellows coupling 178 and taper pins 186. The worm shaft 184 is rotatably mounted within the gear housing 176 by means of bushings 188, and extends axially through a worm gear 190. The worm shaft 184 is connected for rotation with the worm 190 gear by a taper pin 187.

The worm gear 190 drives a worm wheel 192 which is mounted on an eccentric shaft 194 and is secured thereto by a key 196. The outer ends of the shaft 194 are journaled for rotation in the gear housing 176 and the yoke 158 by needle bearings 195. The outer extremities of the shaft 194 are eccentric with respect to the rotational axis of the medial portion of the shaft 194, consequently rotation of the shaft 194 effects vertical displacement of the yoke 158. The effect of this vertical displacement is made apparent by comparing the position of the parts in FIGS. 5 and 6 with those depicted in FIGS. 7 and 8. As shown in FIGS. 5 and 6, the eccentric shaft 194 is positioned such that the yoke 158 is in its lower most position and base plate 156 (and thus the paddle 92) is substantially horizontal. In FIGS. 7 and 8, the shaft 194 has been rotated 180 degrees thereby displacing the yoke 158 upwardly to its maximum elevation. As the yoke 158 shifts upwardly, the base plate 156 pivots about shaft 160, thereby angularly displacing the outer paddle end 92A in a vertical plane. The magnitude of the angular displacement of the paddle 92 is measured by a potentiometer 198 which is mounted within the gear housing 176 and is coupled with the eccentric shaft 194 by means of a pair of spur gears 200 and 202. The potentiometer 198 produces a voltage signal proportional to the angular displacement of the shaft 194 and this signal is delivered to the control circuit via the flat ribbon cable 106.

The vertical displacement of the outer paddle end 92A due to angular displacement of the paddle 92 is directly proportional to the paddle's length. Since paddles of this type are normally rather long in relation to the magnitude of vertical displacement required to effect loading and unloading of the boats, the displacement angle is normally relatively small, e.g. one and one half degrees.

Reference is now made to FIG. 10, and 15-17 which depict the automatically operated door 82 employed to close off the end of the process tube 60. The door 82 is circular in space and is preferably formed of quartz for furnace systems operating at atmospheric pressure, however the door 82 may be also be formed of stainless or corrosion resistant steel for use with low pressure furnace systems. The door 82 includes a recessed O-ring 224 which is adapted to engage and substantially seal the outer end of the process tube 60.

The door 82 as well as an outer cover plate 204 and a door preload assembly 207 are mounted on a vertically extending door support rod 226. The preload assembly 207 functions to apply a preload or bias on the door 82 in order to assure a tight seal is created between the O-ring 224 and the end of the process tube 60. The preload assembly 207 includes a generally cylindrical housing 206, the outer end of which is closed by a removable cover 208. The housing 206 is mounted on a cylindrical connector 222 which is sleeved over the upper end of the support rod 226 and is secured thereto by a set screw 222.

The door 82 is connected with the preload assembly 207 by means of a connecting shaft 216 which is secured to the door 82 and is received within a guide collet 214. The shaft 216 is secured within the collet 214 by means of a clamping collar 218. The guide collet 214 includes an annular shoulder within the housing 206 which is slidably mounted on three circumferentially spaced shoulder screws 210. Helical compression springs 212 are sleeved over the screws 210 and bear against the collet guide, thereby biasing the door 82 toward the process tube 60.

The cover 204 may be formed of sheet metal and is stationarily secured to the housing 206. The cover 204 may be circular in shape or rectangular as shown in the drawings, and is adapted to overlie the edges of the end wall 66 when the door 82 is in a fully closed position as shown in FIG. 5.

As will be discussed below, the door operating mechanism 80 is operative to displace the entire door assembly both longitudinally when the door is axially aligned with the furnace tube 60, and transversely relative to the tube axis so as to define a hook-shaped path of travel. This path of travel is defined by a cut-out 123 in an enclosure 127 (FIG. 3) which normally covers the operating mechanism 80. FIG. 16 depicts the door 82 in an intermediate position, longitudinally aligned with the tube 60. After the door 82 engages the tube 60 during its longitudinal travel, continued movement of the support rod 226 results the guide collet 214 sliding outwardly against the biasing influence of the springs 212. The springs 212 thus effectively preload the door 82 into tight sealing engagement with the tube 60 and maintain this seal (FIG. 15) until the door is subsequently opened.

Referring now also to FIGS. 11-14, the door operating mechanism 80 includes a base plate 232 which supports a pneumatic cylinder 234, a transversely extending guide rod 254 and a pair of guide rod supports 248, 266 which support the opposite extremities of guide rod 254. The base of the support rod 226 is mounted on a slide block 260 which in turn is mounted for longitudinal sliding movement on a pair of guide rods 258. Guide rods 258 are secured to a carriage 244 which is slidably mounted on the guide rod 254. Movement of the bottom of the carriage 244 is guided by means of a cam follower 240 received within a cam track 236 in the base plate 232. Displacement of the carriage 244 to the opposite ends of the guide rod 254 is detected by the control system by means of a pair of electrical switches 252, 264 which are respectively mounted on switch brackets 250, 262.

The carriage 244 includes a hook 246 to which there is attached one end of a tension spring 288 covered by a flexible sleeve 230. The opposite end of the spring 228 is connected to the cover 204. The spring 228 functions to reduce vibration of the door assembly when it is actuated from its closed to an open position.

The pneumatic cylinder 234 includes a cylinder output rod 256 attached to an extension link 259 which includes a recess 270 therein. The outer end of the extension link 259 is provided with a cam follower roller 242 which is guided in a straight cam slot 238 defined in the base plate 232. The slide block 260 is connected with the extension link 259 by means of an interconnecting link 268 which has its opposite ends respectively pivotally connected by swivel pins 272 and 274 to the slide block 260 and to the extension link 259.

Figure 15:
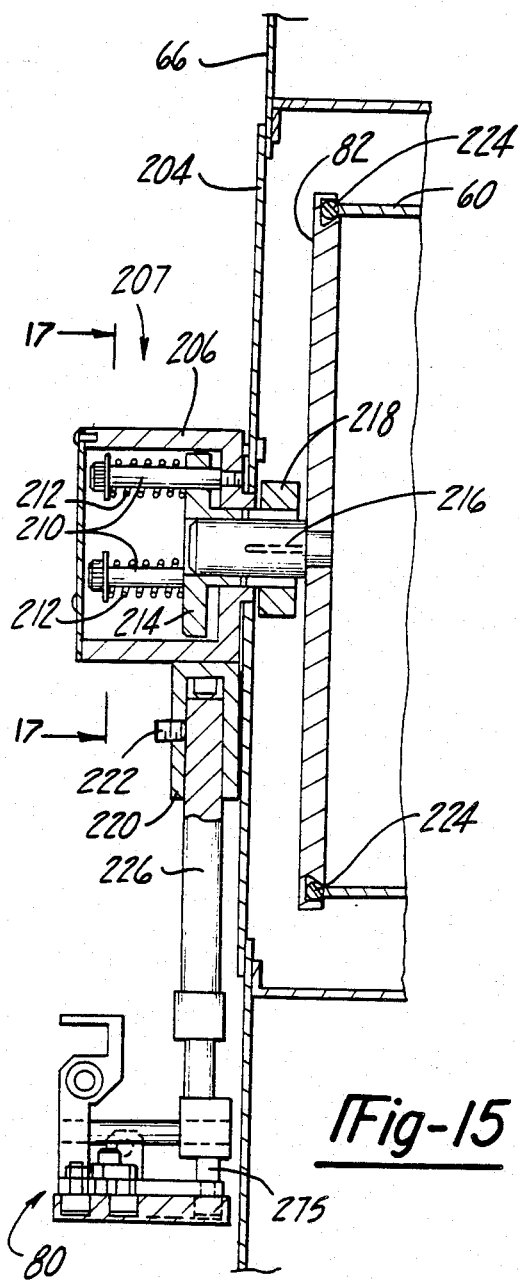
FIG. 15 is a sectional view taken along the line 15—15 in FIG. 10, the door spring having been removed for purposes of clarity, the door being shown in a fully closed position engaging the process tube.
Figure 16:
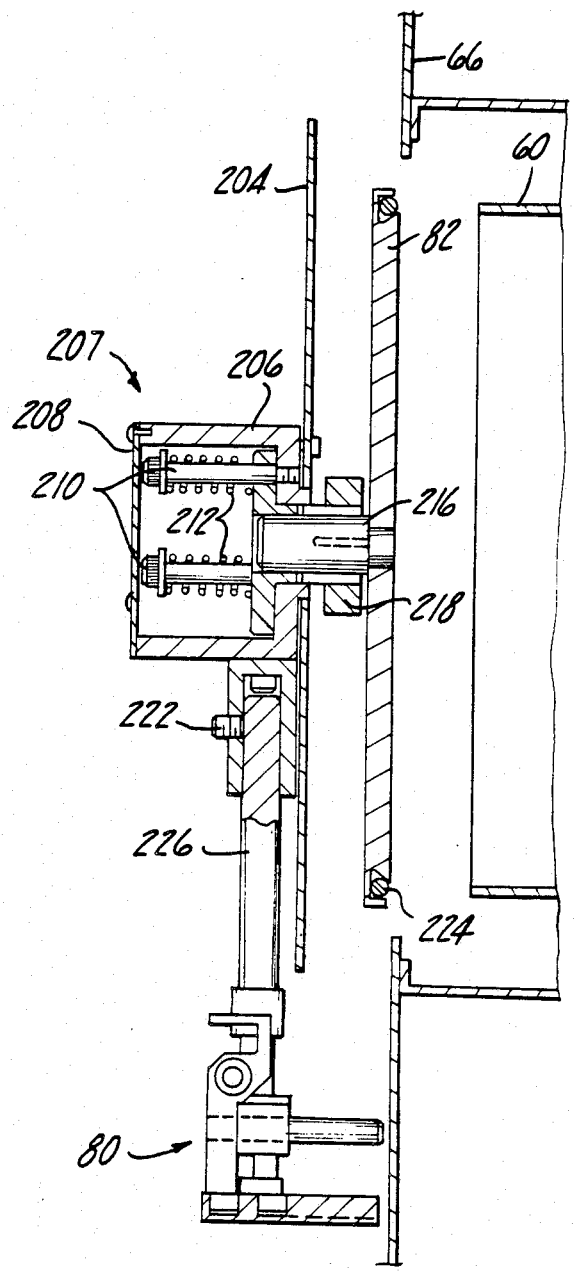
FIG. 16 is a sectional view similar to FIG. 15, but showing the door in its fully open, standby position.
Figure 17:
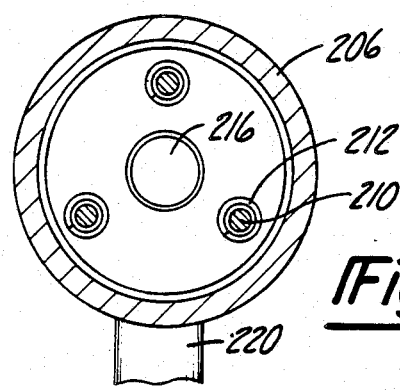
FIG. 17 is a sectional view taken along the line 17—17 in FIG. 15.

With the cylinder rod in its fully retracted position as shown in FIG. 10, the carriage 244 actuates switch 264, thereby providing a signal to the control system that the door 82 is in its fully closed, locked position as shown in FIG. 15. The door 82 is opened by delivering a control signal to the pneumatic cylinder 234, causing the cylinder rod 256 to shift to an extended position. As the rod 245 is displaced outwardly, one end of the connecting link 268 is transversely displaced along with the extension link 259; this motion causes the slide block 260 to slide toward the carriage 244, thereby transporting the door 82 axially away from the tube 60. During this first phase of door opening movement, the carriage 244 remains stationary or moves only slightly until the slide block 260 is fully displaced; continued movement of the slide block 260 toward the carriage 244 results in the nesting of the swivel pin 272 within the recess 270. At this point, with the slide block 260 contacting the carriage 244 (as shown in FIG. 12) the axial movement of the door 82 is complete.

As shown in FIG. 12, continued outward displacement of the cylinder rod 256 results in a transverse force being applied to the carriage 244 through the connecting link 268. Smooth sliding movement of the door 82 to its fully opened, stand-position is assured by the cam rollers 240, 242 and the guide rod 254. Engagement of the carriage 244 with the switch 252 results in the generation of a control signal indicating that the door 82 is in its fully open position.

The loading assembly 56 and door operating mechanism 80 described above may be employed with manual control systems, semiautomatic control systems and completely automatic control systems. The preferred embodiment disclosed herein employs a completely automatic control system which will now be described, first with reference to FIG. 18.

The automatic control system contained in the controller 54 includes a plurality of control modules 72, as previously mentioned, as well as a MUX (multiplexing) computer 514. The MUX computer 514 is a conventional, direct digital control microcomputer such as that available from Texas Instruments and identified as model TI 9900. The application software employed by the MUX computer 514 will be discussed later in more detail, and is of the type capable of "simultaneously" carrying out a number of process operations in real time.

Figure 18:
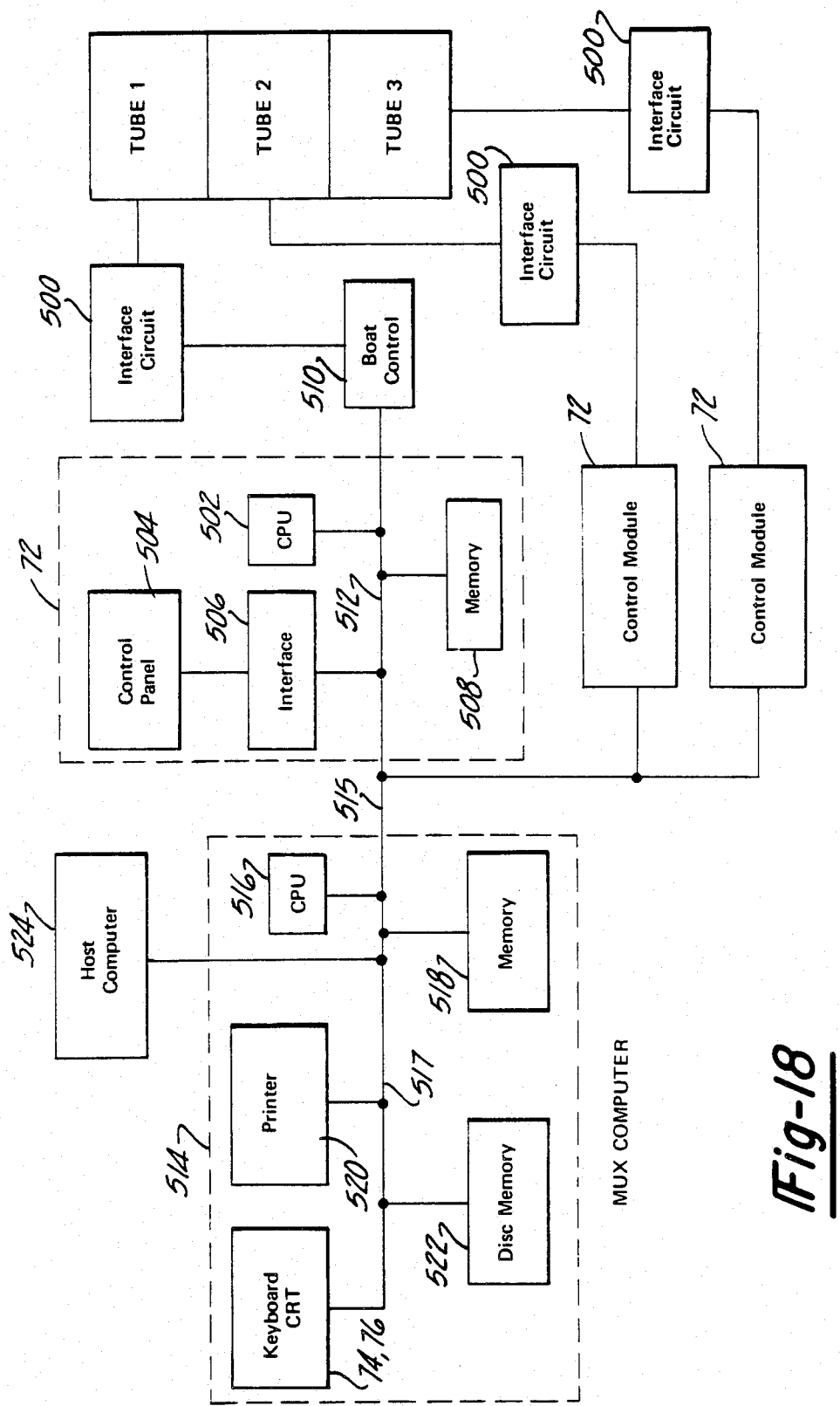
FIG. 18 is an overall block diagram of the electrical control circuit for the soft landing boat loader.

Each of the loading assemblies 56 and associated door operating mechanisms 80 are collectively designated as "tube" in FIG. 18; thus tubes 1, 2 and 3 are respectively controlled by an associated control module 72. Each of the control modules 72 includes a microcomputer comprising a CPU 502, a memory 508 and a control panel 504 connected to a common data bus 512 through an interface 506. Each control module 72 further includes a control interface 510 that interconnects the associated microcomputer with an interface circuit 500 which interconnects each "tube" with the associated control module 72. The details the interface circuit 500 will be discussed later.

The MUX computer 514 is interconnected with and controls, via a communications link 515, the microcomputers forming part of the control modules 72. The MUX computer 514 includes a CPU 516 connected by a data bus 517 with a memory 518 for performing calculations and storing programs, a printer 520 for printing out data in hard form, a keyboard/CRT 74, 76, and a disc memory 522 for permanently storing data. One or more of the MUX computers 514 may be controlled by a host computer 524.

FIGS. 19-24 collectively form the interface circuit 500 which provides the interconnection link between the microcomputer control module 72, and the various sensing switches and motors of the loading assembly 56, as well as the door operating mechanism 80. Circuit interconnections are effected by sets or strips of interconnecting junction pins and these pin sets are commonly identified in FIGS. 19-24 as J1, J2 and J3. Only the primary components of the circuit shown in the drawings will be described herein; the remaining components shown in the drawings will aid in providing a complete disclosure of the circuit, however, these later mentioned components and their function in the present circuit will be readily apparent to those skilled in the art and therefore need not be specifically discussed.

Figure 19:
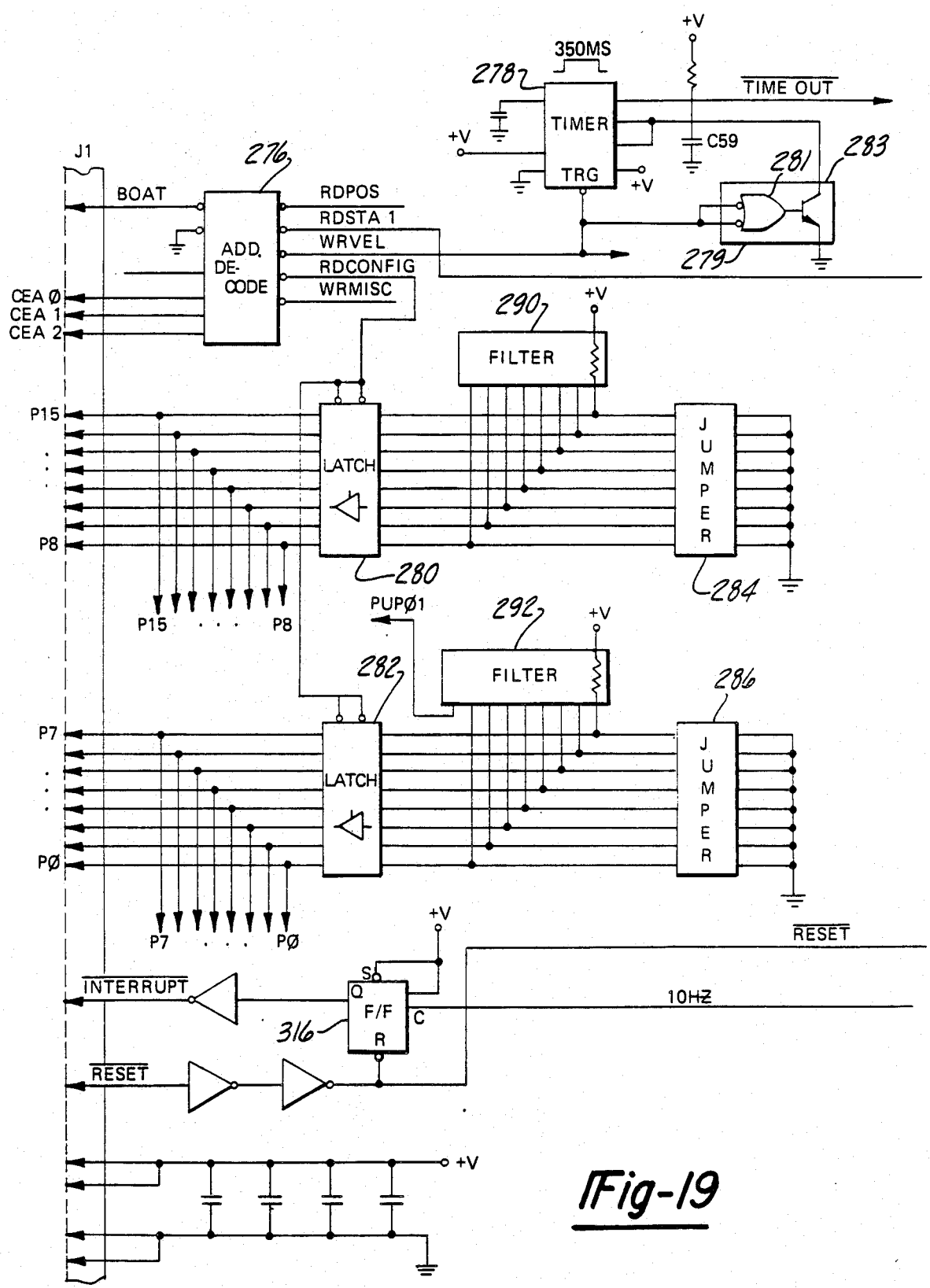
FIGS. 19 and 20 taken in conjunction form a detailed schematic diagram of an electrical control circuit for interfacing the soft landing boat loader with a microcomputer.
Figure 20:
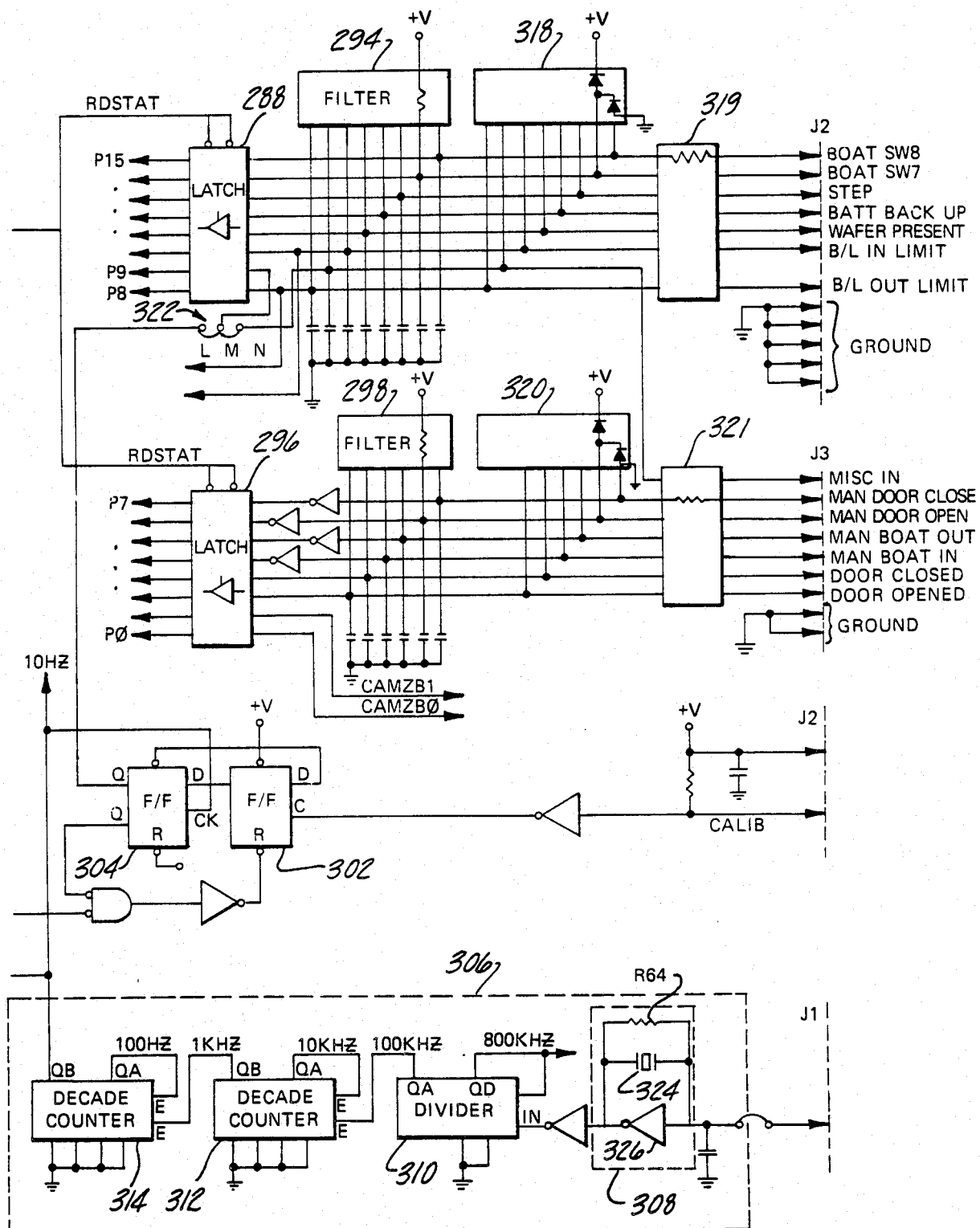

Referring first to FIGS. 19 and 20 collectively, address information in the form of address bits CEA Ø, CEA 1 and CEA 2 are delivered form the microcomputer to an address decoder 276 which may comprise, by way of example a 74LS138 chip. The decoder 276 is selectively enabled by a "BOAT" signal delivered by the microcomputer and functions to produce five command strobes: "RDPOS", "RDSTAT", "WRVEL", "RDCONFIG", and "WRMISC". These command strobes are used throughout the circuit.

The WRVEL signal consisting of write velocity commands is monitored by a watchdog timer 278.

Timer 278 may comprise, for example, a 555 chip which receives the WRVEL signal on its trigger input and produces a TIME OUT signal on its output. The TIME OUT signal remains high as long as the WRVEL is present at the trigger input of the timer 278. Each WRVEL signal discharges a timing capacitor C59 through a switch 279 consisting of an OR gate 281 and a transistor 283, and also initiates another timing cycle in the timer 278 via the trigger input of the timer 278. In the event that the microcomputer fails to issue a WRVEL signal within a preselected time period, e.g. 350 m sec, the timer 278 completes its time cycle and its TIME OUT signal goes low. Each of the motors and all solenoid drivers which control the operation of the boat loading assembly 56 and door operating mechanism 80 are disabled when the TIME OUT signal goes low. A subsequent WRVEL signal initiates a new timing cycle in the timer 278.

The read configuration command, RDCONFIG is delivered to a pair of latches 280, 282 whose inputs receive binary data from respectively associated jumpers 284, 286. Each of the jumbers 284, 286 possesses a line that can be selectively connected to ground through a jumper in order to generate a "1" or "0" for the corresponding line bit. The jumpers 284, 286 are employed to convey a specific information about equipment configurations requiring special treatment by the application program of the microcomputer. The outputs of the jumpers 284, 286 are respectively filtered by noise filters 290, 292 and this data is output from the latches, 280 282 to the microcomputer via pins P∅-P15 in response to the RDCONFIG signal from the address decoder 276.

The read status command, RDSTAT is delivered to a pair of latches 288, 296. The inputs to latches 288, 296 are connected to external lines which receive status signals from various sensors and switches in the boat loading assembly 56 and/or operating mechanism 80. For example, signals are received from the limit switches 87, 89 which are positioned at the extreme positions of travel of the carriage 82 in order to sense whether the carriage 82 travels beyond preset, outer limits. Similarly the status of the position sensing switches 252, 264 associated with the door operating mechanism 80 are received to determine whether the door 82 is open or closed. These external signals are delivered to the inputs of latches 288, 296. The inputs to latches 288, 296 are respectively protected by diode clamps 318, 320 and by resistive circuits 319, 321. The external input signals are filtered by respectively associated noise filters 294, 298 which may consist of a resistor and a capacitor.

The P9 bit of latch 288 is derived from a jumper 322 which may be selectively connected to one of two input sources: interconnecting terminals M and N results in supplying a signal from a spare input indicated as MISC IN ∅, while interconnecting terminals L and M results in signals being received from a calibration latch formed by a pair of interconnected flip-flops 302, 304. The input for flip-flops 302, 304 is formed by a calibration signals, CALIB derived from a calibrating photodiode which is controlled by the potentiometer 96. When one of two calibration points is passed, a negative-going pulse is delivered to the input of flip-flop 302. The leading edge of this pulse sets the Q output high and each time an interrupt clock signal is output from an interrupt generator 306, the state of the Q output of flip-flop 302 is transferred to the A input of flip-flop 304. The Q output of flip flop 304 is then delivered to the microcomputer via the P9 output of latch 288.

The status of the 14 external inputs collectively stored in latches 288, 296 is delivered to the microcomputer on pins P∅-P15 in response to RDSTAT signals output from the address decoder 276.

Figure 22:
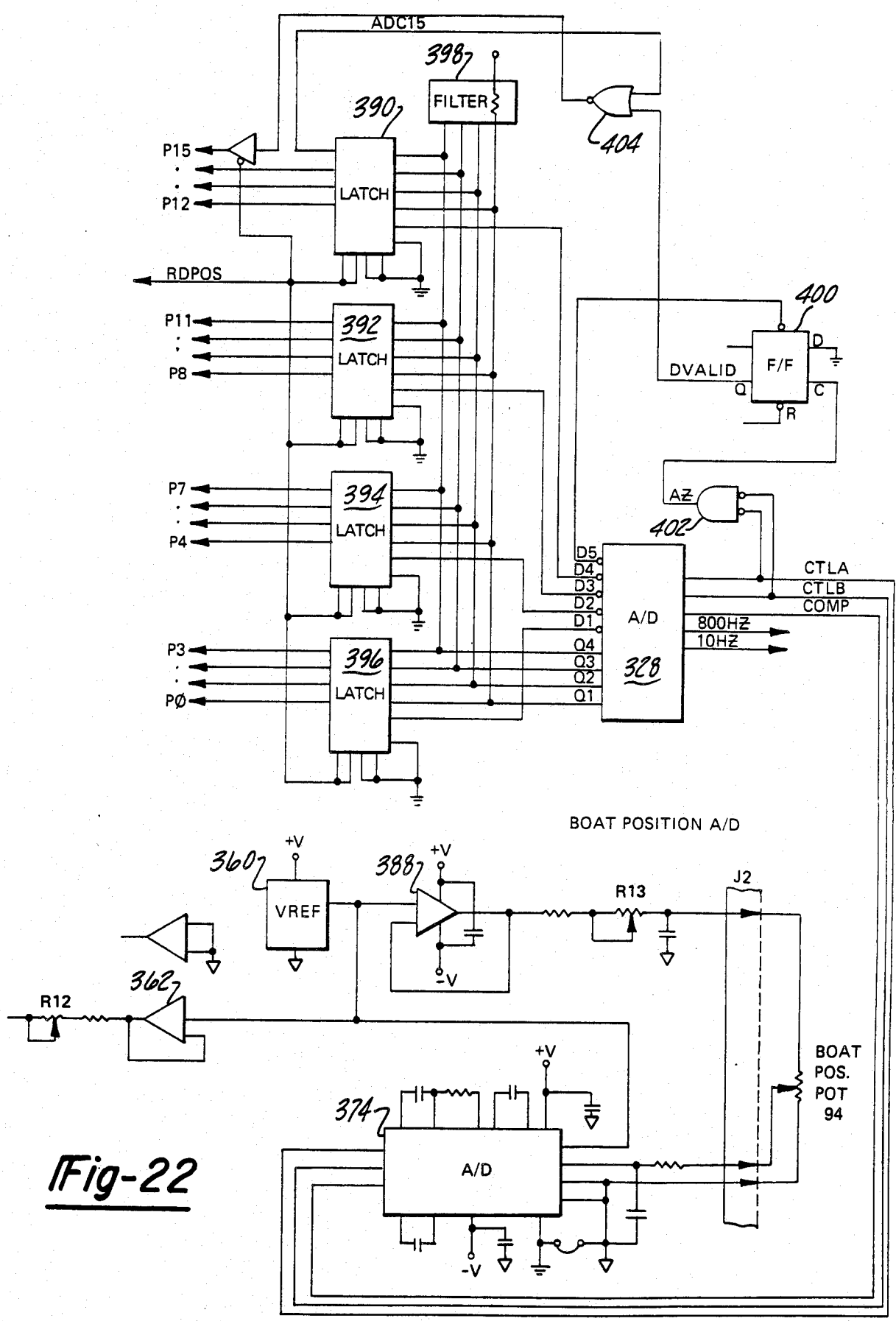

An interrupt timing signal is delivered to the microcomputer every 100 msec by the interrupt generator generally indicated within the broken line 306. The time base for the interrupt signal originates from an interrupt clock 308 which comprises a 1.6 mhz oscillator 324, a resistor R64 and an inverter 326. The interrupt generator further comprises a divide-by-16 divider 310 and a pair of decade counters 312, 314. The 1.6 mhz clock signal is first divided by 16 by the divider 310 to provide 100 khz. An 800 khz output from the divider 310 is delivered to a later discussed analog-to-digital (A/D) convertor 328 (FIG. 22). The divider 310 also provides a 100 khz output which is divided by 10,000 by the dual decade counters 312, 314. The 10 hz output of decade counter 314 sets a flip-flop 316 high on each rising edge. The high output of flip-flop 316 is delivered on an interrupt line to the microcomputer until a reset signal is returned to the flip-flop 316 by the microcomputer. While the interrupt flip-flop 316 is set, the interrupt generator continues counting the next interrupt time.

Figure 21:
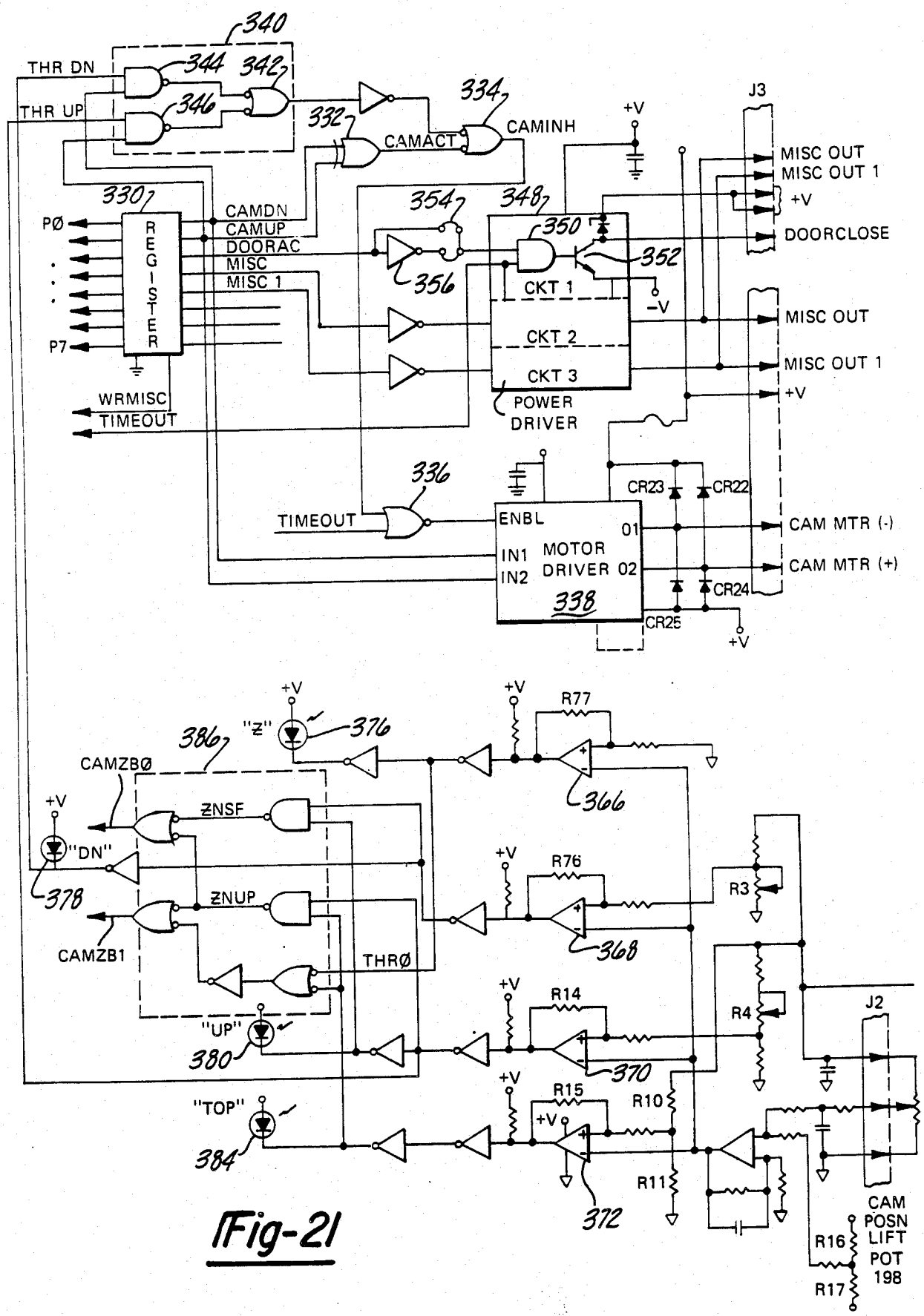
FIGS. 21 and 22 taken in conjunction form another portion of the electrical control circuit.

Referring now to FIGS. 21 and 22 collectively, the write CAM command signal, WRMISC, output from the decoder 276 (FIG. 19) is loaded into a register 330 which includes input bit lines P∅-P7. Bits P∅ and P1 control the vertical cam lift DC motor 174 (FIGS. 5 and 7). The presence of the WRMISC signal results in the transfer of bits P∅ and P1 as respective CAMDN and CAMUP signals to the inputs of an exclusive OR gate 332. If both inputs to the exclusive OR gate 332 are the same then the output thereof will be low and this low signal is gated through OR gate 334 as a CAM inhibit signal which in turn is gated through NOR gate 336 to the enable input of a motor driver 338. Motor driver 338 may comprise, for example an L293B chip which functions to produce positive and negative CAM motor signals on its outputs; these signals are delivered to cam motor 174 (FIGS. 5 and 7) and respectively result in the boat being lifted or lowered.

If the motor driver 338 is enabled, then the CAMDN and CAMUP signals control the voltage on the outputs of the motor driver 338. When the motor driver 338 is enabled, one output is at positive voltage DC while the other output forms a return at the same voltage. Reversal of the polarity of the output signals from the motor driver 338 in response to a change in the CAMDN and CAMUP signals results in rotation of the cam motor 74 in the opposite direction. Diodes CR22-CR25 clamp the motor driver 338 output lines to prevent them from exceeding maximum and minimum voltages resulting from inductive kick back from the motor 174.

If only one of the P∅-P1 bits is high, then the motor driver 338 is enabled unless the output of a limit inhibit signal is gated through OR gate 334 which is generated from a logic circuit 340. The logic circuit 340 comprises an OR gate receiving input signals from a pair of NAND gates 344 and 346. The inputs to NAND gate 344 are formed by the CAMDN signal from register 330 and the THRDN signal indicating that the vertical lift motor 174 has reached a lower limit. The inputs to NAND gate 346 are formed by the CAMUP signal and a THRUP signal which indicates that the cam motor 174 has reached an upper limit of travel. A CAMINH signal is output from the circuit 340 if the direction of the motor 174 is up (CAMUP is high) and the upper limit of movement has been exceed (THRUP is high). The circuit 340 also outputs the CAMINH signal if the motor direction is down (CAMDN is high) and the motor position is below the lower limit (THRDN is high).

The output of the motor driver 338 may also be inhibited by a TIMEOUT signal produced by the watchdog timer 278 (FIG. 19) which is delivered through the NOR gate 336 to the enable input of the motor driver 338.

A power driver circuit 348 receives bits P2-P4, which respectively correspond to a furnace door control signal DOORAC and a pair miscellaneous control signals MISC Ø and MISC 1. Each of these three signals control a corresponding circuit of the power driver 348 which function to switch a corresponding output line, DOOR CLOSE, MISC OUT Ø, MISC OUT 1, with the return path of a voltage source $-V$. Each of the power driver circuits 348 comprises an input AND gate 350, the output of which controls the base electrode of an associated switching transistor 352. The collector and emitter of the transistor 352 are respectively connected to the output line for that circuit and the return for the voltage source. A jumper 354 is provided in order to bypass an inverter 356 and thereby alter the state of the bit for enabling the DOOR CLOSE output.

The rotational position of the cam motor 174 is monitored by the continuous rotation potentiometer 198. The voltage applied across the potentiometer 198 is determined by a voltage reference source 360, a buffer amp 362 and a trim potentiometer R12. The output of the amplifier 362 is the sum of the pot wiper voltage and a voltage derived from a divider network formed by resistors R16 and R17. The output of amplifier 362 is also delivered to the non-inverting (positive) input of a plurality of comparators 366-372.

The comparators 366-372 compare the buffered voltage on their inverting (negative) terminal which is supplied by the potentiometer 198, with the various thresholds on their positive terminals; when the potentiometer voltage exceeds the threshold voltage, the output of the associated comparator 366-372 is low; otherwise the output is high. A small amount of hysteresis is provided by feedback resistors R77, R76, R14 and R15.

The potentiometer 198 may be of the continuous rotation type and is mechanically aligned such that a zero degree setting equals zero volts which is equal to a fully open position of cam motor 174. Comparator 366 compares the voltage on its negative input against a zero voltage threshold point, and it can be appreciated that this particular threshold is always exceeded except when the wiper of the potentiometer 198 is in an open position. Comparators 368 and 370 compare the potentiometer voltage against threshold limits respectively corresponding to the normal lower and upper limits of travel provided by the cam motor 174. These limits are determined by potentiometers R3 and R4. Comparator 372 compares the motor position voltage with a threshold limit which is normally 50% of the full voltage of the potentiometer 358; this 50% threshold voltage is provided through a voltage divider R10 and R11.

Each output of the comparators 366-372 is monitored by an associated LED 376-384 which illuminates when the threshold voltage limit is exceeded. Additionally the state of the comparator outputs are logically combined by a series of logic gates 386 to generate a 2 bit encoded value (CAMZBØ and CAMZB1) which represent the rotational position of the cam motor 174 and thus the corresponding vertical displacement controlled by the motor.

The bit outputs of comparators 368 and 370 respectively form the THRUP and THRDN signals which are employed by the logic circuit 340 to produce an inhibiting signal CAMINH when the threshold is passed.

Figure 4:
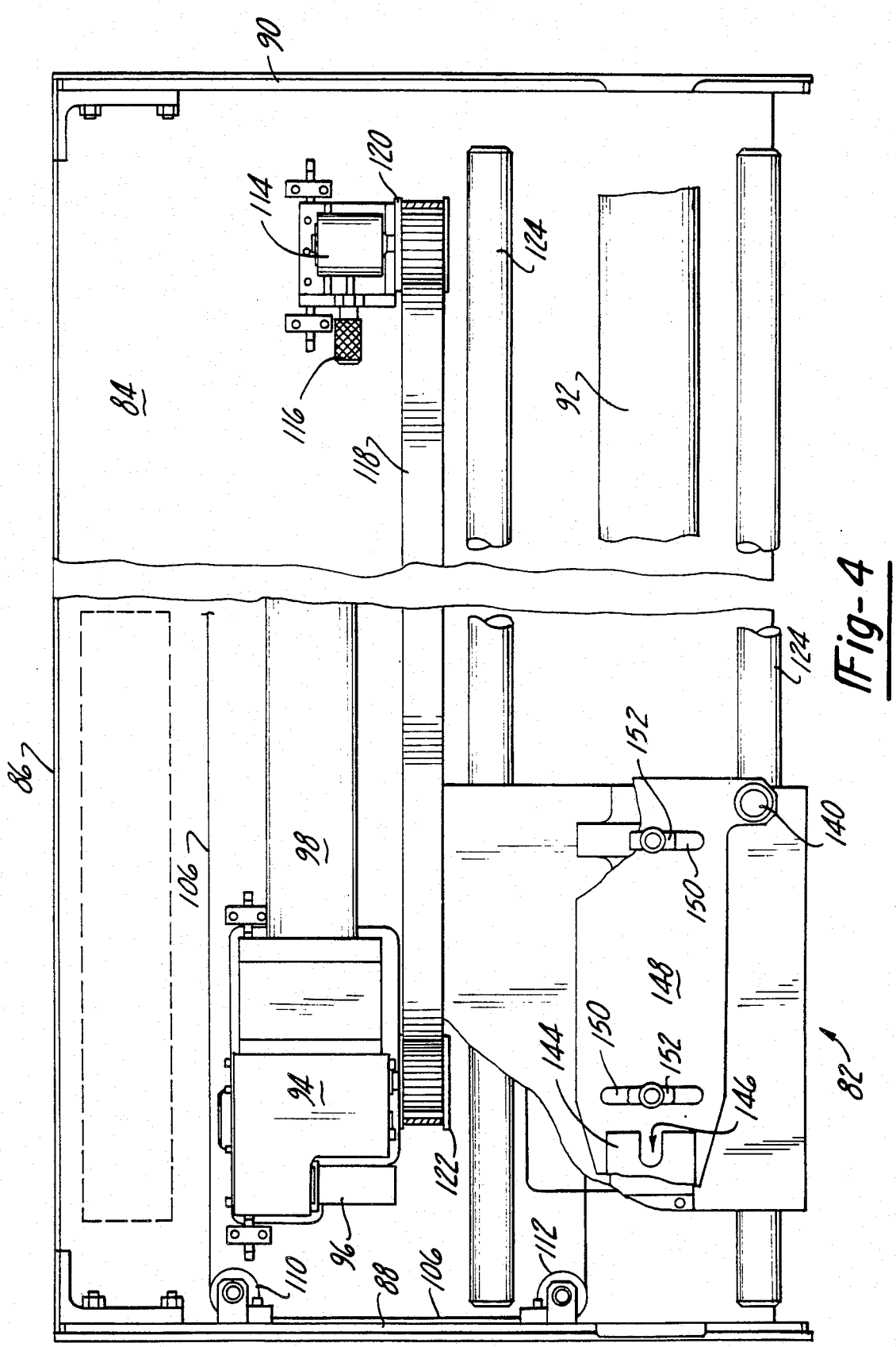
FIG. 4 is a top view of a loading assembly, similar to FIG. 3, but taken on an enlarged scale with the paddle assembly thereof having removed, parts being broken away in section for added clarity.

The linear travel position of the carriage 82 is sensed by the potentiometer 96 (FIGS. 4 and 22). The voltage across potentiometer 96 is derived from the voltage reference source 360, buffer amplifier 388 and a trim potentiometer R13. Chips 328 and 374 collectively form an A/D convertor for converting the voltage provided by the potentiometer 96 to a BCD value which is to be read by the microcomputer. This BCD value is filtered by noise filter 398 and is loaded into the latches 390-396 until read by the microcomputer. An A/D cycle is commenced when a 10 hz INTERRUPT signal is received by chip 328 which forms the digital portion of the A/D convertor. The timing of the cycle is based on the 800 khz clock signal delivered to the chip 328. The cycle comprises auto zero, integrate input and integrate reference phases.

At the end of each integrate reference phase, the digital reading in chip 328 is updated to reflect the the voltage read during that cycle. This reading is output from chip 328 on its QØ-Q3 outputs in a multiplexed fashion. The D1-D5 outputs of chip 328 form the digit strobes, with D1 representing the least significant digit. Each strobe causes the respective digit to be stored in the corresponding 4 bit latch 390-396. The reading from the potentiometer 96 is sent directly to the data bus of the microcomputer from the tri-state output of latches 390-396 when a read position command, RDPOS is received from the address decoder 276 (FIG. 19).

The P15 bit is employed as "data valid", DVALID signal. Since the A/D reading is multiplexed from the chip 328, a short interval of time exists during which the latches 390-396 hold a combination of old and new data. The start of the new reading update results in a signal being gated through the AND gate 402 which in turn sets a flip-flop 400 that produces the DVALID signal. The D5 digit strobe from chip 328 is employed to reset the flip-flop when all four updated digits been have loaded into the latches 390-396. It should be noted here that the most significant bit output from the latch 390 is also gated through the NOR gate 404 to generate the data valid bit at pin P15. Potentiometer R13 is adjusted so that a full potentiometer voltage results in a BCD reading of a preselected number, e.g. 7999, which corresponds to a preselected voltage. In the event that the A/D reading exceeds this BCD value (7999), then the DVALID signal is delivered to P15 from the latch 390.

Figure 23:
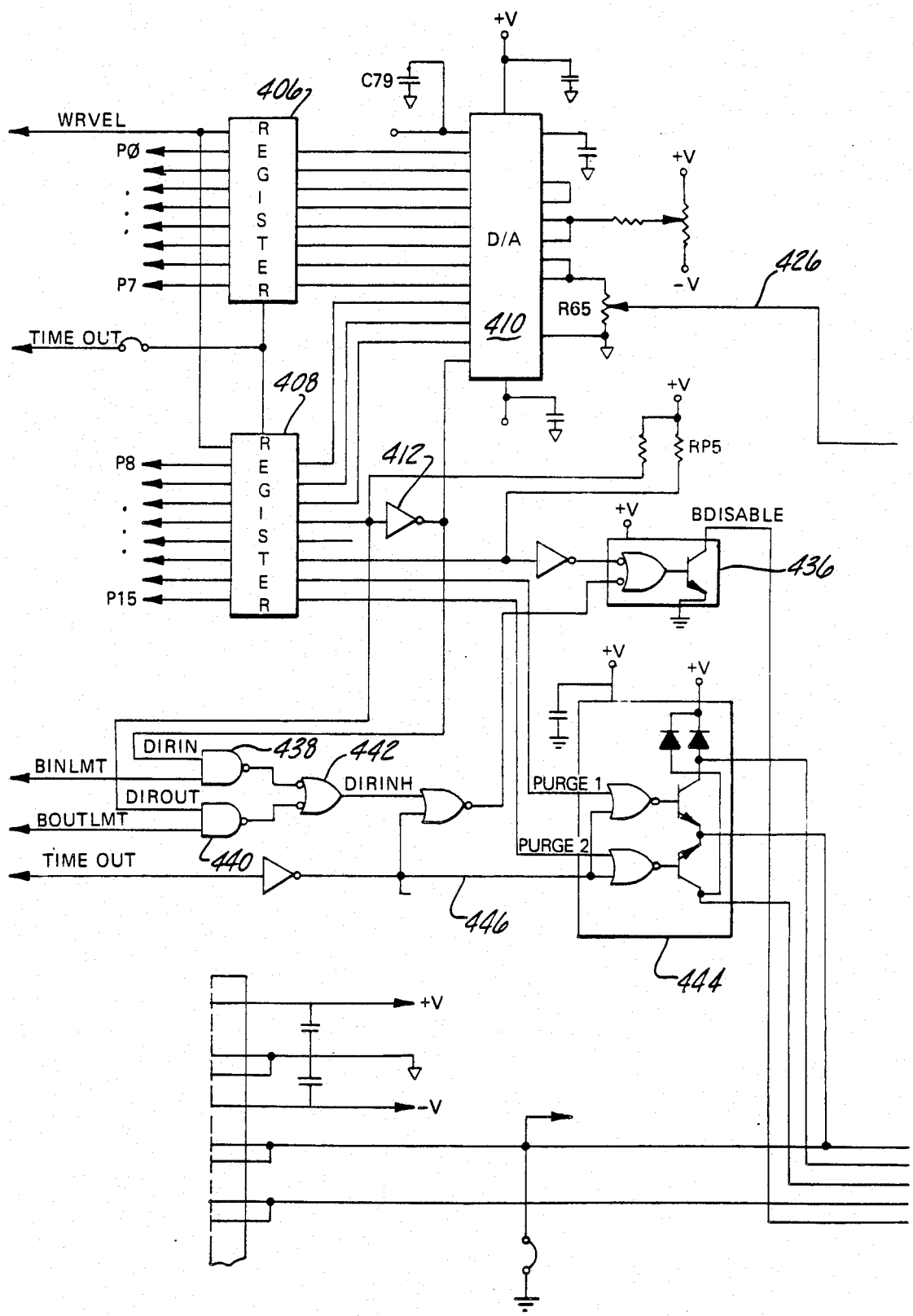
FIGS. 23 and 24 taken in conjunction form still another portion of the electrical control circuit.
Figure 24:
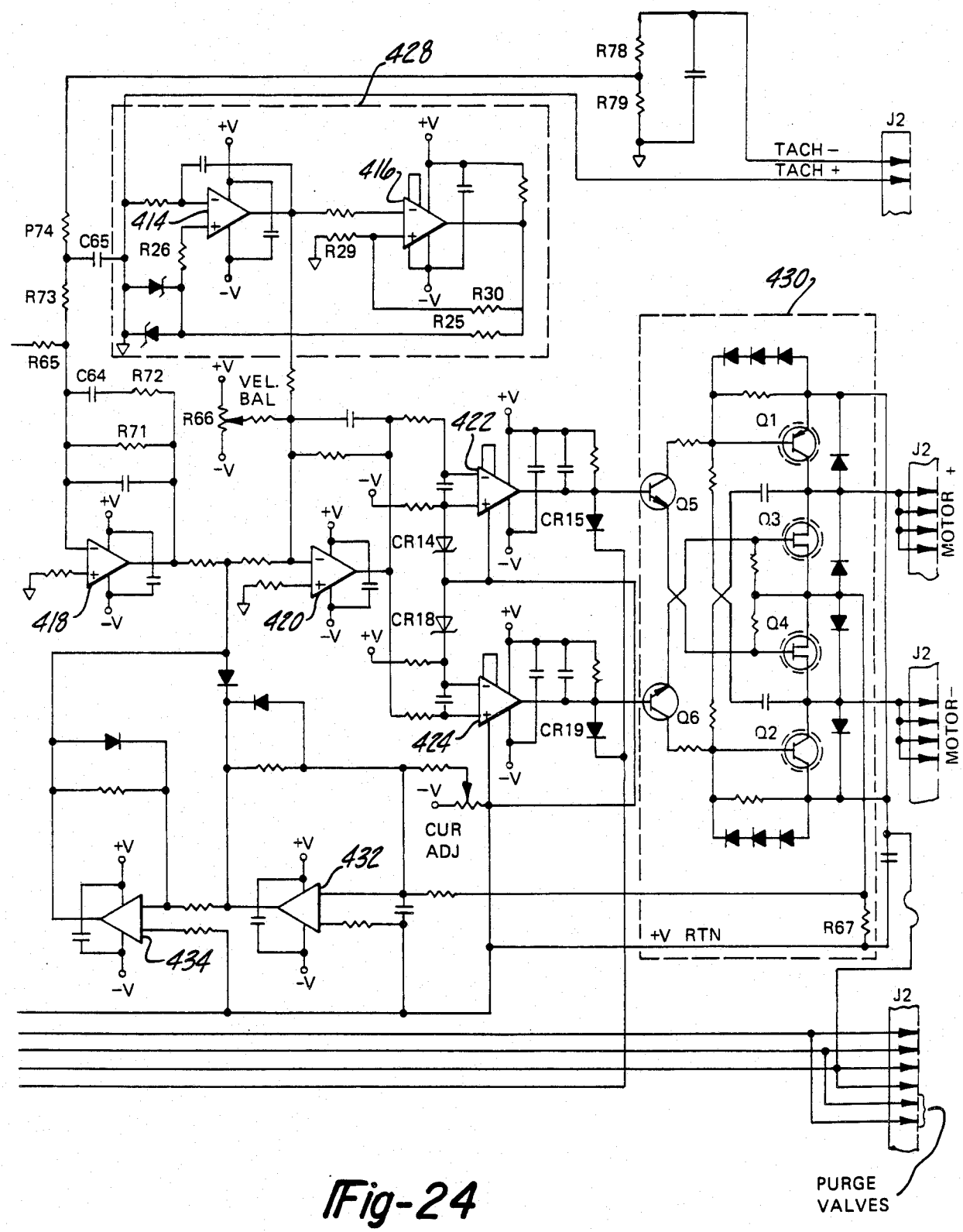

Referring now to FIGS. 23 and 24 collectively, the write velocity command WRVEL derived from the address decoder 276 (FIG. 19) loads the boat paddle carriage 82 velocity plus miscellaneous control bits into a 16 bit register 406, 408 having input pins PØ-P15. The 12 lowest bits (P11-PØ) control a D/A convertor 410 which drives the boat (carriage) speed control circuitry which will be described momentarily. It should be noted that bit P11 is inverted by an inverter before delivery to the D/A convertor 410; this is a direction bit which controls the polarity of the D/A 410 voltage.

The boat motor (carriage) speed control circuit provides closed loop speed control using a pulse width modulated motor drive. The analog output signal of the D/A convertor 410 on line 426 is the boat speed setpoint which may be adjusted by a potentiometer R65. The speed setpoint signal on line 426 is summed at the negative terminal of an error amplifier 418 with feedback voltage from a tachometer (not shown) which senses the speed of motor 98 (FIG. 4).

The output of the amplifier 418 is an error signal. The tachometer feedback voltage possess a polarity opposite to the speed set point signal so that when it equals the set point signal, the error is equal to 0. The calibration potentiometer R64 is employed to adjust the set point to that it matches the tachometer voltage scaling (volts/rpm). Resistors R78 and R79 reduce the voltage input from the tachometer, while resistor R74 and capacitor C65 provide noise filtering of this input signal. The error amplifier 418 further acts as a low pass filter as a result of capacitor C64 and resistor R72 being in its feedback path. The speed setpoint signal and the tachometer voltage are weighted by resistors R68 and R73 plus R74 respectively in relation to resistor R71.

A triangular waveform oscillator 428 is provided which includes an integrator 414 and a comparator 416. The integrator 414 receives the positive tachometer signal at its negative terminal and ramps in one direction until it exceeds the threshold of comparator 416. Once this occurs, the output of comparator 416 changes state and is fed back to the positive terminal of integrator 414 through resistors R25 and R26. This feedback from the comparator 416 causes the output of the integrator 414 to ramp in the opposite direction until the comparator threshold is again exceeded. These thresholds are determined by a voltage divider comprising resistors R29 and R30 as well as the output voltage of comparator 416.

The error signal output from amplifier 418 is summed with a triangular waveform signal provided by the triangular waveform oscillator 428, at the negative input of an amplifier/modulator 420. In effect, the modulator 420 modulates the triangular wave form signal in accordance with the error voltage supplied by the output of error amplifier 418. A positive error signal from amplifier 418 will, therefore, shift the modulated triangular waveform output from the modulator 420 below zero volts, whereas a negative error voltage shifts it above zero volts. The error amplifier 14 essentially functions as a summing amplifier which, in the the case of the present embodiment, has an oscillator gain of −1 and an error signal gain of −4.5. Each volt of error signal, therefore, shifts the output by 4.25 volts. Since the oscillator is not symmetrical around zero volts, a resistor R66 is employed to provide an adjustment via modulator 420 to center the output of modulator around zero volts with no error signal. The voltage from resistor R66 has a gain of −0.4 so that six volts of offset (0.4×15 volts) can be be provided. This results in equal motor speed in each direction for the same positive and negative set point.

The modulated triangular waveform output from the modulator 420 is applied in parallel to the negative terminals of a pair of comparators 422, 424 which function as zero crossing detectors. The threshold of each comparator 422, 424 is established by Zener diodes CR14 and CR18 and is such that a range of intermediate voltages or "deadband" is established in which neither of the outputs of comparators 422 or 424 is high. This ensures that non-overlapping control signals are delivered to the carriage motor 98.

In the event that the output of the modulator 420 is perfectly centered around zero volts, equal positive pulse widths are output by both comparators 422, 424. A nominal 660 usec oscillator cycle, for example, would result in pulse widths of about 85 usec with a 245 usec "deadband" separating the pulses. As the modulated oscillator waveform shifts above zero volts, the pulse width output from comparator 424 becomes longer while the pulse width output from comparator 422 becomes shorter; the opposite result occurs when the output of the modulator 420 shifts below zero volts. This has the effect of varying the average DC voltage to the carriage motor, and thus the speed thereof.

The output pulses from comparators 422, 424 are delivered to the input of an amplifier output stage 430 which includes transistors Q1-Q6. The amplifier output stage 430 applies reverse polarity voltage to the motor 98 using a single voltage power source. A positive signal to the base of the transistor Q5 causes transistor Q1 to connect the positive line to motor 98 with a positive voltage source, and also causes transistor Q4 to connect the negative line of motor 98 to the return of the the voltage power source. A positive signal to transistor Q6 reverses the voltage across the motor 98 as transistor Q3 connects the positive voltage line to the motor 98 to the voltage power source return and transistor Q2 connects the negative line of to the motor 98 to the positive side of the voltage power source. Transistors Q1 and Q4 drive the motor in the clockwise direction while transistors Q2 and Q3 drive the motor in a counterclockwise direction.

As previously mentioned, the signals which drive transistors Q5 and Q6 cannot overlap, consequently only one power driver transistor pair conducts at one time. If both transistors Q5 and Q6 are enabled for equal amounts of time over a period, the resulting motor speed is zero. The motor drive may be inhibited regardless of the error signal, by a boat disable signal, BDISABLE impressed through diodes CR15 and CR19. If the BDISABLE signal is low, then the signals to the bases of transistors Q5 and Q6 are clamped to a value which is insufficient to turn on these transistors.

In order to prevent excessive motor current, a current limiting feedback path is provided in the overall speed control loop which consists of resistor R67 and inverting amplifiers 432 and 434.

The broad concept underlying the closed loop speed control circuit described above involves the fact that for a given speed setpoint from the D/A converter 410, the motor tachometer feedback voltage controls the error signal output from the error amplifier 418. As the motor speed approaches the speed setpoint, the error signal goes to zero. This, however, results in zero motor voltage and the motor slows down, thereby increasing the error signal. Due to the high gain of the error amplifier 418, a relatively small change in the tachometer voltage will result in a large change in the error signal voltage. As a consequence, the error signal reaches an oscillating equilibrium around the level that produces the desired motor speed, and the error voltage does not actually reach zero voltage. The overall gain of the speed control circuit is such that in the present embodiment, a 3 rpm difference between motor speed and the speed set point will produce full voltage to the motor.

Bit P13 of register 408 is the boat disable bit. When this bit is high, the transistor output of the chip 436

(which may comprise a 75451 device) is turned on thereby grounding diodes CR15 and CR19; as mentioned earlier, this inhibits the amplifier output stage 430. The chip 436 also produces a boat disable signal, BDISABLE when the watchdog timer 278 (FIG. 19) times out and changes the bit P11 of register 408, or when a boat limit switch is activated to change the P12 bit. In order for such a limit switch to disable the output stage 430, the set point direction must correspond to the limit switch encountered, as determined by a logic circuit consisting of AND gates 438, 440 and OR gate 442. This permits reversing the direction of the carriage to move back to the center of travel even though a limit switch has been actuated.

Bits P14 and P15 of register 408 control a pair of solenoid drivers forming part of chip 444 (which may comprise a 75478 device). The chip 444 delivers signals to solenoids (not shown) which selectively flood the furnace tubes 60 with nitrogen when the door 82 is open. Additionally, if the watchdog timer 278 (FIG. 19) times out, the timeout signal delivered to the chip 444 on line 446 goes low, thereby stopping the boat motor and flooding the tubes 60.

The present invention includes a method of "teaching" the control system to repeatedly carry out various control commands based on control limits which are initially set by an operator. As a result of the self-teach method, the boat loader of the present invention may be quickly recalibrated and reprogrammed to employ various kinds and sizes of boats. It is to be understood that the self-teach method described herein may be advantageously employed with a wide variety of boat loaders other than the specific embodiment illustrated herein. A summary of the steps involved in carrying out the self-teach method will be provided later herein following a description of the software which is employed in part to carry out the method.

In order to program the boat loader for operation with various kinds and sizes of boats and/or paddles 92, it is necessary to load into memory a number of parameters which depend upon the type and size of paddles or boats being employed. This data is input to a memory of the controller 54 in the form of one file comprising two pages respectively designated a "Boat Table" and "Furnace Table". Each table includes a plurality of fields into which data must be loaded by the operator in order to initialize the software program which controls the operation of the boat loader. This data is typically stored on a hard disc memory 522 (FIG. 18) and is simply recalled from the memory when it is to be used.

Prior to loading the data into the tables and performing the self-teach method, it is necessary to install and position the paddle 92 properly, and thereafter determine the position of the boats placed on the paddle 92.

Next, the operator loads the appropriate data into the Boat Table. It should be noted here that each table is respectively associated with a single loader and associated process tube, consequently a table must be established for every loading assembly 56 at the loading station 50 (FIG. 1).

A typical example of a Boat Table is set out below:

| BOAT TABLE | |
| --- | --- |
| Boat Type: A | PRP-Outer Limit Switch: 136 cm |
| PRP-SRP: 100 cm | PRP-Inner Limit Switch: 6 cm |
| Max Speed: 125 cm/min | PRP-Crossing Point: 1357 cnts |
| Vel. Multiplier: 8 | SRP-Crossing Point: 4506 cnts |

| -continued | |
| --- | --- |
| BOAT TABLE | |
| Acceleration: 47 cm/min/min | PRP-Last Lowered: −257 cm |
| Allowable Deviation: 0 cnts | Is Paddle Loaded???: Yes |
| PRP-O ref.: 195 cm | |
| Input Multiplier: 1 | |
| Input Devisor: 1 | |

In order to load the Boat Table, it is first necessary to set the boat loader in a standby state using the control panel 504 (FIG. 18). Access to the Boat Table is achieved by typing in an appropriate code on the keyboard 76 (FIG. 1) at which point a "clear Boat Table" message will appear on the CRT 74. The first step in completing the Boat Table consists of loading in the appropriate "boat type", which refers to the type of loader with which the control system is being employed, i.e. soft-land, cantilever, conventional, etc. Similarly, the remaining data is then input by the operator via the keyboard 76. The PRP-SRP field refers to the distance between two calibration points for the loader. "Max Speed" refers to the maximum permissible speed that the carriage 82 is permitted to travel. The remaining data fields likewise relate to similar hardware characteristics of the loader.

The self-teach method of the present invention is employed to load data into the furnace table. A typical furnace table as displayed to the operator on the CRT 74 is set-out below:

| FURNACE TABLE |
| --- |
| Tube Name: A1 |
| Elevator Load Point: 192 cm |
| Paddle Clear of Door: 177 cm |
| Paddle Inside THreshold: 162 cm |
| First Allowed Unload Point: 146 cm |
| Wafers in Center Zone: −17 cm |
| Last Allowed Unload Point: −18 cm |
| End of Quartz: −18 cm |
| Current Position: |
| Set Position: |
| Door State: |
| Cam State: |

After calling up the Furnace Table, the operator addresses a particular field by moving a cursor on the screen using appropriate function keys. The tube name, identifying the particular loading assembly associated with the process tube, is first entered; all subsequent data entered in the same screen thus relates to that particular loader and process tube. The seven fields below the "tube name" each relate to the position of the paddle 92 (and thus of boats loaded thereon) relative to various reference points along the paddle's path of travel. The remaining four fields identified above, i.e. current position, set position, door state and cam state represent current values which are displayed when data is loaded into the fields using the self-teach method. The carriage 82, and thus the paddle 92 are moved to a desired position along the guideway 124 for each field. For example, the paddle is first moved to a "elevator load point" which corresponds to the point along the path of travel at which boats are to be loaded onto the paddle 92 either manually or using an automatic elevator device. With the paddle 92 in the proper position, which is displayed on the screen as "current position", the operator then presses a "self-teach" function key on the keyboard 76, whereupon the position parameter is loaded into the "elevator load point" field. The paddle 92 is allowed to remain in that position as the cursor indicating the field being addressed moves to the "paddle clear of door" field. This parameter refers to the distance from a primary reference point to the origin of the paddle when the paddle tip marginally clears the furnace tube door 82. The operator then moves the paddle 92 to this position and the self-teach function key is actuated by the operator to enter the position of the paddle 92 at this point.

The remaining fields of the furnace table are loaded with data in a similar manner, with the paddle 92 being moved to the appropriate position by the operator using manual motor control, and these positions are loaded into the table using the self-teach function key. The "paddle inside threshold" refers to the position of the paddle immediately after it enters the interior of the process tube 60 and is beyond a threshold or lip of the tube.

"First allowed unload point" refers to the location within the tube at which it is desired to unload the boat, which is positioned closest to the end of the tube. Similarly, "wafers in center zone" and "last allowed unload point" also refer to points within the tube at which boats are to be deposited.

The "end of quartz" field refers to the maximum point of displacement of the paddle into the tube.

Having loaded data into the Furnace Table fields, the operator may then write the Furnace Table to disc 522 (FIG. 18). The boat loader is now ready for use and it is unnecessary to alter data in the Furnace Table until such time as the type/size of the boat or paddle is changed.

Additional details of the self-teach method will be provided in the following description of the application software for the boat loader control system, flow chart diagrams for which are shown in FIGS. 25-68. The program disclosed herein is written in Pascal, which is a high level compiler language.

The primary steps and routines of the program will now be described with reference to FIGS. 25-68, and reference numerals will be employed only to highlight particularly significant portions of the program or to assure clarity in the description. Like reference letters or numbers indicate connected flow paths in the various views.

Figure 25:
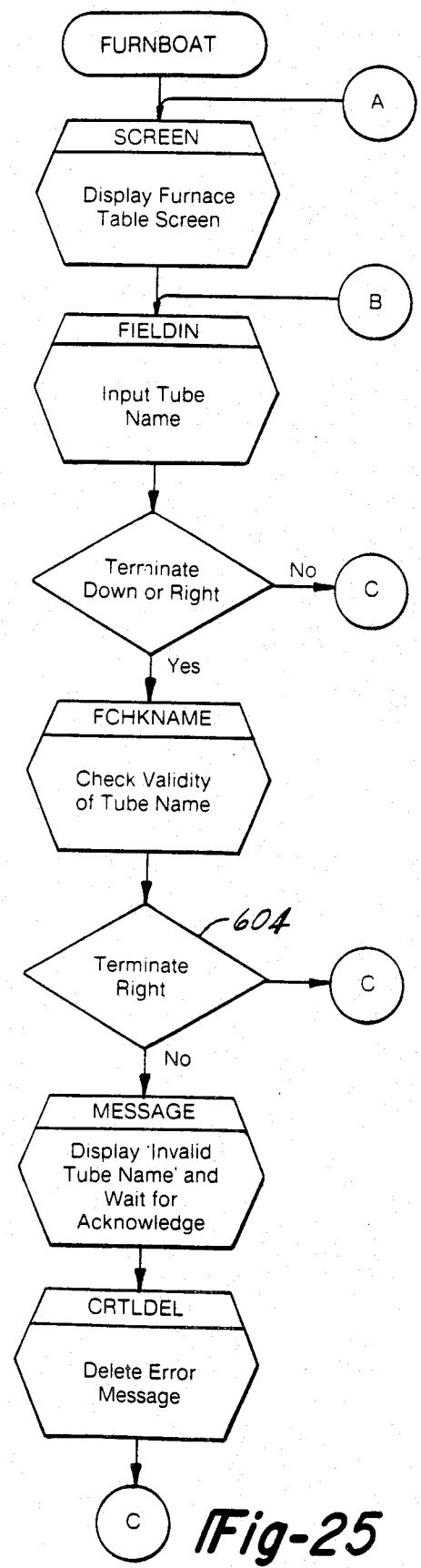
Figure 26:
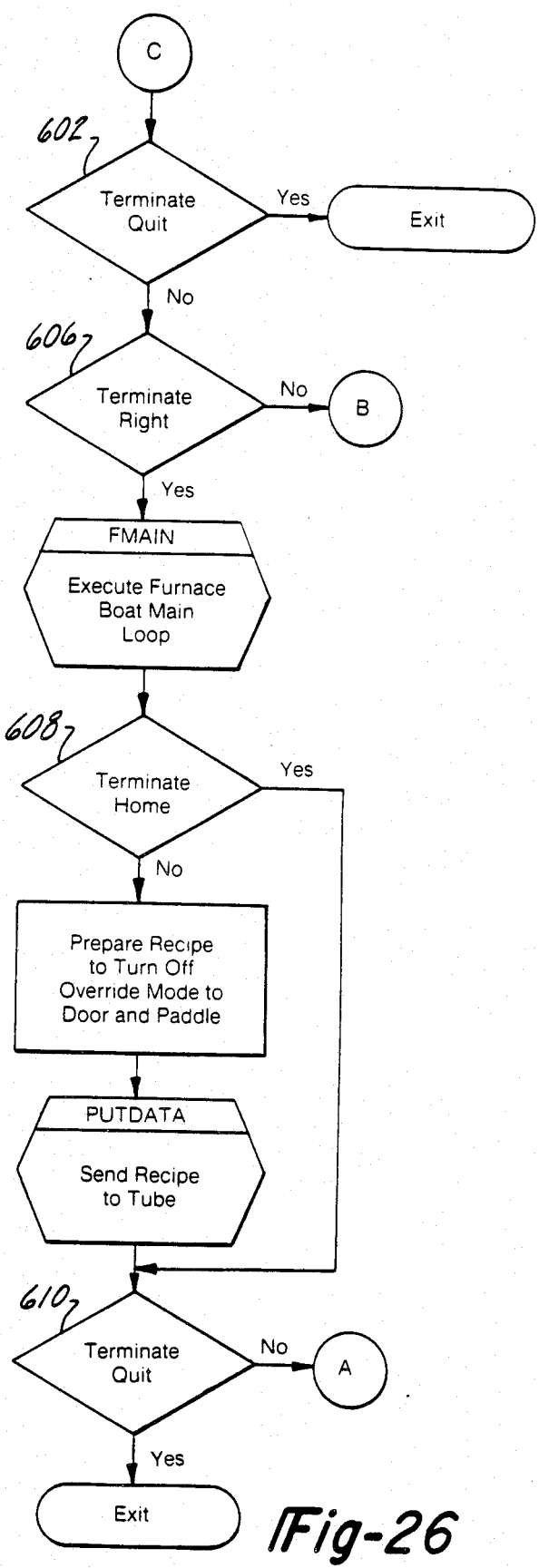

A primary program consisting of the "furnace boat main loop" is shown in FIGS. 27-43, however before entering this program, a "furnace boat initialization" program is completed which is depicted in FIGS. 25 and 26.

Referring first to FIG. 25, furnace boat initialization is commenced with a SCREEN subroutine in which the Furnace Table is displayed on the CRT screen. The tube identification or name is then input by the operator into the appropriate field (FIELDIN). If a tube name has not been input, control is transferred from decision block 600 to decision block 602 (FIG. 26). Assuming a tube name has been input, the tube name is checked against a memory stored table of names using a routine (FCHKNAME), the details of the which are shown in FIG. 5 and will be discussed later. If the tube name is valid, control is transferred from decision block 604 to decision block 602 (FIG. 26), however if the tube name is invalid, a MESSAGE routine causes an "invalid tube name" message to appear on the screen, and that message is then acknowledged, following which the operator deletes the message and the program continues at decision block 602 in FIG. 26.

At this point, the program determines whether the operator has attempted to terminate the procedure; if termination has been effected, the program is exited, otherwise a test is performed at 606 to determine whether a tube name has been input; if not, control is transferred to point B in FIG. 25, otherwise an FMAIN routine is entered which consists of the furnace boat main loop which will discussed shortly.

Once the furnace boat main loop is completed, a decision is made at 608 to determine whether the Furnace Table should be displayed again. Assuming the Furnace Table is not redisplayed, it is then necessary to prepare a recipe of instructions to assure that the door 82 and paddle 92 are in their proper positions before the initialization program is exited. This recipe is sent to the tube loader (PUTDATA), and a decision is made at 610 to determine whether the initialization editor should be exited; if not, the editor is reentered at point A.

After completing the furnace boat initialization with the editor shown in FIGS. 25 and 26, the furnace boat main loop program is entered, which is collectively shown in FIGS. 27-43. This program is entered by displaying and enabling a series of special function keys on the operator keyboard using a SCREEN routine at 612 in FIG. 27. The field number is then set to one which corresponds to the elevator load point in the Furnace Table.

Figure 44:
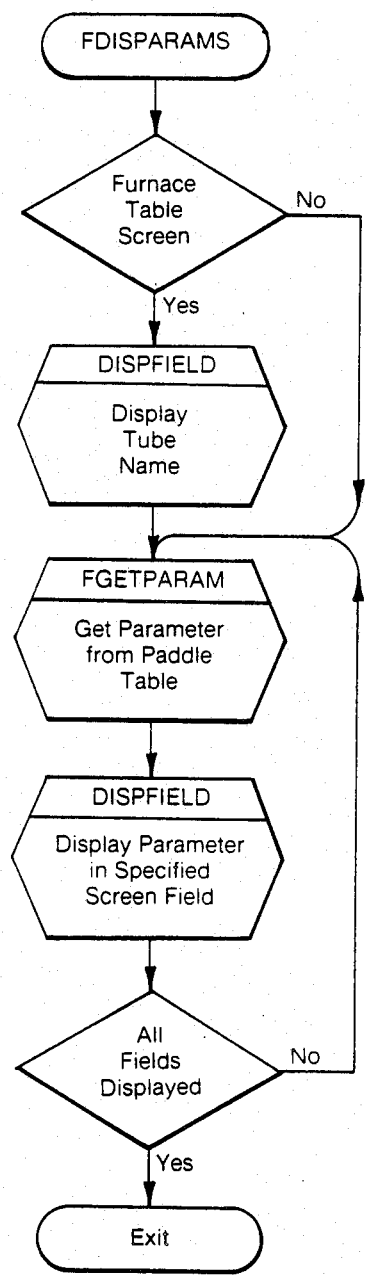

Having previously read in the tube names, a FDISPARAMS subroutine is performed for displaying the paddle table values; this routine is shown in more detail in FIG. 44 and will be discussed later. Having displayed these values, the selected parameter from the paddle table is set using an FGETPARAM subroutine which is shown in more detail in FIG. 57. The selected parameter is then input into the table by a FIELDIN subroutine. Next, a test is performed to determine whether the paddle field is loaded; if the field is not loaded the program is continued at point E in FIG. 28, otherwise a yes/no display value to an internal value (1/0) for subsequent computational purposes.

Continuing now with reference to FIG. 28, another test is performed at 614 to determine whether the "boat type" field in the boat table has been loaded; if so the display value is converted to an internal value. An assumption is made at 614 that the input is invalid for purposes which will become later apparent. Assuming the input is not blank and that the operator has not actuated one of the special function keys (see decision blocks 618 and 620) and an ICHECKNUMBER routine is entered which converts the ASCII input to an internal integer format. A check is then made at 622 to determine whether the primary reference point is equal to the secondary reference point. Ordinarily, these two parameters are not and should not be identical, however this check is made in order to assure that these parameters have not been initially set at the same value.

Figure 29:
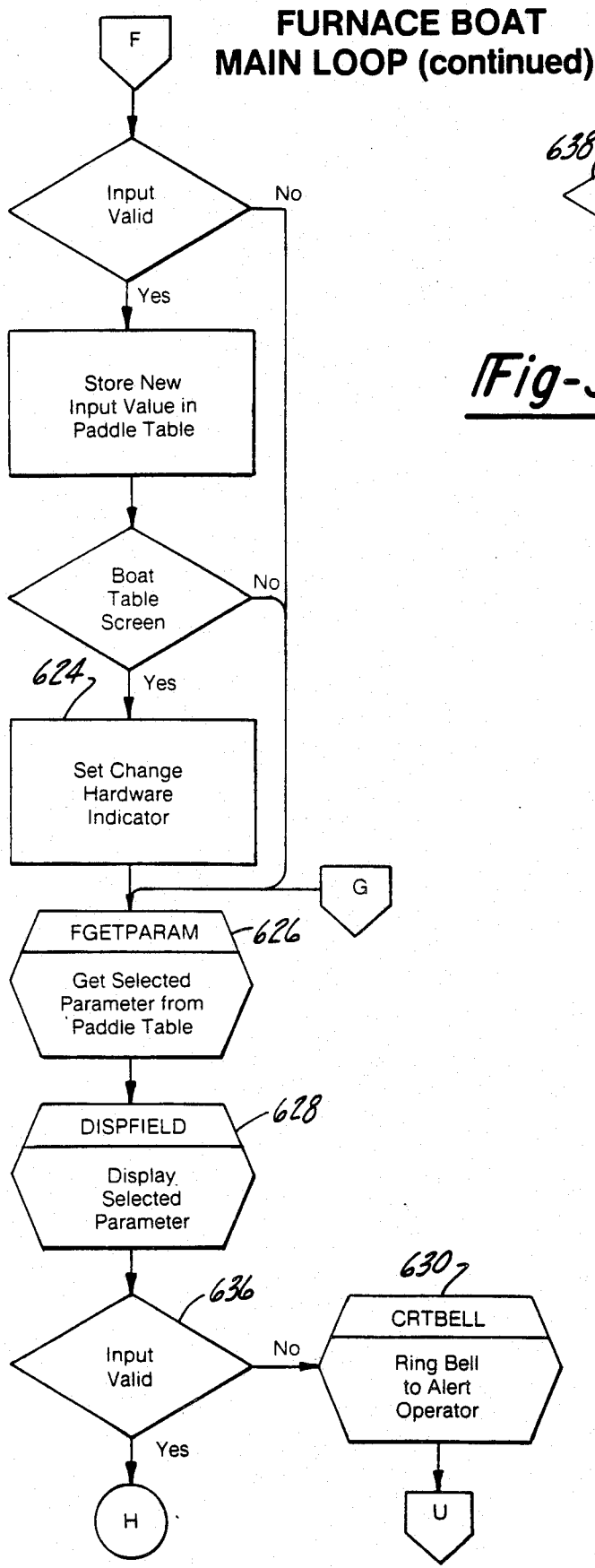

The main loop continues at point F in FIG. 29. If the input is valid, the input value is stored in the paddle table; this value is stored on a temporary basis in an internal memory, rather than on hard disc. If any of the parameters in the Boat Table have been altered, a change hardware indicator is set at 624. The selected parameter previously stored as an input value in paddle table is then retrieved at 626 and displayed at 628. If the input was invalid, the parameter displayed at 628 will be that previously stored in the paddle table. If the input value is invalid, a CRT bell is rung at 630 to alert the operator, and control is then transferred to point U (FIG. 43).

Figure 43:
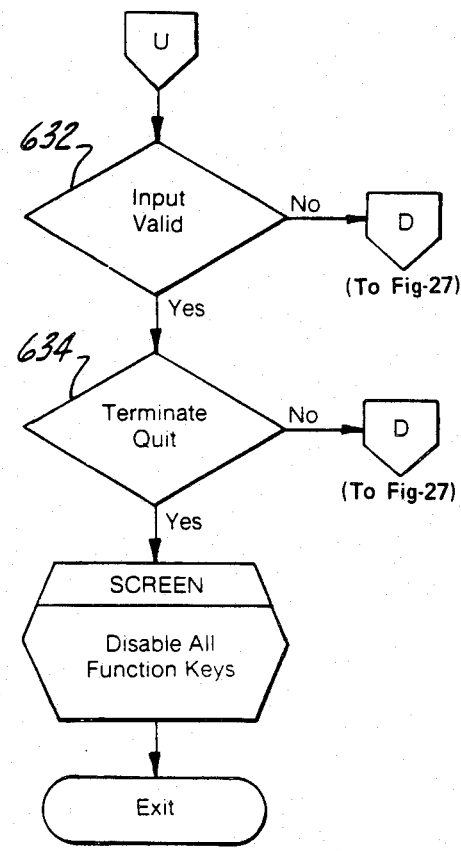

Referring momentarily now to FIG. 43, if the input value is not valid, then control is transferred to point D (FIG. 27), thereby requiring another input. If the input is determined to be valid at 632, a test is then made at 634 to determine whether the operator has attempted to terminate the procedure. If termination has been effected, the SCREEN routine disables all of the special function keys and the program is exited. However, if the operator has not terminated, control is transferred to the beginning of the loop at point D in FIG. 27.

Figure 30:
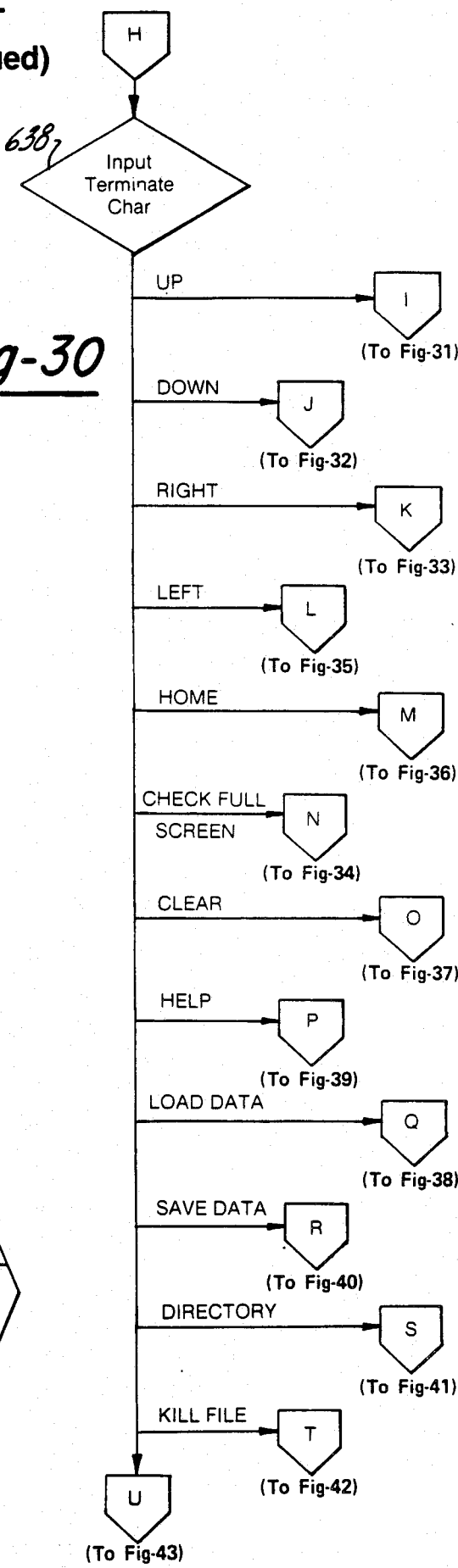

Referring now again to FIG. 29, if the input value was determined to be valid at 636, the program continues at point H in FIG. 30. After entering the input value, the operator also inputs a termination character. The termination character results in switching of the program to a number of branches at a switch point 638, in accordance with the identity of the termination character. Each possible termination character and the corresponding branch point in the flow chart is shown in FIG. 30, and each of these branch points will now be discussed.

As shown in FIG. 31, the "up" character sets the field number to the previous field in the same column, and control is then transferred to point U in FIG. 43.

The "down" character results in setting the field number to the next field in the same column, as shown in FIG. 32.

As shown in FIG. 33, the "right" results in setting the field number to the next field to the right or down. Similarly, as shown in FIG. 35, the "left" character results in setting the field number to the previous field to the left or upwardly in the same column.

The "check full screen" character results in setting a "need full screen" flag in FIG. 34 under certain conditions. If this flag is not set, the information on the screen is not changed, but rather an error message on the bottom line of the screen deleted. If the full screen is needed, the selected screen is output at 640. The FDISPARAMS procedure is called to display all of the paddle table values for the selected screen. The internal flag is then reset at 642 and control is transferred to point U in FIG. 43.

The "HOME" character results in the output of the selected screen, in FIG. 36, following which the display parameter routine is called to display the paddle table values that apply to the selected screen. Next, the cursor is initialized to the first input field in that screen. Thus, in effect, the cursor address is returned to a home position at the first input field.

Figure 37:
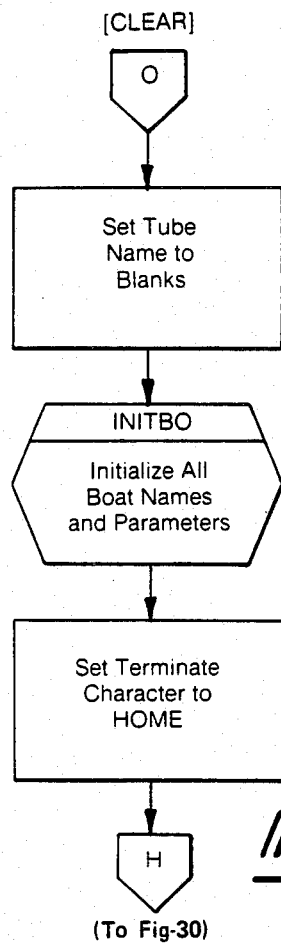

As shown in FIG. 37, the "CLEAR" termination character results in the tube or file name being set to blank. An INITBφ routine is then called to initialize all of the internal boat names and parameters; this means that the files are cleared and new names and parameters are entered. The terminate character is then set to home at 644 to utilize the preexiting code, and control is transferred to point H (FIG. 30).

Figure 39:
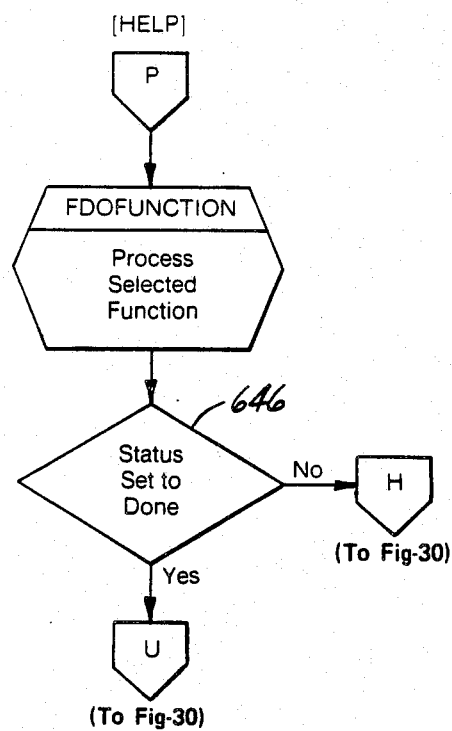

If the input is terminated in a "HELP" character, control is transferred to point P in FIG. 39. The "HELP" character corresponds to one of the special function keys and results in calling up an FDOFUNCTION routine; this routine determines which of the function keys is selected and carries out the associated commands accordingly. A check is made at 246 to determine whether the set status has been set to done; if so, control is transferred to point U in FIG. 43, otherwise control is transferred to point H in FIG. 30.

Figure 38:
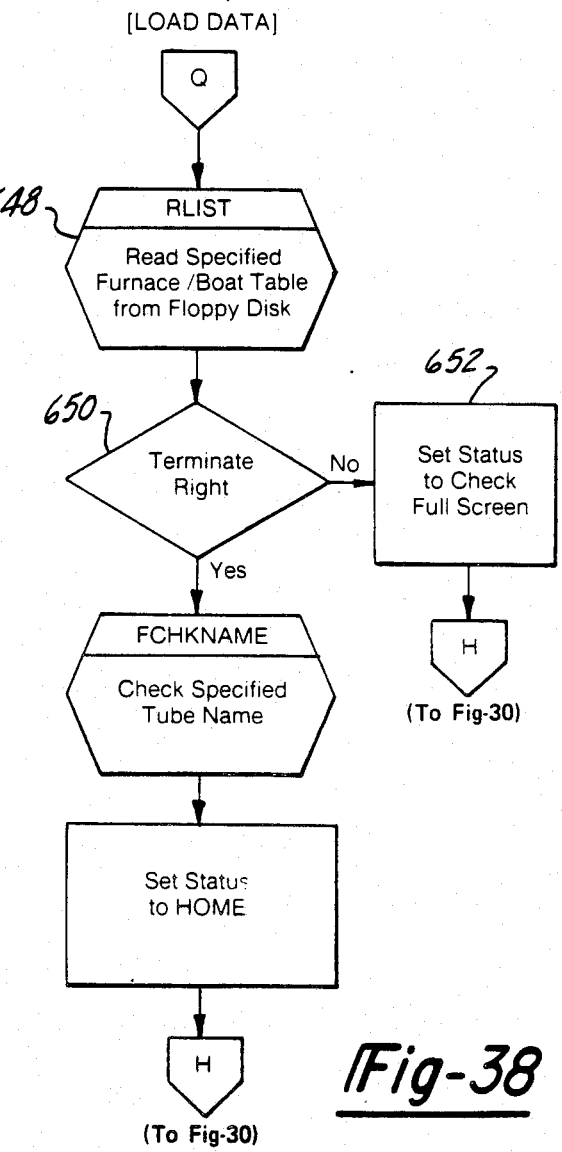

The "load data" termination character in FIG. 30 transfers control to point Q in FIG. 38 where the specified furnace/boat table data is read from disk memory at 648. A check is then made at 650 to determine whether the termination character was entered, and if it was entered, the specified tube name is then checked to verify its validity, following which the status is set to home. Subsequently, control is returned to point H in FIG. 30. In the event that the operator loaded in data but did not enter a termination character, the status is set to check full screen at 652, and control is returned to the switch point 683 in FIG. 30.

Figures 40, 41:
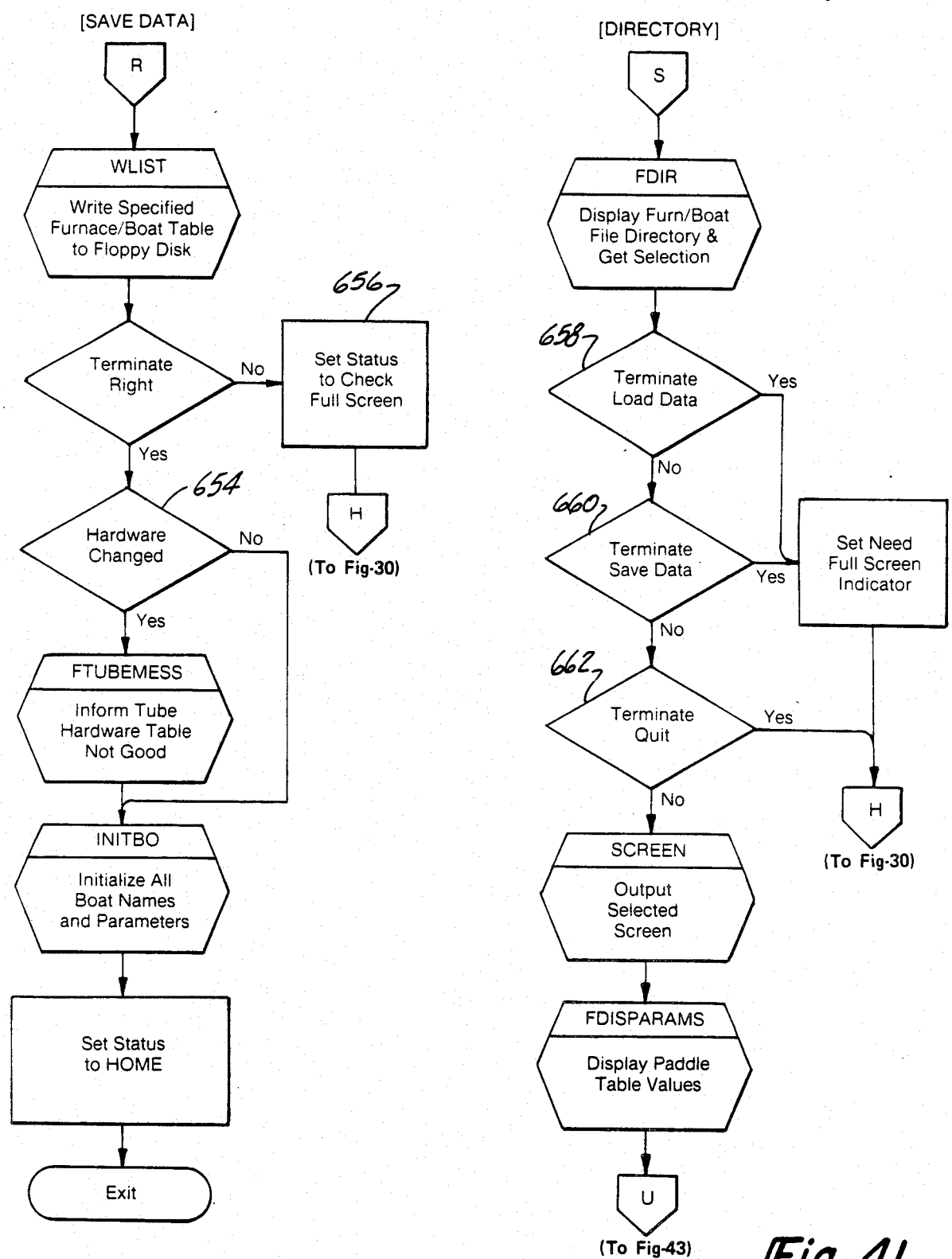

Returning to FIG. 30, the "save data" character results in writing specified furnace/boat table data to the disk memory as indicated in FIG. 40. If the proper termination character is made, a test is made at 654 to determine whether any of the hardware has been changed. If the Boat Table has been changed, indicating a change in hardware, an FTUBEMESS procedure is performed in which a message is output to the operator which informs him that the hardware table is not good and must be changed. If the table does not change, the FTUBEMESS procedure is circumvented. Next, the INITBO procedure is recalled to initialize all of the boat names and parameters, following which the status is set to home and the program is exited. Digressing a moment, if a different termination character was selected, the status is set to check full screen at 656 and control is transferred to the switch point 638 in FIG. 30.

Selection of the "directory" termination character shown in FIG. 30 transfers control to point S in FIG. 31 in order to display a list of all the file names which exist for the furnace-boat tables; in other words, the set of names stored on disk memory is displayed. With a list of the names displayed, the operator then selects one of the names and terminates that selection in a character. A check is then made at 658 and 660 to determine whether the termination character was a "load data" or a "save data". If either of these latter decisions are positive, a flag is set indicating a full screen is needed and control is transferred back to the switch point 68 in FIG. 30.

A check is also made 662 to determine whether termination character was a "quit" and if so control is transferred back to the switch point 638 in FIG. 30, otherwise the screen procedure is called and the selected screen is output, whereupon the paddle table values are displayed and control is then transferred to point U in FIG. 43.

Figure 42:
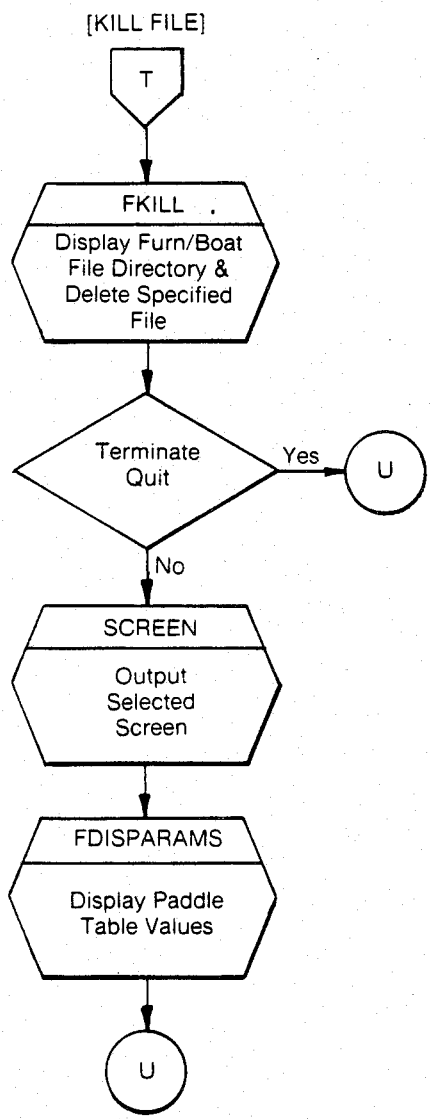

Returning to FIG. 30, the "kill file" termination character results in calling up an FKILL routine in FIG. 42, which results in displaying the furnace/boat file directory and deleting a file specified by the operator. If the termination character was "quit", control is transferred to point U in FIG. 43, otherwise the originally selected screen is displayed as well as the paddle values corresponding to the that screen, before control is transferred to point U in FIG. 43.

Figure 45:
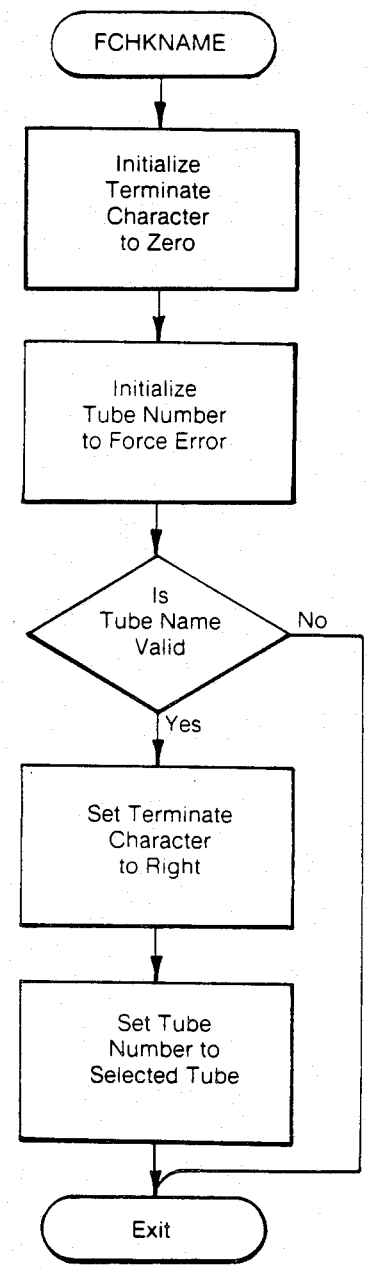

This completes the description of the main loop, and several of the routines forming part of the main loop or the initialization program previously discussed will now be described in more detail. As previously indicated with reference to FIG. 5, the FCHKNAME routine is employed to check the validity of a tube name. The details of this routine are depicted in FIG. 45. Referring now to FIG. 45, the termination character is initialized to zero following which the tube number is initialized in order force an error. The tube name is then checked to determine whether it is valid; if not, the program is exited since a flag to this effect has already been set, otherwise the terminate character is set to the right and the tube number is set to the selected tube.

Referring to FIG. 27, the FDISPARAMS routine is employed to display paddle table values is previously mentioned. The details of this particular routine are depicted in FIG. 44. Referring now to FIG. 44, a check is made to determine whether the furnace table screen is called up, following which the tube name is displayed and the parameters are retrieved from the paddle table, corresponding to the particular screen. The parameters are displayed one at a time through a loop, and until all the fields are displayed, whereupon the routine is exited.

Figure 57:
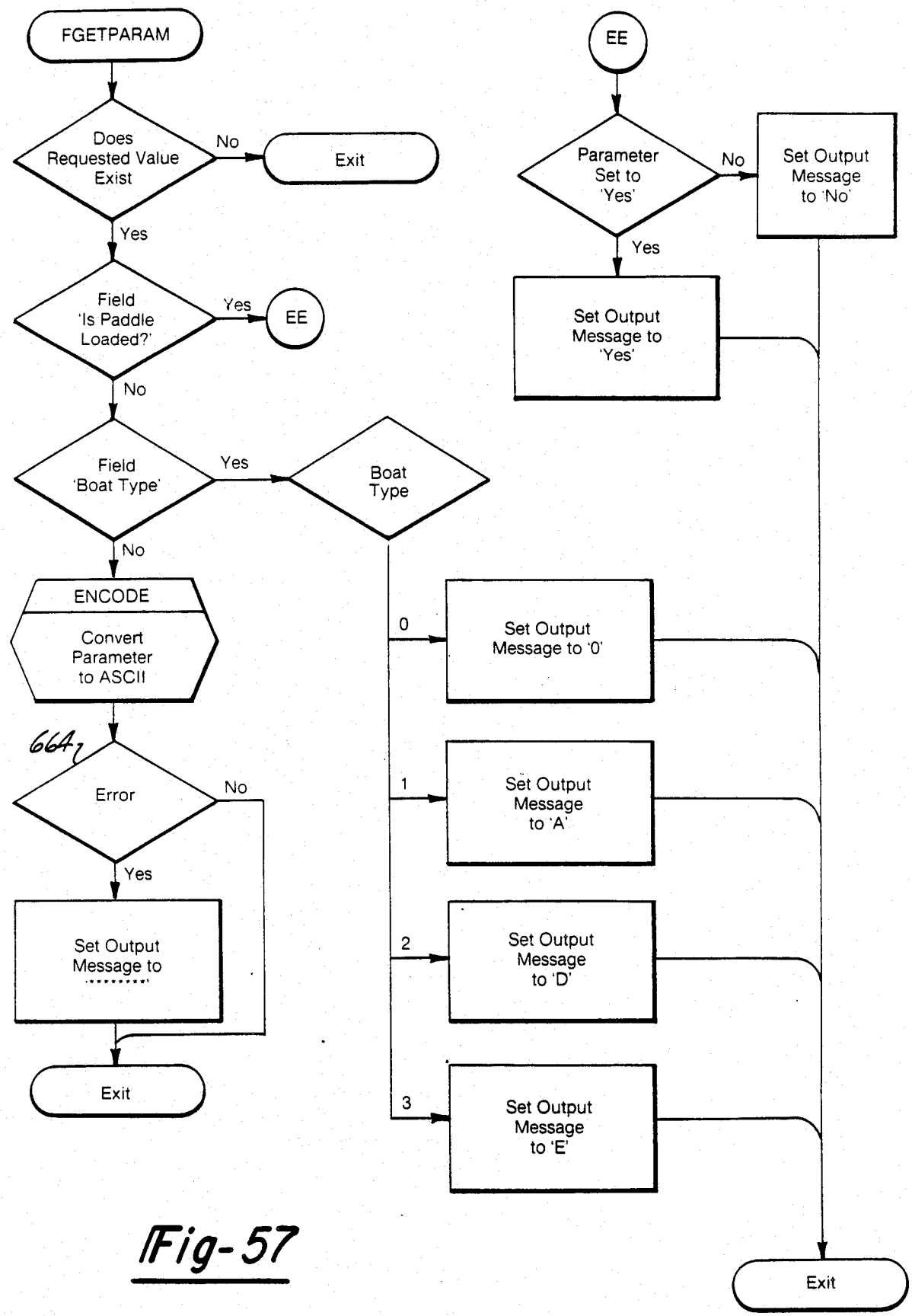

The FGETPARAM routine employed in the main loop (FIG. 27) is shown in more detail in FIG. 57. The first step in this routine consists of determining whether the requested value exists; if it does not, the routine is exited otherwise a check is made to determine whether the field is the "is paddle loaded?". If this field is confirmed, control is transferred to EE, otherwise a second check is made to determine whether the field is "boat type". If the field was "is paddle loaded?", a check is made to determine whether the parameter was set to "Yes"; if so then the output message is set to "yes" otherwise the message is set to "no" and the routine is exited. If the field is "boat type", the internal number used to designate the type is converted to a letter which is then displayed as a message to the operator. If the field is not "boat type", the parameter is internally encoded to ASCII for display purposes. A check is then made at 664 to determine whether an error was made in the encoding. If no error is present, the routine is exited, otherwise an error message is displayed to the operator.

Figures 65, 66:
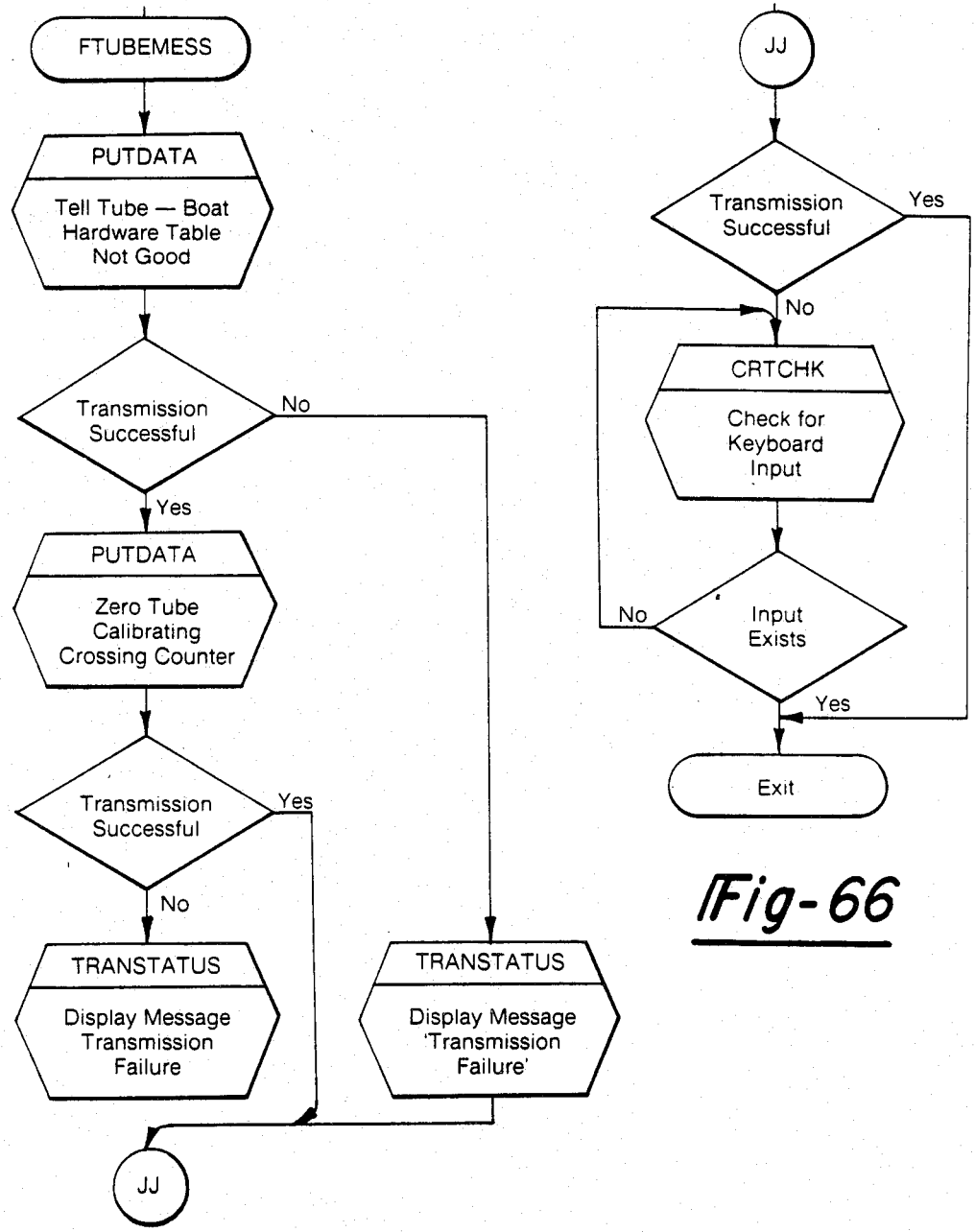
Figure 67:
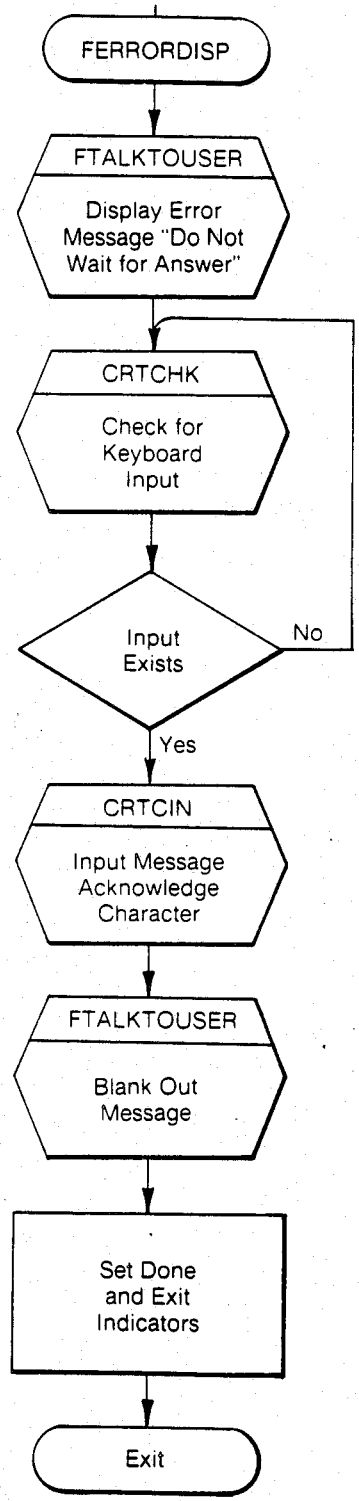
Figure 68:
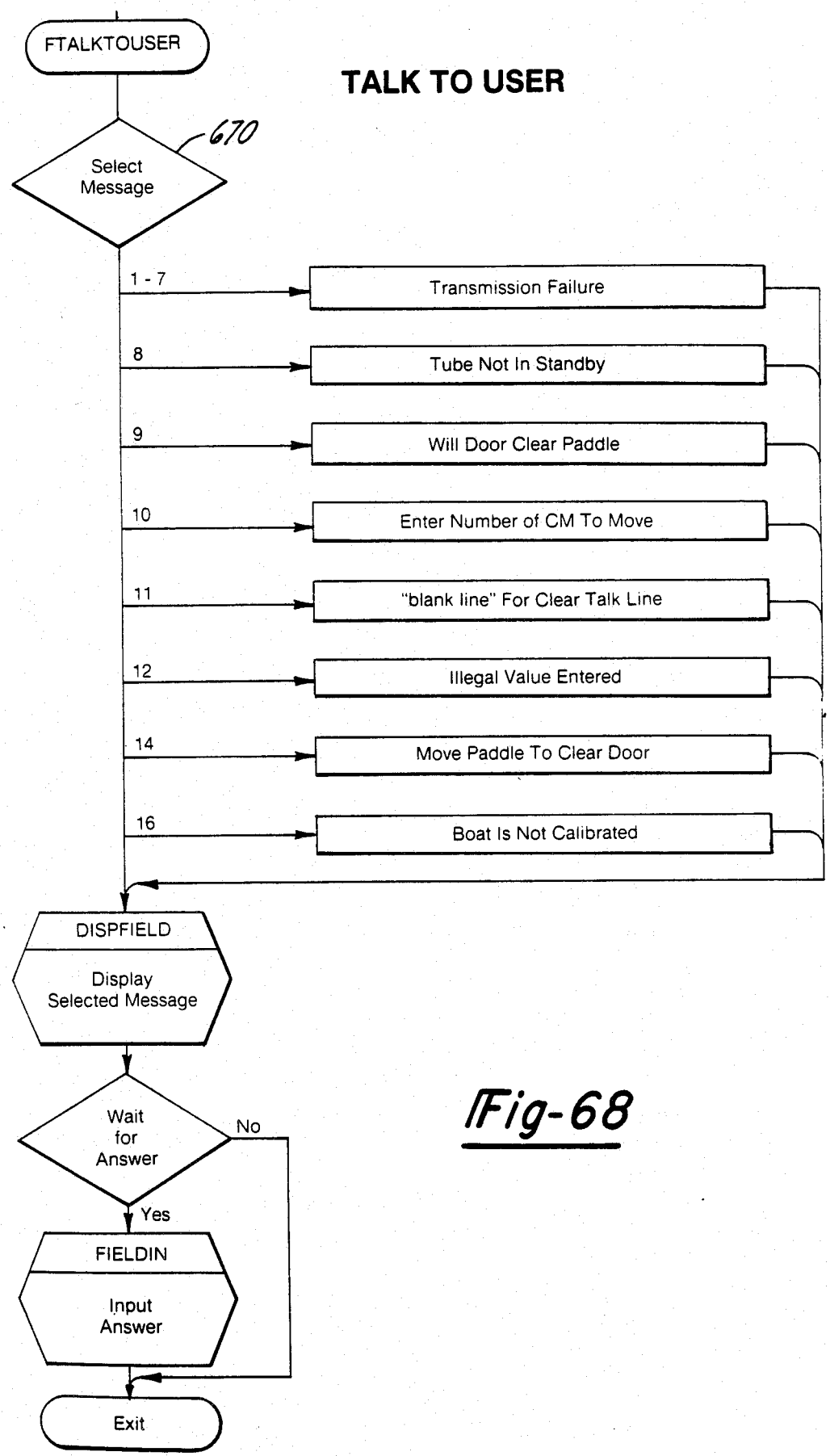

As previously discussed with reference to FIG. 40, an FTUBEMESS routine is employed in the main loop to inform the operator that the tube hardware table is not good. The details of this particular routine are shown in FIGS. 65 and 66. Referring first to FIG. 65, the first step involves telling the tube that the boat hardware has been changed and that the boat table is therefore not good. A check is then made to determine whether the transmission was successful and if it not successful, a transmission failure message is displayed. Assuming that the transmission was successful, data is sent out for calibrating the tube crossing counter and a subsequent check is made to assure that this transmission was successful. Referring to FIG. 66, another check is made to assure that the transmission was successful and if so, the routine is exited, otherwise a check is made for keyboard input, i.e. the routine waits for an input from the operator and the program remains at this point until the input is received at which time it is exited.

Figure 46:
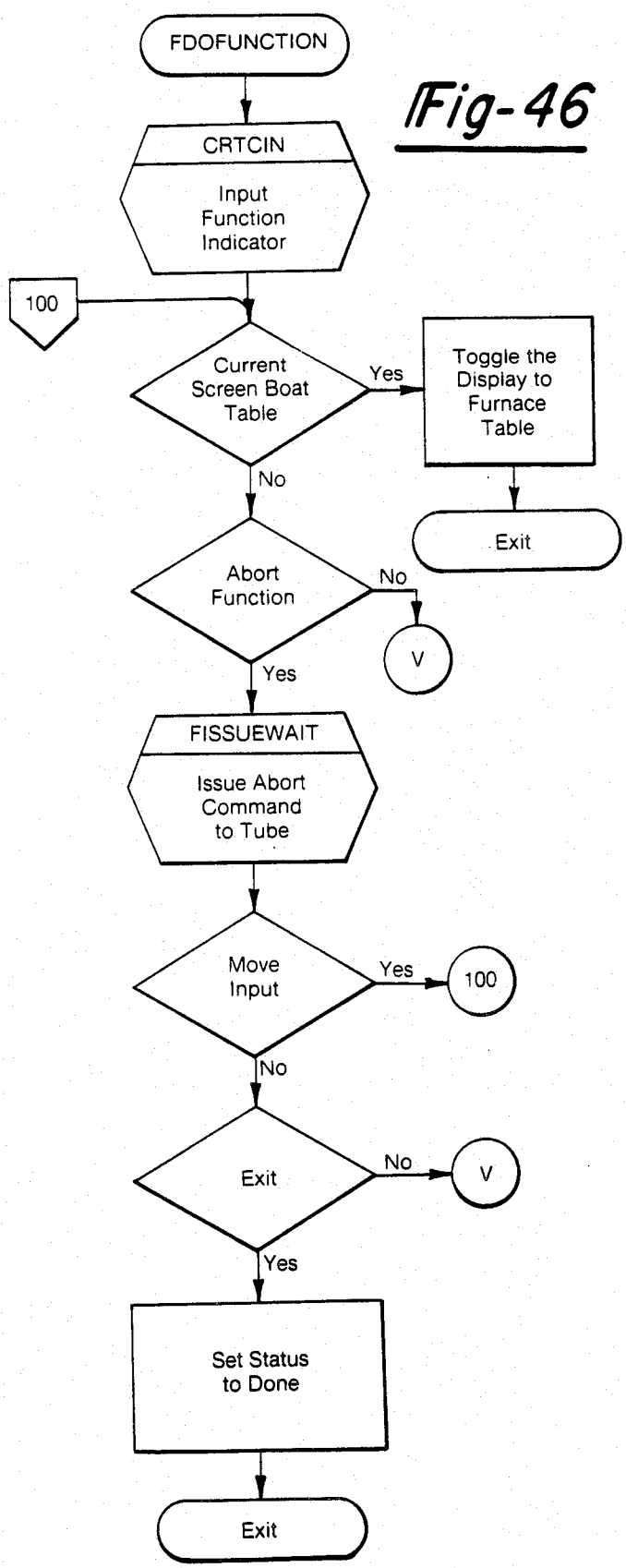
Figure 47:
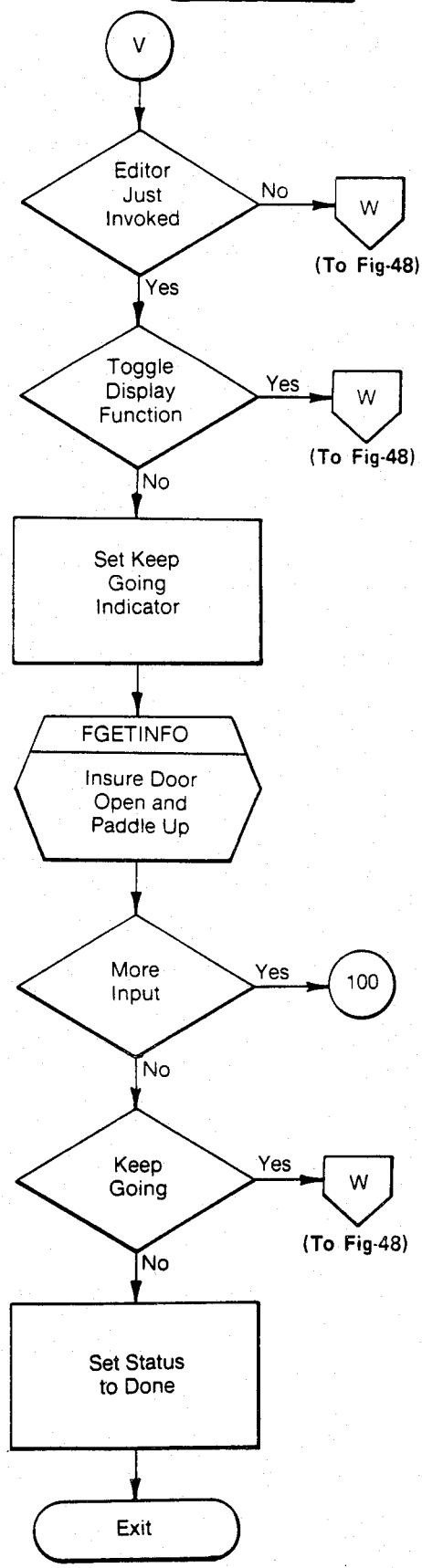

Finally, a routine forming part of the main loop previously described as FDOFUNCTION (FIG. 39) is shown in more detail FIGS. 46 and 47. This routine waits for an input from the operator indicating the function to be performed, i.e. a query is made to determine which of the special function keys has been actuated by the operator. If the current screen is the boat table, the display is toggled to the Furnace Table and the routine is exited. If the current screen is the Furnace Table a check is made to determine whether it is the abort function; if not, control is transferred to point V in FIG. 47, otherwise an abort command is issued to the tube. A check is then made to determine whether more data has been input and if so control is transferred to point 100, otherwise a check is made to determine whether the program has been exited. If it has not been exited, control is transferred to point V in FIG. 47, otherwise the status is set to done and the routine is exited.

Figure 48:
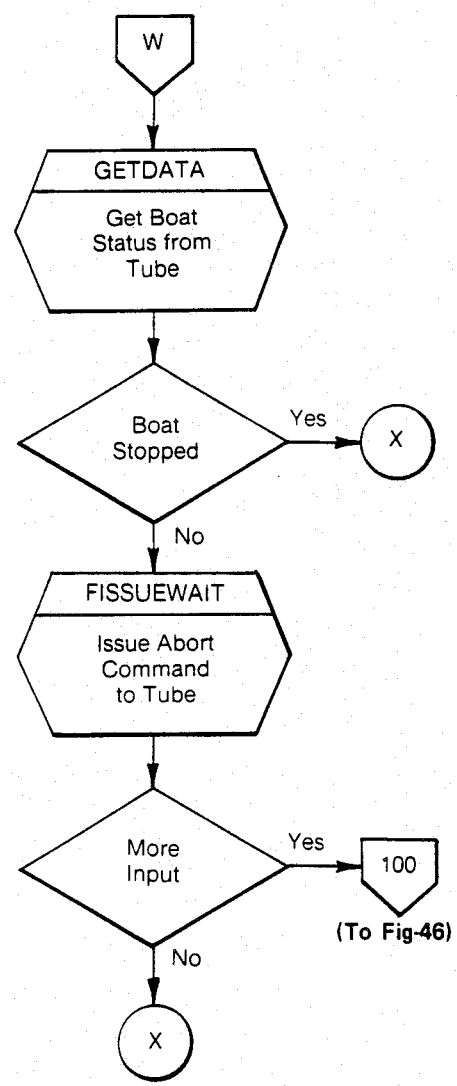
Figure 49:
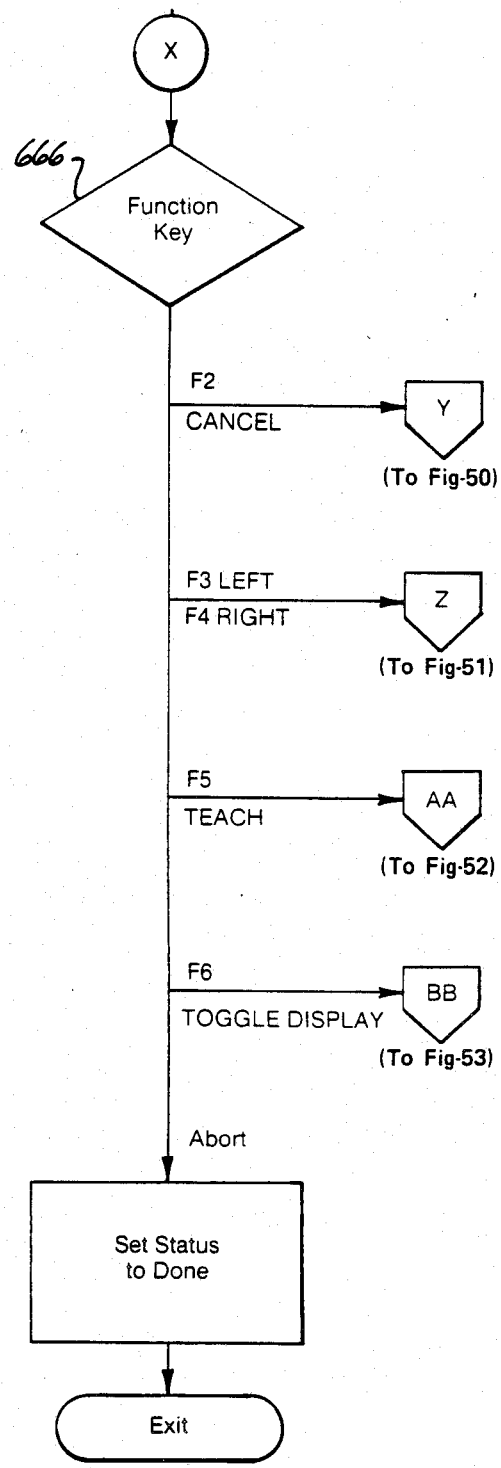
Figure 50:
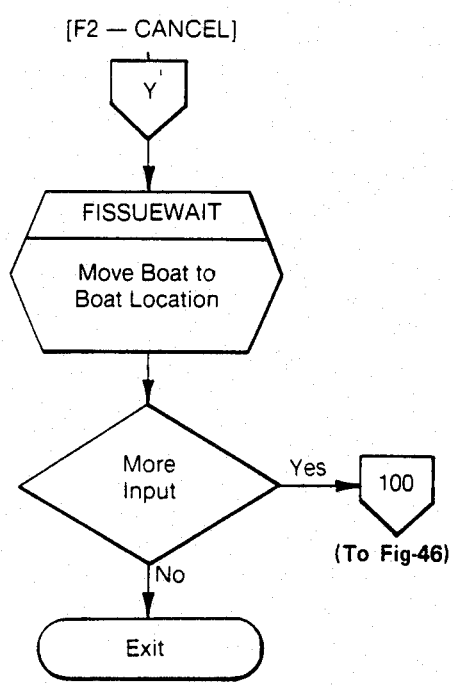

Referring to FIG. 47, a check is made to determine whether the editor has been invoked and if it has not, control is transferred to point W in FIG. 48. A check is then made to determine whether the editor is the toggle display function, and if so, control is transferred to point W in FIG. 48. If the decision "no" a "keep going" flag is set and a FGETINFO procedure is called to ensure that the door is open and the paddle is up. A request is then made for more input and if more input is received, control is transferred to point 100 (FIG. 46), otherwise the "keep going flag" is checked. If flag is in fact set, control is transferred to point W (FIG. 48) otherwise the status is set to "done" and the routine is exited.

Referring now to FIG. 48, the GETDATA routine is called to retrieve the boat status from the tube and a check is then made to determine whether the boat is stopped. If the boat is stopped, control is transferred to point X (FIG. 49), otherwise the FISSUEWAT routine is called in order to issue an abort command to the tube. A determination is made of whether there is an additional input; if so, control is transferred to point 100 (FIG. 46) otherwise control is transferred to point X in FIG. 49.

A function key switch 666 determines which additional routines are called in response to selection of a particular function key (F2-F6). In the event that the function key was an abort (F1), the status is set to done and the routine is exited. If the function is not "abort" then one of the following function routines is selected: "cancel", "left/right", "teach" and "toggle display". These routines are respectively shown in FIGS. 50-53 and are fully self explanatory. However it is to noted that in FIG. 52 actuation of the teach function key results in calling an FTEACHFIELD routine which causes the current value of the selected field to be displayed.

Referring now again to FIG. 46, the FISSUEWAT procedure is employed to issue an abort command to the tube. The details of this particular procedure are set out in the detailed flow chart shown in FIGS. 61-64 and again, these detailed flow charts are clearly self explanatory to one skilled in the art and therefore need be specifically discussed. It should be noted, however, that this routine results in the display of the following current values in the Furnace Table: "current position", "set position", "set door state" and "cam state".

Figure 54:
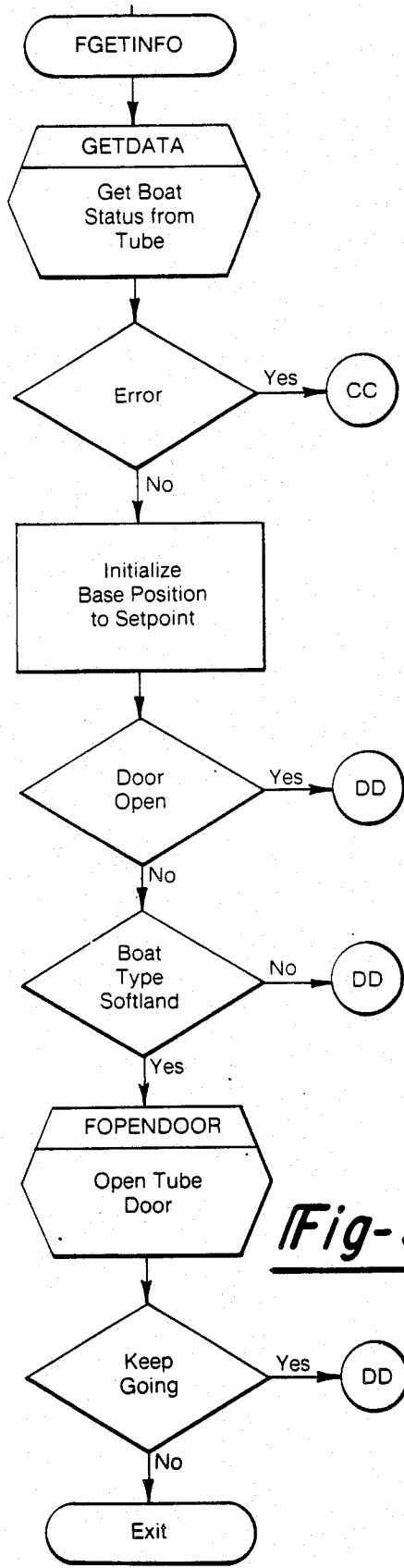
Figure 55:
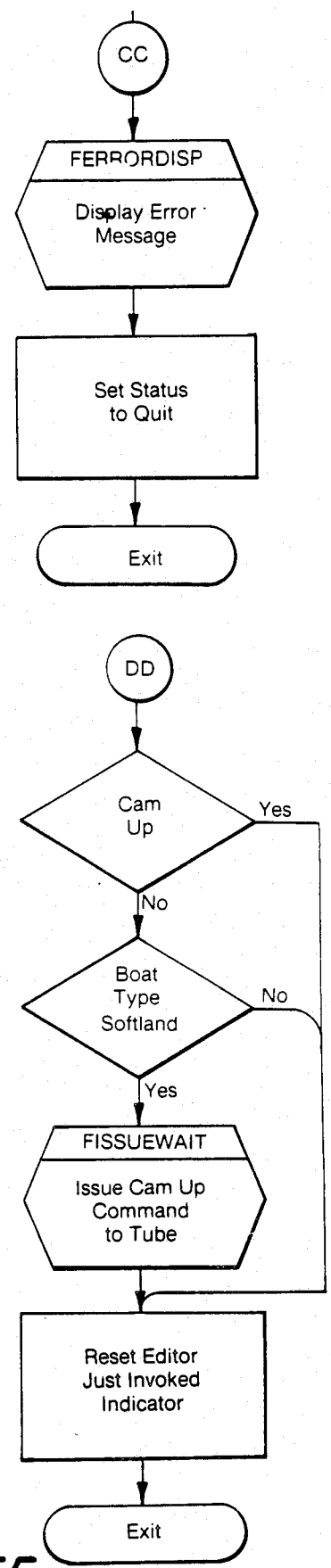

Returning now to FIG. 47, it will be recalled that the FGETINFO procedure was called to insure that the door is open and paddle is up. The details of this particular procedure are shown in FIGS. 54 and 55 which are thoroughly self explanatory and therefore need not be specifically described herein.

Figure 51:
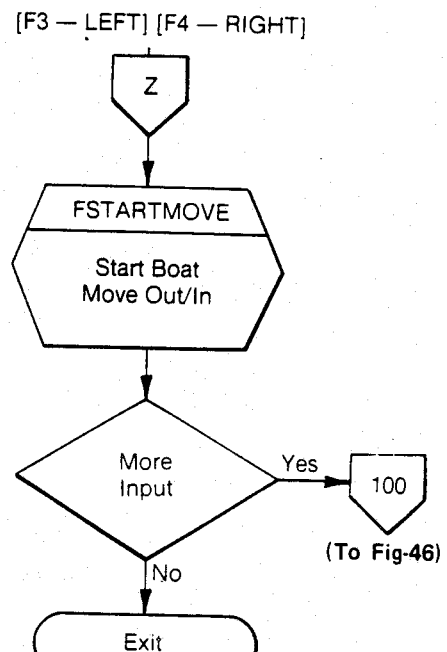
Figures 58, 59:
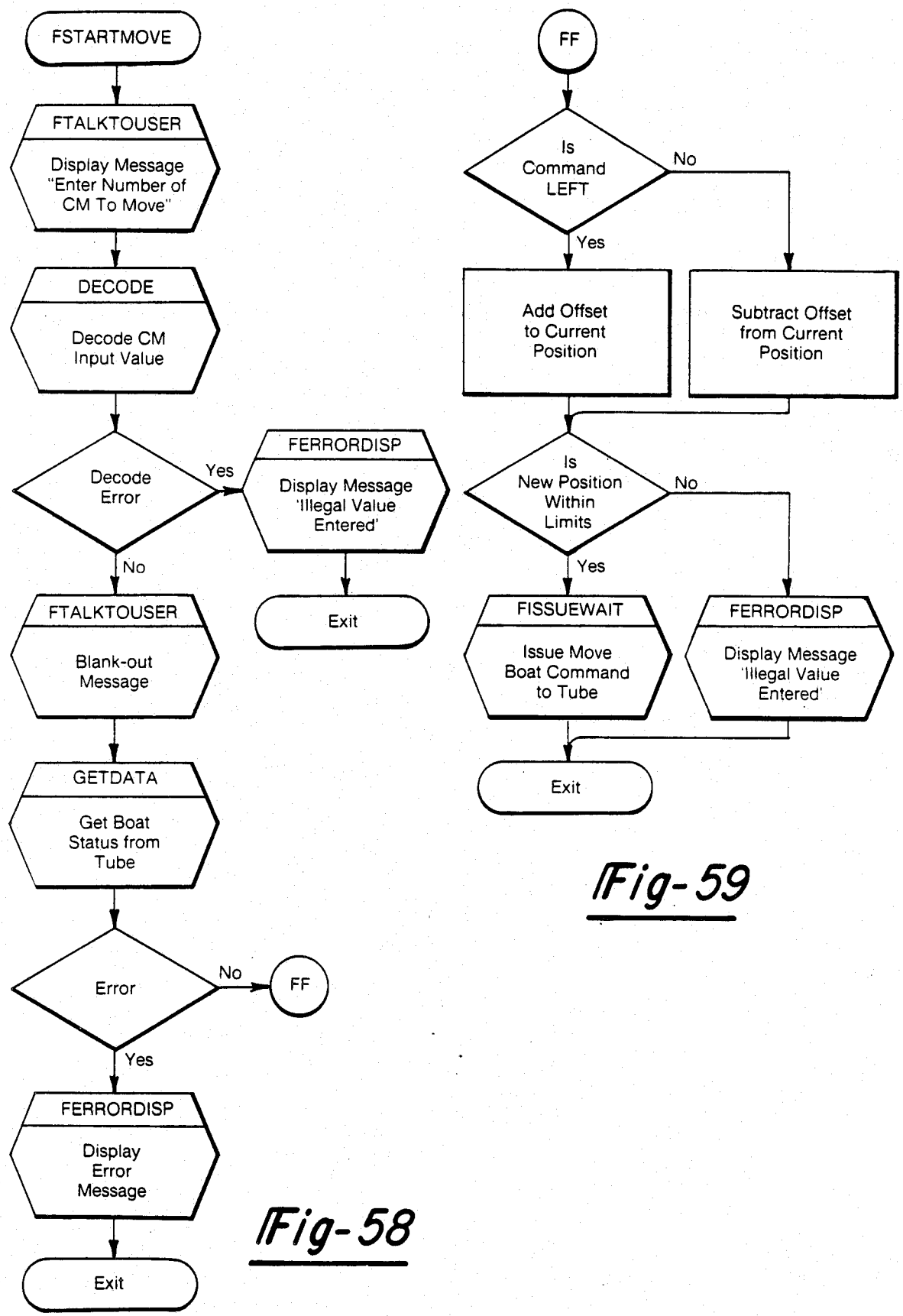

Similarly the FSTARTMOVE procedure referenced in FIG. 51 is shown in more detail in the self explanatory FIGS. 58 and 59.

Figure 52:
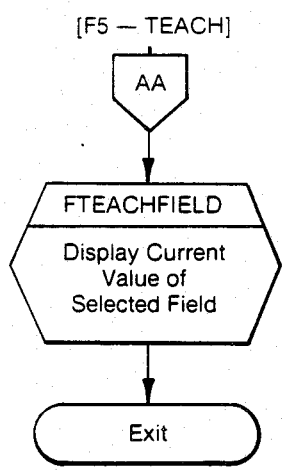
Figure 53:
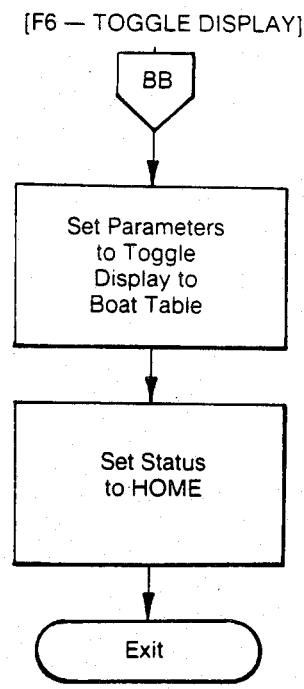
Figure 56:
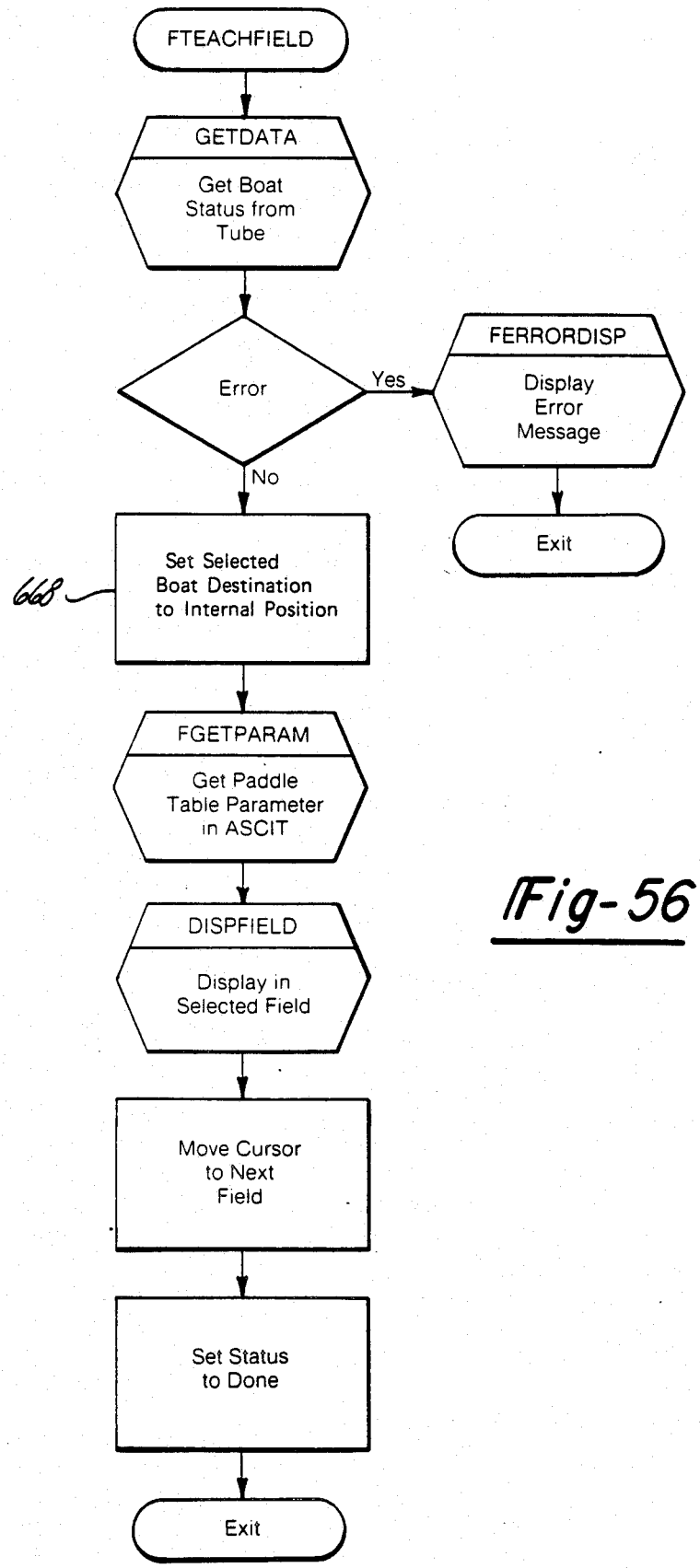

The details of the FTEACHFIELD procedure mentioned in FIG. 52, are shown in FIG. 56. The first step in this procedure consists of getting the boat status from the tube. A check is then made to determine whether an error has been made in the boat status, and if an error is found it is displayed as an error message and the procedure is exited. However, if the is no error, the selected boat destination is set to an internal value at 668. The FGETPARAM procedure is then called to get the paddle table (ASCII), following which the DISP-FIELD procedure is used to display that parameter in the selected field. The cursor is then moved to the next field of the Furnace Table screen and the status is set to done, whereupon the routine is exited.

This completes the description of the flow chart with respect to the self-teach method. Having started in the main loop the operator has selected the position of the boat and has selected the particular parameter he wants to "teach" from the Furnace Table, and he has also moved the boat to the desired position for that parameter following which the "teach" function key was actuated.

In summary form, the self-teach method comprises the following steps:
(a) placing one or more of the boats on the paddle;
(b) selecting a first paddle location along its path of travel outside the furnace where the boats are to be loaded onto and removed from the paddle;
(c) moving the paddle along its path to the first seleted location;
(d) generating a set of data uniquely identifying the first selected location;
(e) storing the first set of data in memory;
(f) selecting a second location along the paddle's path of travel inside the furnace which is related to a position where the boats are to be deposited in and picked up from the furnace;
(g) moving the paddle along its path to the second selected location;
(h) generating a second set of data representing the second selected location;
(j) storing the second set of data in memory; then, after completing steps (a) through (i);
(j) retrieving the first and second sets of data from memory; and
(k) automatically controlling the motor which drives the paddle along its path to effect movement of the paddle to the first and second selected locations in accordance with the data retrieved from memory.

The paddle is preferably moved along its path during the self-teach sequence by manually energizing the paddle driving motor. First and second sets of information relating to the first and second selected paddle locations are displayed to the operator. Additionally, the method includes the step of calibrating the movement of the paddle along its path with the operation of the paddle driving motor by moving the paddle past first and second reference locations along its path, sensing the presence of the paddle location at these locations and then correlating the distance between the reference locations with the operation of the motor.

Figure 60:
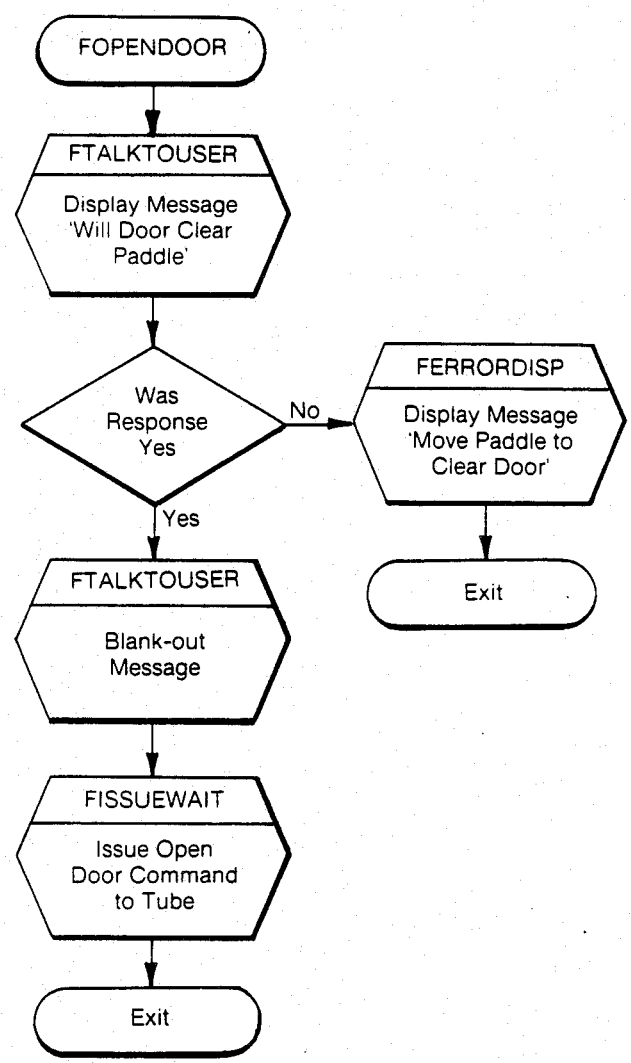
Figure 61:
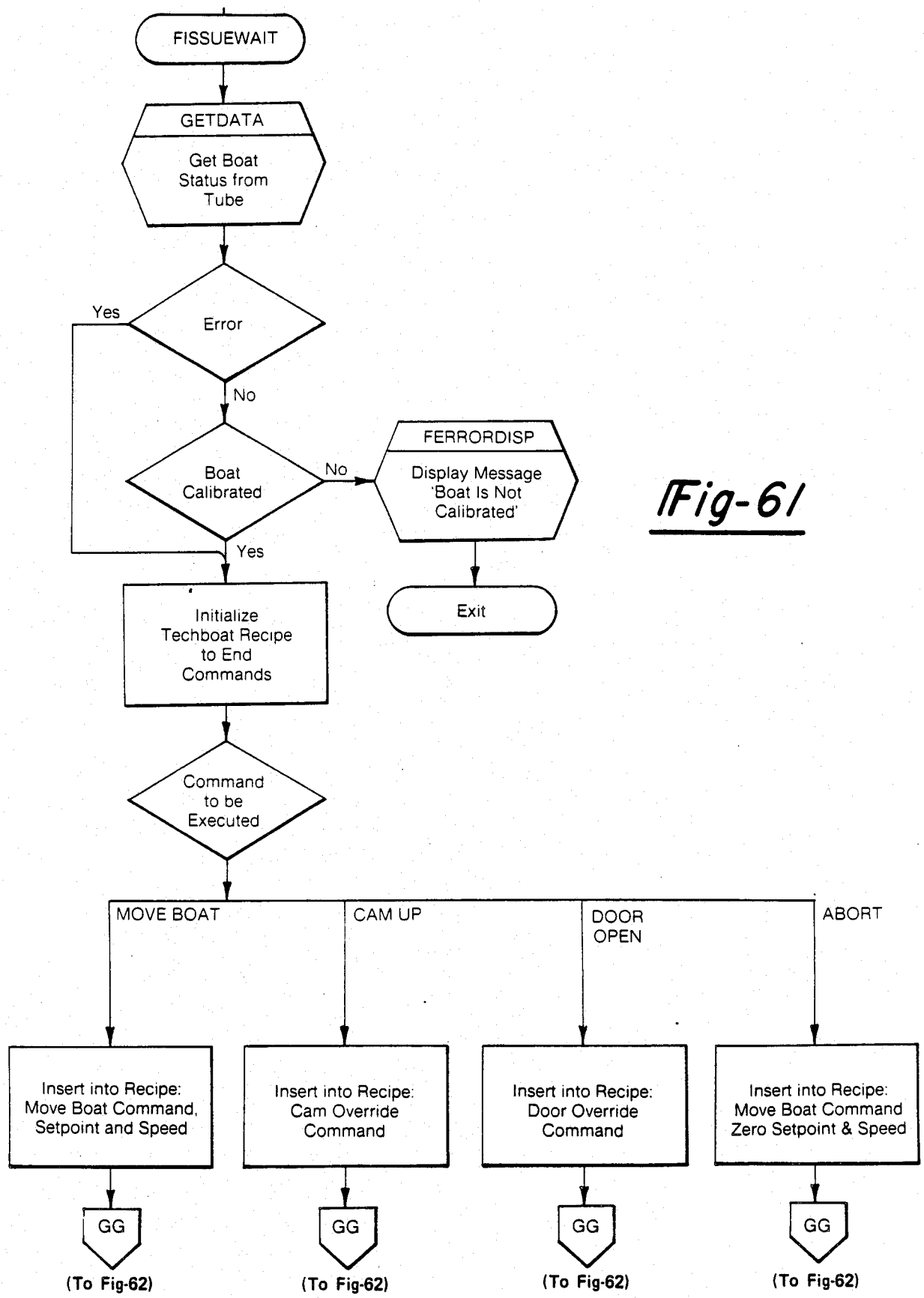
Figure 62:
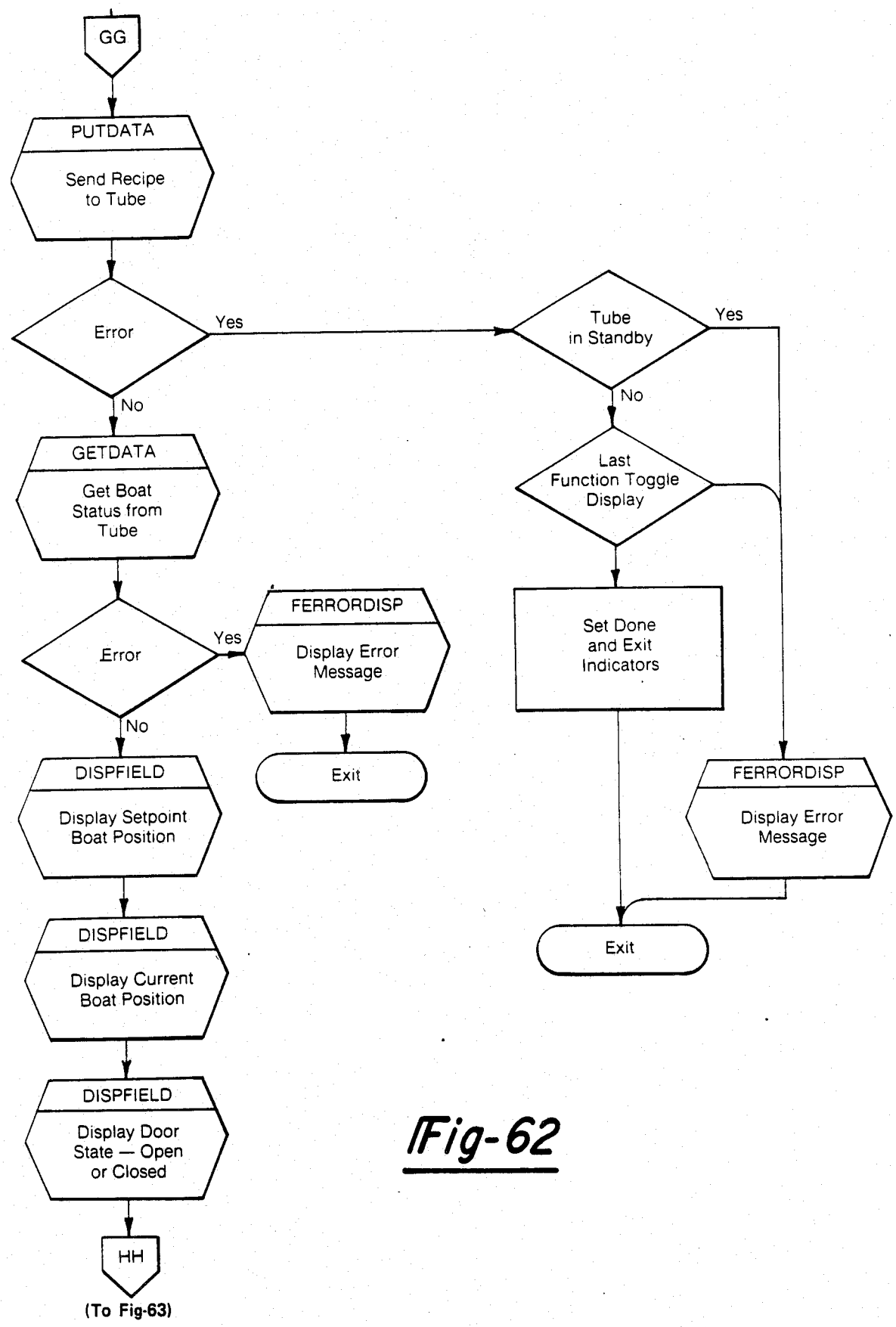
Figure 63:
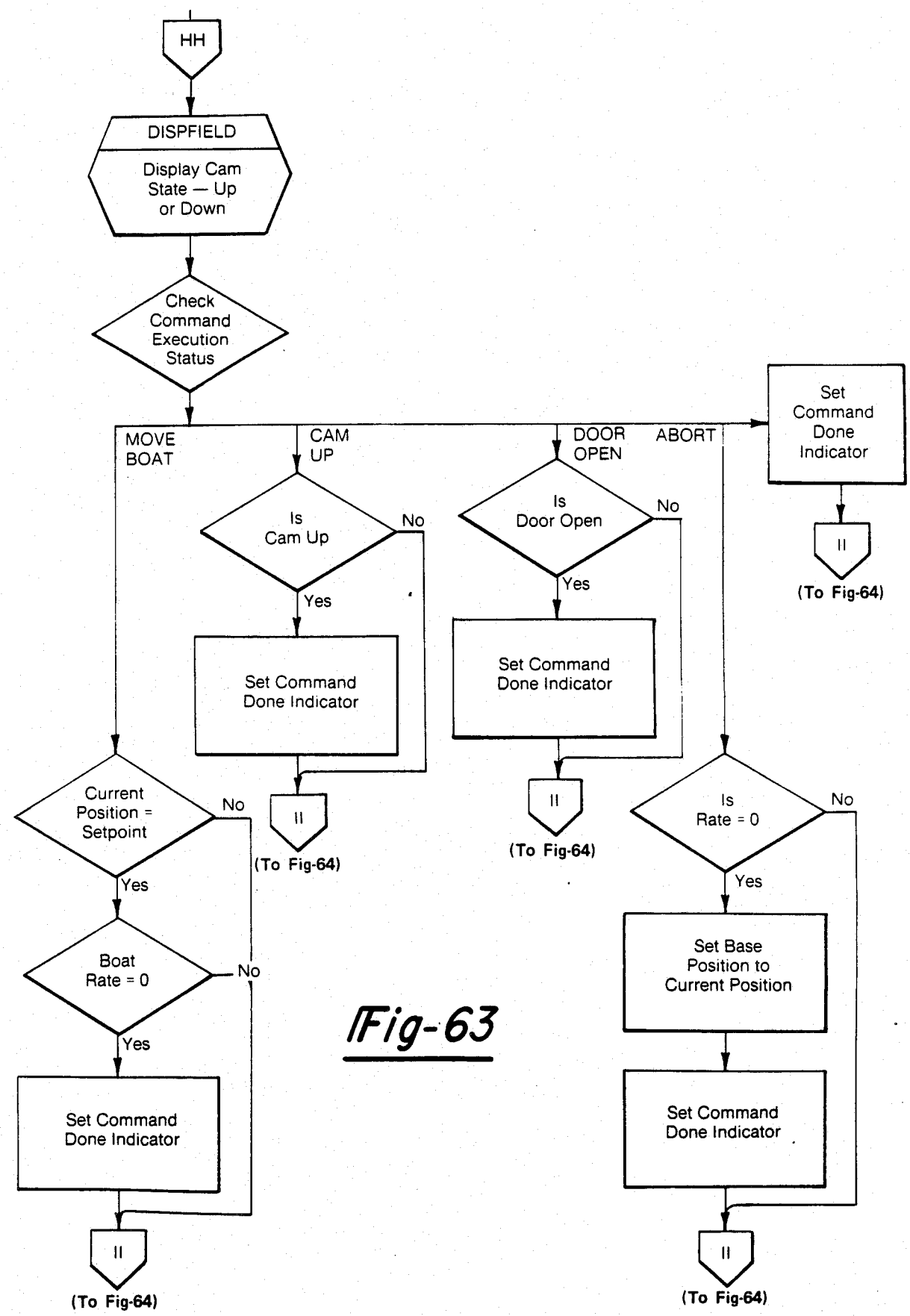
Figure 64:
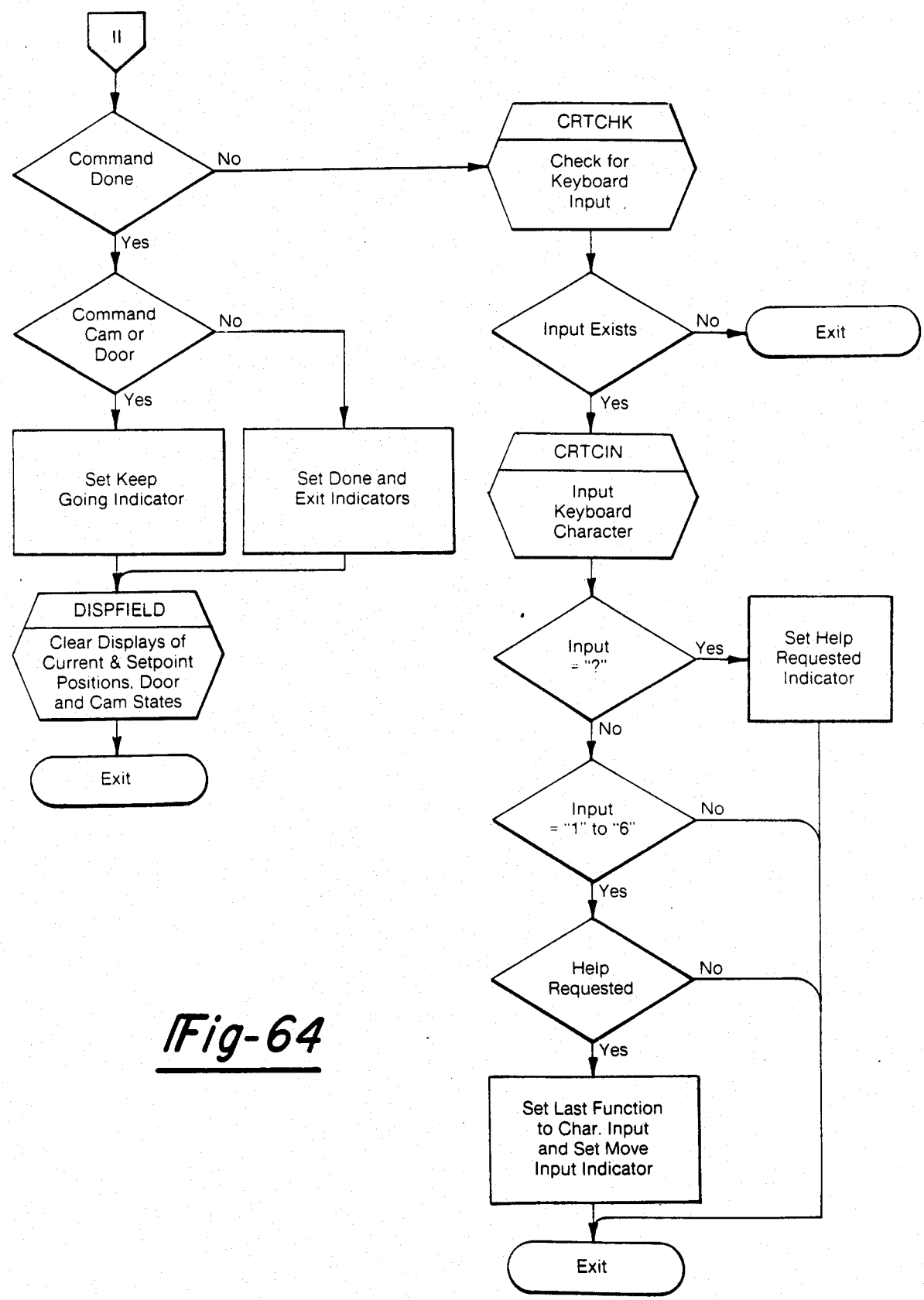

A program for controlling the operation of the tube door is depicted in detail in FIG. 60 and is self explanatory. Other portions of the program which are also shown in detail and are self explanatory are the Display Error Programs shown in FIG. 67 and the Talk-To-User program shown in FIG. 68.

In view of the foregoing description, it is recognized that those skilled in the art may make various modifications or additions to the preferred embodiment choosen to illustrate the invention without departing from the spirit and scope of the present contribution to the art. Accordingly, it is to be understood that the preferred embodiment described herein is merely illustrative, and that the protection sought and to be afforded hereby should be deemed to extend to the subject matter claimed and all equivalents thereof.

Having thus described the invention, what is claimed is:

1. A method of loading and unloading semiconductor wafer boats from a furnace having a processing tube provided with an opening through which the boats are transported, and having a door which is moveable by a control means for sealingly closing the opening when the wafers are being processed, comprising the steps of:
(a) placing at least one of said boats on a support which is moveable by a motor along a path through said opening into and out of said furnace and to any of a plurality of selectable locations along said path;
(b) selecting a first location of said support along said path outside said furnace which is related to a position where said boats are to be placed on and removed from said support respectively before and after the wafers are introduced into said furnace;
(c) moving said support along said path to said first selected location;
(d) generating a first set of data representing said first selected location;
(e) storing said first set of data in a memory;
(f) selecting a location of said support along said path outside said furnace where the support clears the door;
(g) moving said support along said path to said clear-of-door location;
(h) generating a clear-of-door set of data representing the location where the support clears the door;
(i) storing said clear-of-door set of data in a memory;
(j) selecting a second location of said support along said path inside said furnace which is related to a position where said boats are deposited in and picked up from said furnace;
(k) moving said support along said path to said second selected location;
(l) generating a second set of data representing said second selected location;
(m) storing said second set of data in said memory; then, after completing steps (a) through (m)
(n) retrieving said first and second sets of data and said clear-of-door set of data from said memory; and
(o) non-manually controlling said motor and said door to effect movement of said support along said path using the data retrieved in step (n), and in a manner to repeatably position said support at either of said first and second selected locations or at said clear-of-door location.

2. The method of claim 1, wherein step (o) includes the step of preparing a programmed set of instructions for storing and retrieving said first and second sets of data, and for producing control signals for controlling said motor in accordance with said first and second sets of data.

3. The method of claim 1, wherein steps (c) and (k) are performed by manually initiating first and second control signals for controlling said motor in accordance with said first and second sets of data.

4. The method of claim 1 including the step of displaying first and second sets of information to an operator which respectively represent said first and second selected locations.

5. The method of claim 1, wherein steps (d) and (l) each include the step of:

producing an analog electrical signal proportional to the position of said support along said path relative to a reference point, and converting said analog electrical signal to digital information.

6. The method of claim 1, including the step of calibrating the movement of said support along said path with the operation of said motor, said calibration being performed by moving said support past first and second reference locations along said path, sensing the presence of said support at said reference locations and correlating the distance between said reference locations with the operation of said motor required to move said support along said distance.

7. A method of loading and unloading semiconductor wafer boats from a furnace having a processing tube provided with an opening through which the boats are transported, and having a door which is moveable by a control means for sealingly closing the opening when the wafers are being processed, comprising the steps of:

(a) placing at least one of said boats on a support which is moveable by a motor along a path through said opening into and out of said furnace and to any of a plurality of selectable locations along said path including a location outside said furnace where the support clears the door;

(b) moving said support past first and second reference locations along said path, sensing the presence of the support at these locations and then correlating the distance between these locations with the operation of said motor whereby to calibrate the movement of said support;

(c) displaying a list of items respectively describing a plurality of areas along said path;

(d) selecting specific locations along said path which lie with the areas described by at least certain of the items displayed in step (c) including a location outside said furnace where the support clears the door;

(e) moving said support to each of the locations selected in step (d) by manually initiating operation of said motor;

(f) generating sets of digital data respectively identifying the locations selected in step (d) relative to a reference point along said path;

(g) storing in a memory the sets of digital data generated in step (f);

(h) displaying a number corresponding to each set of digital data generated in step (f), each number being associated with one of said items and representing the distance of a selected location relative to said reference point;

(i) retrieving each of said sets of digital data from said memory; and (j) non-manually controlling said motor and said door to effect movement of said support to the selected locations along said path in accordance with the sets of digital data retrieved from said memory in step (i).

8. The method of claim 7, wherein steps (d) through (h) are performed sequentially for each of said certain items displayed in step (c).

* * * * *